United States Patent
Maunder et al.

(10) Patent No.: US 11,146,294 B2
(45) Date of Patent: Oct. 12, 2021

(54) POLAR CODER WITH LOGICAL THREE-DIMENSIONAL MEMORY, COMMUNICATON UNIT, INTEGRATED CIRCUIT AND METHOD THEREFOR

(71) Applicants: Robert Maunder, Southampton (GB);
Matthew Brejza, Southampton (GB);
Shida Zhong, Southampton (GB);
Isaac Andrade, Southampton (GB);
Taihai Chen, Southampton (GB)

(72) Inventors: Robert Maunder, Southampton (GB);
Matthew Brejza, Southampton (GB);
Shida Zhong, Southampton (GB);
Isaac Andrade, Southampton (GB);
Taihai Chen, Southampton (GB)

(73) Assignee: Accelercomm Limited, Southampton (GB)

( * ) Notice: Subject to any disclaimer, the term of this patent is extended or adjusted under 35 U.S.C. 154(b) by 57 days.

(21) Appl. No.: 16/622,903

(22) PCT Filed: Jun. 12, 2018

(86) PCT No.: PCT/EP2018/065545
§ 371 (c)(1),
(2) Date: Dec. 13, 2019

(87) PCT Pub. No.: WO2018/229071
PCT Pub. Date: Dec. 20, 2018

(65) Prior Publication Data
US 2021/0159916 A1  May 27, 2021

(30) Foreign Application Priority Data
Jun. 15, 2017 (GB) .................................. 1709502
Jun. 15, 2017 (GB) .................................. 1709505
(Continued)

(51) Int. Cl.
*H03M 13/00* (2006.01)
*H03M 13/15* (2006.01)
(Continued)

(52) U.S. Cl.
CPC ..... *H03M 13/1575* (2013.01); *G06F 11/1068* (2013.01); *G11C 11/409* (2013.01)

(58) Field of Classification Search
CPC .............. H03M 13/13; G11C 13/0069; G11C 11/1673; G11C 11/1675; G11C 11/2275; G06F 11/1068
See application file for complete search history.

(56) References Cited

U.S. PATENT DOCUMENTS 8,347,186 B1 * 1/2013 Arikan ............... H03M 13/1148
714/774
10,291,264 B2 * 5/2019 Zhang ................... H04L 1/0057
(Continued)

FOREIGN PATENT DOCUMENTS

KR  20120054571 A1  5/2012
WO  2016105858 A1  6/2016

OTHER PUBLICATIONS

Yoo Hoyoung et al: "Partially Parallel Encoder Architecture for Long Polar Codes" IEEE Transactions on Circuits and Systems II: Express Briefs, IEEE US, vol. 62 No. 3, Mar. 2015 (Mar. 2015) pp. 306-310 XP011574098 ISSN: 1549-7747 DOI: 10.1109/TCSII.2014.2369131 [retrieved on Feb. 27, 2015] the whole document.
(Continued)

*Primary Examiner* — Esaw T Abraham
(74) *Attorney, Agent, or Firm* — Optimus Patents US, LLC

(57) ABSTRACT

A polar coder circuit is described. The polar coder circuit comprises one or more datapaths; and at least one logical three-dimensional, 3D, memory block coupled to the one or
(Continued)

more datapaths and comprising a number of one or more random access memories, RAMs, of the logical 3D memory block as a first dimension, wherein the one or more RAMs comprise(s) a width of one or more element(s) as a second dimension and a depth of one or more address(es) as a third dimension and wherein the first dimension or the second dimension has a size $2^{s_d}$, where $s_d$ is a number of stages in a datapath of the one or more datapaths.

20 Claims, 40 Drawing Sheets

(30) Foreign Application Priority Data

Jun. 15, 2017 (GB) ...................................... 1709507
Jan. 25, 2018 (GB) ...................................... 1801218

(51) Int. Cl.
*G06F 11/10* (2006.01)
*G11C 11/409* (2006.01)

(56) References Cited

U.S. PATENT DOCUMENTS

| | | | |
|---|---|---|---|
| 10,313,056 B2* | 6/2019 | Koike-Akino | H03M 13/658 |
| 10,447,435 B2* | 10/2019 | Shi | H04L 1/0045 |
| 10,579,452 B2* | 3/2020 | Shi | H03M 13/6362 |
| 2003/0165076 A1* | 9/2003 | Gorobets | G06F 3/0688 365/200 |
| 2008/0263319 A1* | 10/2008 | Snyder | H03K 19/177 712/29 |
| 2015/0333775 A1 | 11/2015 | Korb et al. | |
| 2017/0149531 A1 | 5/2017 | Raza et al. | |

OTHER PUBLICATIONS

Gabi Sarkis et al: "Flexible and Low-Complexity Encoding and Decoding of Systematic Polar Codes", IEEE Transactions on Communications, Jan. 2016 (Jan. 2016), pp. 2732-2745, XP055336370, New York DOI: 10.1109/TCOMM.2016.2574996 Retrieved from the Internet: URL:https://arxiv.org/pdf/1507.03614v3.pdf Y the whole document.

Shih Xin-Yu et al: "High-speed low-area-cost VLSI design of polar codes encoder architecture using radix-k processing engines", 2016 IEEE 5th Global Conference on Consumer Electronics, IEEE, Oct. 11, 2016 (Oct. 11, 2016), pp. 1-2, XP033032313, DOI: 10.1109/GCCE.2016.7800526 [retrieved on Dec. 27, 2016] the whole document.

Vangala Harish et al: "A new multiple folded successive cancellation decoder for polar codes", 2014 IEEE Information Theory Workshop (ITW 2014), IEEE, Nov. 2, 2014 (Nov. 2, 2014), pp. 381-385, XP032694569, ISSN: 1662-9019, DOI: 10.1109/ITW.2014.6970858 [retrieved on Dec. 1, 2014] section III, sub-section "Folding Operation at the Encoder"; figure 2.

* cited by examiner (a)

| | | | | | | | | |
|---|---|---|---|---|---|---|---|---|
| LLR Memory 1: | Address 0: | 126 | . | . | . | 127 | . | . | . |
| LLR Memory 2: | Address 0: | 120 | 121 | 122 | 123 | 124 | 125 | 126 | 127 |
| LLR Memory 3: | Address 0: | 96 | 100 | 104 | 108 | 112 | 116 | 120 | 124 |
| | Address 1: | 97 | 101 | 105 | 109 | 113 | 117 | 121 | 125 |
| | Address 2: | 98 | 102 | 106 | 110 | 114 | 118 | 122 | 126 |
| | Address 3: | 99 | 103 | 107 | 111 | 115 | 119 | 123 | 127 |
| LLR Memory 4: | Address 0: | 0 | 16 | 32 | 48 | 64 | 80 | 96 | 112 |
| | Address 1: | 1 | 17 | 33 | 49 | 65 | 81 | 97 | 113 |
| | Address 2: | 2 | 18 | 34 | 50 | 66 | 82 | 98 | 114 |
| | Address 3: | 3 | 19 | 35 | 51 | 67 | 83 | 99 | 115 |
| | Address 4: | 4 | 20 | 36 | 52 | 68 | 84 | 100 | 116 |
| | Address 5: | 5 | 21 | 37 | 53 | 69 | 85 | 101 | 117 |
| | Address 6: | 6 | 22 | 38 | 54 | 70 | 86 | 102 | 118 |
| | Address 7: | 7 | 23 | 39 | 55 | 71 | 87 | 103 | 119 |
| | Address 8: | 8 | 24 | 40 | 56 | 72 | 88 | 104 | 120 |
| | Address 9: | 9 | 25 | 41 | 57 | 73 | 89 | 105 | 121 |
| | Address 10: | 10 | 26 | 42 | 58 | 74 | 90 | 106 | 122 |
| | Address 11: | 11 | 27 | 43 | 59 | 75 | 91 | 107 | 123 |
| | Address 12: | 12 | 28 | 44 | 60 | 76 | 92 | 108 | 124 |
| | Address 13: | 13 | 29 | 45 | 61 | 77 | 93 | 109 | 125 |
| | Address 14: | 14 | 30 | 46 | 62 | 78 | 94 | 110 | 126 |
| | Address 15: | 15 | 31 | 47 | 63 | 79 | 95 | 111 | 127 |

2900

| Bit Memory 1: | RAM 0: | Address 0: | 120 | 121 | 122 | 123 | 124 | 125 | 126 | 127 |
|---|---|---|---|---|---|---|---|---|---|---|
| | RAM 1: | Address 0: | . | . | . | . | . | . | . | . |
| | RAM 2: | Address 0: | . | . | . | . | . | . | . | . |
| | RAM 3: | Address 0: | . | . | . | . | . | . | . | . |
| | | | | | | | | | | |
| Bit Memory 2: | RAM 0: | Address 0: | 96 | 100 | 104 | 108 | 112 | 116 | 88 | 92 |
| | RAM 1: | Address 0: | 97 | 101 | 105 | 109 | 113 | 117 | 89 | 93 |
| | RAM 2: | Address 0: | 98 | 102 | 106 | 110 | 114 | 118 | 90 | 94 |
| | RAM 3: | Address 0: | 99 | 103 | 107 | 111 | 115 | 119 | 91 | 95 |
| | | | | | | | | | | |
| Bit Memory 3: | RAM 0: | Address 0: | 0 | 16 | 32 | 48 | 64 | 80 | . | . |
| | | Address 1: | 1 | 17 | 33 | 49 | 65 | 81 | . | . |
| | | Address 2: | 2 | 18 | 34 | 50 | 66 | 82 | . | . |
| | | Address 3: | 3 | 19 | 35 | 51 | 67 | 83 | . | . |
| | RAM 1: | Address 0: | 4 | 20 | 36 | 52 | 68 | 84 | . | . |
| | | Address 1: | 5 | 21 | 37 | 53 | 69 | 85 | . | . |
| | | Address 2: | 6 | 22 | 38 | 54 | 70 | 86 | . | . |
| | | Address 3: | 7 | 23 | 39 | 55 | 71 | 87 | . | . |
| | RAM 2: | Address 0: | 8 | 24 | 40 | 56 | 72 | 88 | . | . |
| | | Address 1: | 9 | 25 | 41 | 57 | 73 | 89 | . | . |
| | | Address 2: | 10 | 26 | 42 | 58 | 74 | 90 | . | . |
| | | Address 3: | 11 | 27 | 43 | 59 | 75 | 91 | . | . |
| | RAM 3: | Address 0: | 12 | 28 | 44 | 60 | 76 | 92 | . | . |
| | | Address 1: | 13 | 29 | 45 | 61 | 77 | 93 | . | . |
| | | Address 2: | 14 | 30 | 46 | 62 | 78 | 94 | . | . |
| | | Address 3: | 15 | 31 | 47 | 63 | 79 | 95 | . | . |

2900

| | | | | | | | | | |
|---|---|---|---|---|---|---|---|---|---|
| LLR Memory 1: | Address 0: | 62 | . | . | . | 63 | . | . | . |
| | | | | | | | | | |
| LLR Memory 2: | Address 0: | 56 | 57 | 58 | 59 | 60 | 61 | 62 | 63 |
| | | | | | | | | | |
| LLR Memory 3: | Address 0: | 32 | 36 | 40 | 44 | 48 | 52 | 56 | 60 |
| | Address 1: | 33 | 37 | 41 | 45 | 49 | 53 | 57 | 61 |
| | Address 2: | 34 | 38 | 42 | 46 | 50 | 54 | 58 | 62 |
| | Address 3: | 35 | 39 | 43 | 47 | 51 | 55 | 59 | 63 |
| | | | | | | | | | |
| LLR Memory 4: | Address 0: | 0 | 8 | 16 | 24 | 32 | 40 | 48 | 56 |
| | Address 1: | 1 | 9 | 17 | 25 | 33 | 41 | 49 | 57 |
| | Address 2: | 2 | 10 | 18 | 26 | 34 | 42 | 50 | 58 |
| | Address 3: | 3 | 11 | 19 | 27 | 35 | 43 | 51 | 59 |
| | Address 4: | 4 | 12 | 20 | 28 | 36 | 44 | 52 | 60 |
| | Address 5: | 5 | 13 | 21 | 29 | 37 | 45 | 53 | 61 |
| | Address 6: | 6 | 14 | 22 | 30 | 38 | 46 | 54 | 62 |
| | Address 7: | 7 | 15 | 23 | 31 | 39 | 47 | 55 | 63 |
| | Address 8: | . | . | . | . | . | . | . | . |
| | Address 9: | . | . | . | . | . | . | . | . |
| | Address 10: | . | . | . | . | . | . | . | . |
| | Address 11: | . | . | . | . | . | . | . | . |
| | Address 12: | . | . | . | . | . | . | . | . |
| | Address 13: | . | . | . | . | . | . | . | . |
| | Address 14: | . | . | . | . | . | . | . | . |
| | Address 15: | . | . | . | . | . | . | . | . |

3000

| | | | | | | | | | | |
|---|---|---|---|---|---|---|---|---|---|---|
| Bit Memory 1: | RAM 0: | Address 0: | 56 | 57 | 58 | 59 | 60 | 61 | 62 | 63 |
| | RAM 1: | Address 0: | . | . | . | . | . | . | . | . |
| | RAM 2: | Address 0: | . | . | . | . | . | . | . | . |
| | RAM 3: | Address 0: | . | . | . | . | . | . | . | . |
| | | | | | | | | | | |
| Bit Memory 2: | RAM 0: | Address 0: | 32 | 36 | 40 | 44 | 48 | 52 | 24 | 28 |
| | RAM 1: | Address 0: | 33 | 37 | 41 | 45 | 49 | 53 | 25 | 29 |
| | RAM 2: | Address 0: | 34 | 38 | 42 | 46 | 50 | 54 | 26 | 30 |
| | RAM 3: | Address 0: | 35 | 39 | 43 | 47 | 51 | 55 | 27 | 31 |
| | | | | | | | | | | |
| Bit Memory 3: | RAM 0: | Address 0: | 0 | . | 16 | . | . | . | . | . |
| | | Address 1: | 1 | . | 17 | . | . | . | . | . |
| | | Address 2: | 2 | . | 18 | . | . | . | . | . |
| | | Address 3: | 3 | . | 19 | . | . | . | . | . |
| | RAM 1: | Address 0: | 4 | . | 20 | . | . | . | . | . |
| | | Address 1: | 5 | . | 21 | . | . | . | . | . |
| | | Address 2: | 6 | . | 22 | . | . | . | . | . |
| | | Address 3: | 7 | . | 23 | . | . | . | . | . |
| | RAM 2: | Address 0: | . | 8 | . | 24 | . | . | . | . |
| | | Address 1: | . | 9 | . | 25 | . | . | . | . |
| | | Address 2: | . | 10 | . | 26 | . | . | . | . |
| | | Address 3: | . | 11 | . | 27 | . | . | . | . |
| | RAM 3: | Address 0: | . | 12 | . | 28 | . | . | . | . |
| | | Address 1: | . | 13 | . | 29 | . | . | . | . |
| | | Address 2: | . | 14 | . | 30 | . | . | . | . |
| | | Address 3: | . | 15 | . | 31 | . | . | . | . |

3000

| | | | | | | | | | |
|---|---|---|---|---|---|---|---|---|---|
| LLR Memory 1: | Address 0: | 30 | . | . | . | 31 | . | . | . |
| LLR Memory 2: | Address 0: | 24 | 25 | 26 | 27 | 28 | 29 | 30 | 31 |
| LLR Memory 3: | Address 0: | . | . | . | . | . | . | . | . |
| | Address 1: | . | . | . | . | . | . | . | . |
| | Address 2: | . | . | . | . | . | . | . | . |
| | Address 3: | . | . | . | . | . | . | . | . |
| LLR Memory 4: | Address 0: | 0 | 4 | 8 | 12 | 16 | 20 | 24 | 28 |
| | Address 1: | 1 | 5 | 9 | 13 | 17 | 21 | 25 | 29 |
| | Address 2: | 2 | 6 | 10 | 14 | 18 | 22 | 26 | 30 |
| | Address 3: | 3 | 7 | 11 | 15 | 19 | 23 | 27 | 31 |
| | Address 4: | . | . | . | . | . | . | . | . |
| | Address 5: | . | . | . | . | . | . | . | . |
| | Address 6: | . | . | . | . | . | . | . | . |
| | Address 7: | . | . | . | . | . | . | . | . |
| | Address 8: | . | . | . | . | . | . | . | . |
| | Address 9: | . | . | . | . | . | . | . | . |
| | Address 10: | . | . | . | . | . | . | . | . |
| | Address 11: | . | . | . | . | . | . | . | . |
| | Address 12: | . | . | . | . | . | . | . | . |
| | Address 13: | . | . | . | . | . | . | . | . |
| | Address 14: | . | . | . | . | . | . | . | . |
| | Address 15: | . | . | . | . | . | . | . | . |

3100

| | | | | | | | | | | |
|---|---|---|---|---|---|---|---|---|---|---|
| Bit Memory 1: | RAM 0: | Address 0: | 24 | 25 | 26 | 27 | 28 | 29 | 30 | 31 |
| | RAM 1: | Address 0: | . | . | . | . | . | . | . | . |
| | RAM 2: | Address 0: | . | . | . | . | . | . | . | . |
| | RAM 3: | Address 0: | . | . | . | . | . | . | . | . |
| | | | | | | | | | | |
| Bit Memory 2: | RAM 0: | Address 0: | 0 | 4 | 8 | 12 | 16 | 20 | . | . |
| | RAM 1: | Address 0: | 1 | 5 | 9 | 13 | 17 | 21 | . | . |
| | RAM 2: | Address 0: | 2 | 6 | 10 | 14 | 18 | 22 | . | . |
| | RAM 3: | Address 0: | 3 | 7 | 11 | 15 | 19 | 23 | . | . |
| | | | | | | | | | | |
| Bit Memory 3: | RAM 0: | Address 0: | . | . | . | . | . | . | . | . |
| | | Address 1: | . | . | . | . | . | . | . | . |
| | | Address 2: | . | . | . | . | . | . | . | . |
| | | Address 3: | . | . | . | . | . | . | . | . |
| | RAM 1: | Address 0: | . | . | . | . | . | . | . | . |
| | | Address 1: | . | . | . | . | . | . | . | . |
| | | Address 2: | . | . | . | . | . | . | . | . |
| | | Address 3: | . | . | . | . | . | . | . | . |
| | RAM 2: | Address 0: | . | . | . | . | . | . | . | . |
| | | Address 1: | . | . | . | . | . | . | . | . |
| | | Address 2: | . | . | . | . | . | . | . | . |
| | | Address 3: | . | . | . | . | . | . | . | . |
| | RAM 3: | Address 0: | . | . | . | . | . | . | . | . |
| | | Address 1: | . | . | . | . | . | . | . | . |
| | | Address 2: | . | . | . | . | . | . | . | . |
| | | Address 3: | . | . | . | . | . | . | . | . |

3100

| | | | | | | | | | |
|---|---|---|---|---|---|---|---|---|---|
| LLR Memory 1: | Address 0: | 14 | . | . | . | 15 | . | . | . |
| | | | | | | | | | |
| LLR Memory 2: | Address 0: | 8 | 9 | 10 | 11 | 12 | 13 | 14 | 15 |
| | | | | | | | | | |
| LLR Memory 3: | Address 0: | . | . | . | . | . | . | . | . |
| | Address 1: | . | . | . | . | . | . | . | . |
| | Address 2: | . | . | . | . | . | . | . | . |
| | Address 3: | . | . | . | . | . | . | . | . |
| | | | | | | | | | |
| LLR Memory 4: | Address 0: | 0 | 2 | 4 | 6 | 8 | 10 | 12 | 14 |
| | Address 1: | 1 | 3 | 5 | 7 | 9 | 11 | 13 | 15 |
| | Address 2: | . | . | . | . | . | . | . | . |
| | Address 3: | . | . | . | . | . | . | . | . |
| | Address 4: | . | . | . | . | . | . | . | . |
| | Address 5: | . | . | . | . | . | . | . | . |
| | Address 6: | . | . | . | . | . | . | . | . |
| | Address 7: | . | . | . | . | . | . | . | . |
| | Address 8: | . | . | . | . | . | . | . | . |
| | Address 9: | . | . | . | . | . | . | . | . |
| | Address 10: | . | . | . | . | . | . | . | . |
| | Address 11: | . | . | . | . | . | . | . | . |
| | Address 12: | . | . | . | . | . | . | . | . |
| | Address 13: | . | . | . | . | . | . | . | . |
| | Address 14: | . | . | . | . | . | . | . | . |
| | Address 15: | . | . | . | . | . | . | . | . |

3200

| | | | | | | | | | | | |
|---|---|---|---|---|---|---|---|---|---|---|---|
| Bit Memory 1: | RAM 0: | Address 0: | 8 | 9 | 10 | 11 | 12 | 13 | 14 | 15 |
| | RAM 1: | Address 0: | . | . | . | . | . | . | . | . |
| | RAM 2: | Address 0: | . | . | . | . | . | . | . | . |
| | RAM 3: | Address 0: | . | . | . | . | . | . | . | . |
| | | | | | | | | | | |
| Bit Memory 2: | RAM 0: | Address 0: | 0 | . | 4 | . | . | . | . | . |
| | RAM 1: | Address 0: | 1 | . | 5 | . | . | . | . | . |
| | RAM 2: | Address 0: | . | 2 | . | 6 | . | . | . | . |
| | RAM 3: | Address 0: | . | 3 | . | 7 | . | . | . | . |
| | | | | | | | | | | |
| Bit Memory 3: | RAM 0: | Address 0: | . | . | . | . | . | . | . | . |
| | | Address 1: | . | . | . | . | . | . | . | . |
| | | Address 2: | . | . | . | . | . | . | . | . |
| | | Address 3: | . | . | . | . | . | . | . | . |
| | RAM 1: | Address 0: | . | . | . | . | . | . | . | . |
| | | Address 1: | . | . | . | . | . | . | . | . |
| | | Address 2: | . | . | . | . | . | . | . | . |
| | | Address 3: | . | . | . | . | . | . | . | . |
| | RAM 2: | Address 0: | . | . | . | . | . | . | . | . |
| | | Address 1: | . | . | . | . | . | . | . | . |
| | | Address 2: | . | . | . | . | . | . | . | . |
| | | Address 3: | . | . | . | . | . | . | . | . |
| | RAM 3: | Address 0: | . | . | . | . | . | . | . | . |
| | | Address 1: | . | . | . | . | . | . | . | . |
| | | Address 2: | . | . | . | . | . | . | . | . |
| | | Address 3: | . | . | . | . | . | . | . | . |

3200

| | | | | | | | | | | |
|---|---|---|---|---|---|---|---|---|---|---|
| LLR Memory 1: | Address 0: | 6 | . | . | . | 7 | . | . | . |
| | | | | | | | | | |
| LLR Memory 2: | Address 0: | . | . | . | . | . | . | . | . |
| | | | | | | | | | |
| LLR Memory 3: | Address 0: | . | . | . | . | . | . | . | . |
| | Address 1: | . | . | . | . | . | . | . | . |
| | Address 2: | . | . | . | . | . | . | . | . |
| | Address 3: | . | . | . | . | . | . | . | . |
| | | | | | | | | | |
| LLR Memory 4: | Address 0: | 0 | 1 | 2 | 3 | 4 | 5 | 6 | 7 |
| | Address 1: | . | . | . | . | . | . | . | . |
| | Address 2: | . | . | . | . | . | . | . | . |
| | Address 3: | . | . | . | . | . | . | . | . |
| | Address 4: | . | . | . | . | . | . | . | . |
| | Address 5: | . | . | . | . | . | . | . | . |
| | Address 6: | . | . | . | . | . | . | . | . |
| | Address 7: | . | . | . | . | . | . | . | . |
| | Address 8: | . | . | . | . | . | . | . | . |
| | Address 9: | . | . | . | . | . | . | . | . |
| | Address 10: | . | . | . | . | . | . | . | . |
| | Address 11: | . | . | . | . | . | . | . | . |
| | Address 12: | . | . | . | . | . | . | . | . |
| | Address 13: | . | . | . | . | . | . | . | . |
| | Address 14: | . | . | . | . | . | . | . | . |
| | Address 15: | . | . | . | . | . | . | . | . |

| | | | 0 | 1 | 2 | 3 | 4 | 5 | 6 | 7 |
|---|---|---|---|---|---|---|---|---|---|---|
| Bit Memory 1: | RAM 0: | Address 0: | . | . | . | . | . | . | . | . |
| | RAM 1: | Address 0: | . | . | . | . | . | . | . | . |
| | RAM 2: | Address 0: | . | . | . | . | . | . | . | . |
| | RAM 3: | Address 0: | . | . | . | . | . | . | . | . |
| Bit Memory 2: | RAM 0: | Address 0: | . | . | . | . | . | . | . | . |
| | RAM 1: | Address 0: | . | . | . | . | . | . | . | . |
| | RAM 2: | Address 0: | . | . | . | . | . | . | . | . |
| | RAM 3: | Address 0: | . | . | . | . | . | . | . | . |
| Bit Memory 3: | RAM 0: | Address 0: | . | . | . | . | . | . | . | . |
| | | Address 1: | . | . | . | . | . | . | . | . |
| | | Address 2: | . | . | . | . | . | . | . | . |
| | | Address 3: | . | . | . | . | . | . | . | . |
| | RAM 1: | Address 0: | . | . | . | . | . | . | . | . |
| | | Address 1: | . | . | . | . | . | . | . | . |
| | | Address 2: | . | . | . | . | . | . | . | . |
| | | Address 3: | . | . | . | . | . | . | . | . |
| | RAM 2: | Address 0: | . | . | . | . | . | . | . | . |
| | | Address 1: | . | . | . | . | . | . | . | . |
| | | Address 2: | . | . | . | . | . | . | . | . |
| | | Address 3: | . | . | . | . | . | . | . | . |
| | RAM 3: | Address 0: | . | . | . | . | . | . | . | . |
| | | Address 1: | . | . | . | . | . | . | . | . |
| | | Address 2: | . | . | . | . | . | . | . | . |
| | | Address 3: | . | . | . | . | . | . | . | . |

3300

US 11,146,294 B2

POLAR CODER WITH LOGICAL THREE-DIMENSIONAL MEMORY, COMMUNICATON UNIT, INTEGRATED CIRCUIT AND METHOD THEREFOR

FIELD OF THE INVENTION

The field of the invention relates to a polar coder with a logical three-dimensional memory, a communication unit, an integrated circuit and a method for polar coding. The invention is applicable to, but not limited to, polar coding for current and future generations of communication standards.

BACKGROUND OF THE INVENTION

In accordance with the principles of Forward Error Correction (FEC) and channel coding, polar coding [1] may be used to protect information against the effects of transmission errors within an imperfect communication channel, which may suffer from noise and other detrimental effects. More specifically, a polar encoder is used in the transmitter to encode the information and a corresponding polar decoder is used in the receiver to mitigate transmission errors and recover the transmitted information. The polar encoder converts an information block comprising K bits into an encoded block comprising a greater number of bits M>K, according to a prescribed encoding process. In this way, the encoded block conveys the K bits of information from the information block, together with M-K bits of redundancy. This redundancy may be exploited in the polar decoder according to a prescribed decoding process, in order to estimate the values of the original K bits from the information block. Provided that the condition of the communication channel is not too severe, the polar decoder can correctly estimate the values of the K bits from the information block with a high probability.

The polar encoding process comprises three steps. In a first information block conditioning step, redundant bits are inserted into the information block in prescribed positions, in order to increase its size from K bits to N bits, where N is a power of two. In a second polar encoding kernal step, the N bits of the resultant kernal information block are combined in different combinations using successive eXclusive OR (XOR) operations, according to a prescribed graph structure. This graph structure comprises $n=\log_2(N)$ successive stages, each comprising N/2 XOR operations, which combine particular pairs of bits. In a third step, encoded block conditioning is applied to the resultant kernal encoded block, in order to adjust its size from N bits to M bits. This may be achieved by repeating or removing particular bits in the kernal encoded block according to a prescribed method, in order to produce the encoded block, which is transmitted over a channel or stored in a storage media.

A flexible polar encoder kernal is required to support various kernal block sizes N, each having a value that is a power of two, up to and including a maximum supported kernal block size $N_{max}$. The prior art flexible polar encoder kernals of [37], [24] decompose the polar code graph into several rows, which span the width of the graph. The polar encoder kernal operation comprises several steps, during which each successive column is processed one after another, in order from top to bottom. However, the amount of hardware required, and the critical path length through that hardware, depends on the maximum number of stages $n_{max}=\log_2(N_{max})$ that must be spanned by each row. When encoding short blocks, much of the hardware will be unused, resulting in poor hardware efficiency.

A soft encoded block is received from the channel or retrieved from the storage media. The polar decoding process comprises three steps, which correspond to the three steps in the polar encoding process, but in a reverse order. In a first encoded block conditioning step, redundant soft bits are inserted or combined into the soft encoded block in prescribed positions, in order to adjust its size from M soft bits to N soft bits, where N is a power of two. In a second polar decoding kernal step, the N soft bits of the resultant kernal encoded block are combined in different combinations using a Successive Cancellation (SC) [1] or Successive Cancellation List (SCL) [7] process, which operates on the basis of the prescribed graph structure. In a third step, information block conditioning is applied to the resultant recovered kernal information block, in order to reduce its size from N bits to K bits. This may be achieved by removing particular bits in the recovered kernal information block according to a prescribed method, in order to produce the recovered information block.

Several hardware implementations of SC [1] and SCL [7] polar decoders have been previously proposed [8], [14]-[24], which are capable of flexibly supporting different kernal block sizes $N \in \{2, 4, 8, \ldots, N_{max}\}$ at run-time. These decoders conceptually represent the polar code using a graph [15] (or equivalently a tree [18]), which has dimensions that vary depending on the kernal block size N. As exemplified in FIG. 17, the graph 1700 comprises N inputs on its right-hand edge which accept soft bits (often in the form of Log-Likelihood Ratios (LLRs) [8]) from the demodulator, as well as N outputs on its left-hand edge which supply hard bit decisions for the information and frozen bits. Between these two edges, the graph comprises log 2(N) horizontally-concatenated stages, each of which comprises N/2 vertically-aligned XOR operations.

The hardware implementations of [8], [14]-[24] employ dedicated hardware to combine soft bits at the location of each XOR in the graph using f and g functions [8], as well as to conceptually propagate them from right to left in the graph. Likewise, dedicated hardware is conceptually employed at the left-hand edge of the graph, to convert the soft bits into hard bit decisions, as well as to compute and sort SCL path metrics [8]. Finally, dedicated hardware is used to combine hard bit decisions according to the XORs in the graph and to conceptually propagate the resultant partial sum bits from left to right in the graph, so that they can be used by the g function. Note that the reliance of the g function upon the partial sum bits imposes a set of data dependencies, which require all of the above-mentioned operations to be performed according to a particular schedule. This leaves only a limited degree of freedom to perform operations in parallel, which varies as the decoding process progresses. The line decoder of [14] achieves a high degree of parallel processing during soft bit propagation, which allows all f and g functions to be computed within a latency of 2N-2 clock cycles. This is achieved using L lines of $N_{max}/2$ processing units, where L=1 for SC decoding and L>1 is the list size for SCL decoding. Each processing unit is capable of computing one f function or one g function in each clock cycle. This degree of parallelism is sufficient to simultaneously perform the maximum number of computations within any single stage of the graph that are not prevented by data dependencies. This peak opportunity for parallel processing is encountered when $N=N_{max}$ and when computing g functions for the right-most stage in the graph. However, the above-mentioned data dependencies prevent the parallelism from being fully exploited when $N<N_{max}$ or when computing f or g functions at other times during the decoding process. Owing to this, the line decoder of [14] suffers from a poor hardware efficiency and also a requirement for an excessively high memory bandwidth, which can grant simultaneous access to up to $N_{max}$ soft bits. Motivated by this, the semi-parallel decoders of [8], [15]-[24] improve the hardware efficiency and memory bandwidth requirement by reducing the degree of parallel processing from $LN_{max}/2$ to LP, where $P \in \{1, 2, 4, 8, \ldots\}$. However, this approach still suffers from being unable to exploit all parallelism for the left-most stages and requires several clock cycles to perform the f and g for the right-most stages, increasing the total latency associated with f and g computation to $\Sigma_{i=1}^{log_2(N)} 2^i \max(N/(2^i P), 1)$ clock cycles. Besides the above-mentioned clock cycles required for f and g computations, SCL decoders typically require at least one additional clock cycle to compute and sort the path metrics associated with each of the N hard bit decisions made on the left-hand edge of the graph. In the case of line decoding, a latency of $3N-2$ clock cycles is required to perform f, g and path metric computations, as well as to sort the latter. However, in [32], [33], the path metrics are computed and sorted for several bits at a time, together with the corresponding f and g functions in the left-most stages of the graph. When $2^k$ hard bit decisions are made at a time, this approach reduces the total number of clock cycles required for line decoding to $N/2^{k-2}-2$ [33], where $k \in \{1, 2, 3, \ldots\}$. Note that the latency of SCL decoding can be further reduced when the polar code adopts a low coding rate. In this case, any computations relating to frozen bits at the start of the block can be skipped, although this technique does not improve the worst-case latency, which is encountered for high coding rates.

Note that the propagation of partial sum bits is typically performed concurrently with the computations described above, within the same clock cycles. In [8], [15], [30], partial-sum update logic is used to accumulate different combinations of the decoded bits and an interconnection network is used to deliver them to the processing of the corresponding g functions. This results in a large hardware overhead and a long critical path, which limits the achievable hardware efficiency, throughput and latency. By contrast, the feed-forward architecture of [19], [21], [28], [32], [34] uses dedicated hardware to propagate partial sum bits to each successive stage of the graph. However, the complexity of the feed-forward architecture grows rapidly for each successive stage, limiting the maximum kernal block length $N_{max}$ that can be supported and limiting the hardware efficiency. By contrast, the approach of [17], [22], [27], [35] uses a simplified polar encoder kernal to calculate the partial sum bits, although this does not benefit from reusing calculations that are performed as a natural part of the decoding process. In the above-described previous polar decoder hardware implementations, the hardware resource usage is typically dominated by memory. For example, 90% of the hardware is occupied by memory in the L=8 SCL decoder of [8], owing to the requirement to store LLRs at the interface between each pair of consecutive stages in the graph. The next biggest contributor to hardware resource is used to process and propagate the LLRs and partial sum bits, occupying around 5% of the hardware in the L=8 SCL decoder of [8]. Of this processing and propagation hardware, around 80% is dedicated to the interconnection network associated with the partial sum bits [15]. Finally, around 1% of the hardware is dedicated to path metric computation and sorting in the L=8 SCL decoder of [8], as well as in the L=4 SCL decoders of [18], [19]. However, these operations can be expected to occupy significantly more hardware in the multi-bit approaches of [32], [33].

SUMMARY OF THE INVENTION

The present invention provides a polar coder with a three-dimensional memory, a communication unit, an integrated circuit and a method for polar coding, as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the FIG's are illustrated for simplicity and clarity and have not necessarily been drawn to scale.

DETAILED DESCRIPTION

Figure 1:
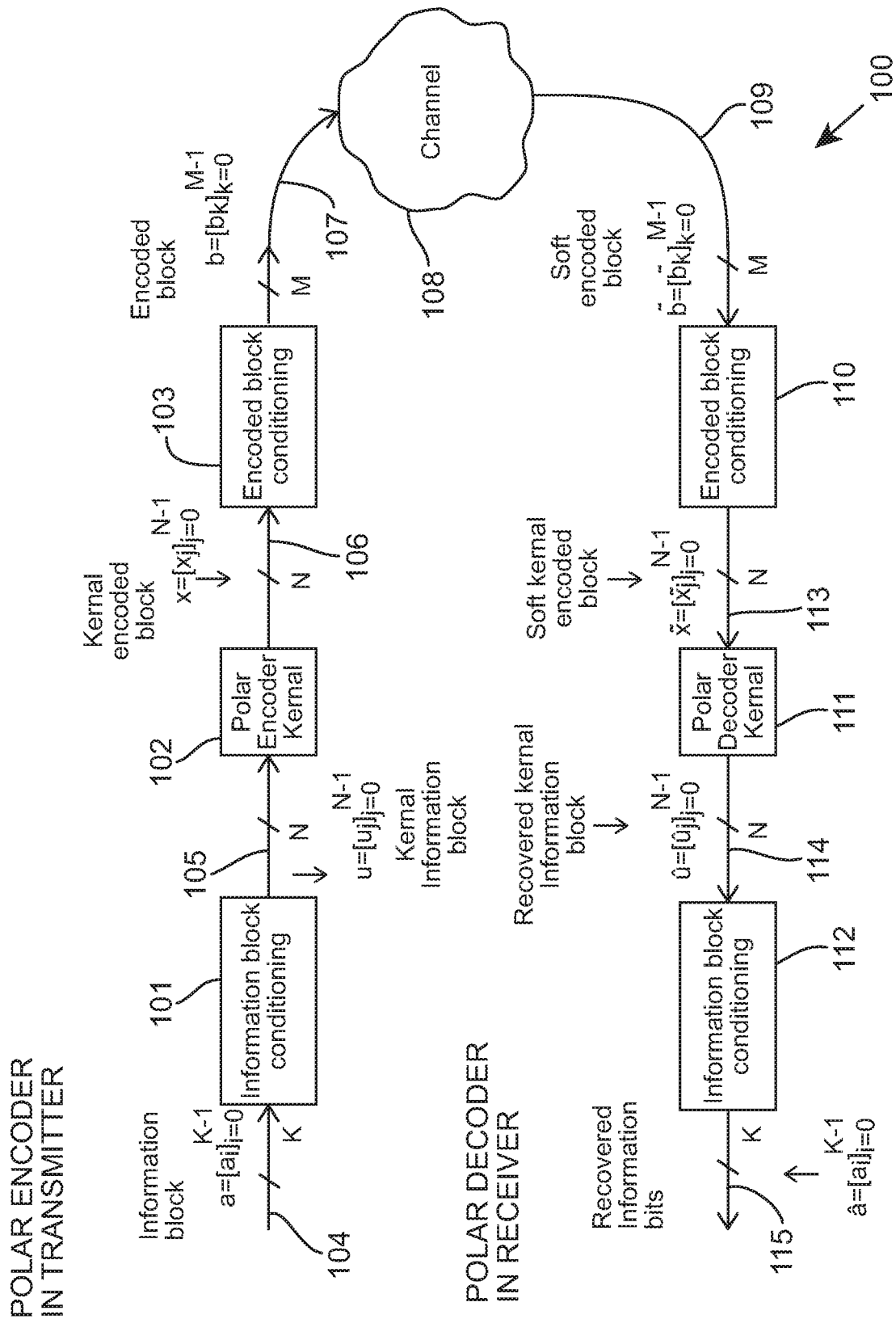
FIG. 1 illustrates an example top-level schematic of a communication unit having a polar encoder and polar decoder, adapted according to example embodiments of the invention.

Motivated by the discussions above, the present invention describes a novel polar coder architecture, which employs a logical three-dimensional memory to enable flexible, low latency, hardware-efficient polar encoding and polar decoding. Rather than processing one stage of the polar code graph at a time, the proposed architecture achieves a higher degree of parallelism by processing several consecutive stages at once. Furthermore, since several consecutive stages are processed at once, memory is only required at the interfaces between each pair of consecutive groupings of stages, rather than at the interfaces between each pair of consecutive individual stages. This significantly reduces the overall memory requirement of the proposed architecture relative to previous implementations, which is particularly impactful during polar decoding, where memory is the biggest contributor to hardware resource usage. During polar decoding, the logical three-dimensional memory architecture enables a simple mechanism for propagating partial sum bits, which is also impactful since partial sum propagation is the second biggest contributor to hardware resource usage in previous implementations.

In a first aspect, examples of the present invention describe a polar coder circuit comprising one or more datapaths; at least one logical three-dimensional, 3D, memory block coupled to the one or more datapaths and comprising a number of one or more random access memories, RAMs, of the logical 3D memory block as a first dimension, wherein the one or more RAMs (1107, 2807) comprise(s) a width of one or more element(s) as a second dimension and a depth of one or more address(es) as a third dimension and wherein the first dimension or the second dimension has a size $2^{s_d}$, where $s_d$ is a number of stages in a datapath of the one or more datapaths (601, 1601, 1602, 1603); and a controller (604, 1606) coupled to the at least one logical 3D memory block (602, 603, 1605) and configured to direct the one or more datapaths (601, 1601, 1602, 1603) to process bits that are read from the at least one logical 3D memory block (602, 603, 1605) across at least one of the first dimension and the second dimension, and configured to direct the one or more datapaths (601, 1601, 1602, 1603) to write processed bits to the at least one logical 3D memory block (602, 603, 1605) across at least one of the first dimension and the second dimension.

In this manner, sets of elements generated by datapaths can be seamlessly written to the logical 3D memory blocks and the sets of elements required by datapaths can be seamlessly read from the logical 3D memory blocks, avoiding the requirement for complex circuitry to rearrange elements when they are written or read from memory.

In some examples, the other of the first dimension and second dimension has a size $n_d$, where $n_d$ is a number of elements in an input or an output of the one or more datapaths (601, 1601, 1602, 1603). In this manner, the number of elements input or output by the datapaths is equal to the number of elements input or output by the logical 3D memory blocks, further enhancing the seamless nature of the read and write operations.

In some examples, $s_d$ is the number of stages in the one or more datapaths (601, 1601, 1602, 1603) configured to compute XOR operations of a polar code sub-graph. In this manner, the XOR operations can be completed on bits that have been seamlessly read from a logical 3D memory block and then seamlessly written to a logical 3D memory blocks.

In some examples, the at least one logical 3D memory block (602, 603, 1605) stores the elements in a plurality of coordinates according to the first dimension, second dimension and third dimension and the controller (604, 1606) is configured to: direct a first datapath to read $n_d$ datapath input elements from $n_d$ different coordinates in a first logical 3D memory block (602, 603, 1605); and direct a second datapath to write $n_d$ datapath output elements to $n_d$ different coordinates in a second logical 3D memory block (602, 603, 1605). In this manner, the controller can control the read and write operations by generating co-ordinates, which support the seamless interaction between the logical 3D memory blocks and the datapaths.

In some examples, the operations of reading $n_d$ datapath input elements and writing $n_d$ datapath output elements occur at different time instances. In some examples, the same datapath performs the reading and writing operations. In some examples, elements are read and written to the same logical 3D memory block. In this manner, the controller can flexibly and seamlessly control the interactions between different datapaths and different logical 3D memory blocks at different times.

In some examples, all $n_d$ datapath input elements are read from element positions having a same co-ordinate value along the third dimension of the first logical 3D memory block (602, 603, 1605). In some examples, all $n_d$ datapath output elements are written to element positions having a same co-ordinate value along the third dimension of the second logical 3D memory block (602, 603, 1605). In this manner, the controller only needs to generate a single read address and a single write address, which are shared among all elements, simplifying its operation.

In some examples, the polar coder circuit (600, 1600) further comprises at least one multiplexer (1104, 2805) coupled to the controller (604, 1606), wherein the controller (604, 1606) is configured to direct the at least one multiplexer (1104, 2805) to read a datapath input element having an index $l \in [0, n_d-1]$ from one element position in a first logical 3D memory block (602, 603, 1605) that has a co-ordinate that is a function of the index l along a first one of the first dimension or second dimension. In this manner, the controller can generate the co-ordinates as a simple function of the index l, simplifying its operation.

In some examples, the polar coder circuit (600, 1600) further comprises at least one multiplexer (1105, 2806) coupled to the controller (604, 1606), wherein the controller (604, 1606) is configured to direct the at least one multiplexer (1105, 2806) to write a datapath output element having an index $l \in [0, n_d-1]$ to one element position in a second logical 3D memory block (602, 603, 1605) that has a co-ordinate mod(l, $d_2$) along a second one of the first dimension or second dimension, where $d_2$ is the size of the dimension of the second logical 3D memory block (602, 603, 1605). In this manner, the controller can generate the co-ordinates as a simple function of the index l, simplifying its operation.

In some examples, the polar coder circuit (600) is configured to perform a polar encoding operation using one datapath of the one or more datapaths and a first logical 3D memory block (602, 603) and a second logical 3D memory block (602, 603) and wherein the polar encoding operation comprises a decomposition of a polar code graph into multiple columns (702) and where each column is further decomposed into one or more polar code sub-graphs (701), where datapath input elements are read from the first logical 3D memory block (602, 603) and datapath output elements are written to the second logical 3D memory block (602, 603) during the processing of polar code sub-graphs from any columns having even indices ($c \in \{0, 2, 4, \ldots\}$), and datapath input elements are read from the second logical 3D memory block and datapath output elements are written to the first logical 3D memory block during the processing of polar code sub-graphs from columns having odd indices ($c \in \{1, 3, 5, \ldots\}$). In this manner, polar encoding can benefit from the simplified controller and seamless reading and writing of elements into the logical 3D memory blocks.

In some examples, the third dimension of each logical 3D memory block has a size of $\max(1, N_{max}/(n_c \cdot 2^{s_e}))$, where $N_{max}$ is a longest supported kernal block size of the polar coder circuit (600), $s_e = s_d$ is a number of stages in an encoder datapath of the one or more datapaths and where $n_e = n_d$ is a number of elements in an input or an output of the encoder datapath. In this manner, the polar encoding operation can be completed using a limited amount of memory.

In some examples, the polar coder circuit (1600) is configured to perform a polar decoding operation using a $C_{max}-1$ number of datapaths of the one or more datapaths and $C_{max}-1$ number of logical 3D memory blocks, and wherein the polar decoding operation comprises a decomposition of a polar code graph (201, 202, 203) into $C \in [1, C_{max}]$ number of columns (1701, 1702), wherein C varies from block to block and $C_{max}$ is a maximum number of supported columns and into $C \in [1, C_{max}]$ number of columns (1701, 1702) wherein C can vary from block to block and $C_{max}$ is a maximum number of supported columns, and wherein each column (1701, 1702) comprises a number of rows (1703) and each row comprises a number of sub-rows (1704), wherein the datapath having an index c that reads datapath input elements from a logical 3D memory block (602, 603) having the index c and writes datapath output elements to the logical 3D memory block (602, 603) having the index c+1 during the processing of a sub-row (1704)

from the column (1701, 1702) having the index $c \in [0, C-1]$. In this manner, polar decoding can benefit from the simplified controller and seamless reading and writing of elements into the logical 3D memory blocks.

In some examples, the third dimension of the logical 3D memory block (602, 603) having the index c has a size of $\max(1, 2^{s_o+(c-1)s_i}/n_i)$, where $s_o$ is a number of stages in an outer datapath of the one or more datapaths, $s_i=s_d$ is a number of stages in an inner datapath of the one or more datapaths and where $n_i=n_d$ is a number of elements in an input or an output of the inner datapath. In this manner, the polar decoding operation can be completed using a limited amount of memory.

In some examples, a subset of the $C_{max}$-1 datapaths of the one or more datapaths is operated concurrently and a subset of the $C_{max}$-1 logical 3D memory block (602, 603) are operated transparently in order to propagate elements through successive columns. In this manner, additional processing steps are not required to propagate partial sum bits through the polar code graph, when performing polar decoding.

In some examples, each group of n bits provided at an output of the datapath of the one or more datapaths is written in a single write operation to the at least one logical 3D memory block (602, 603) and each group of n bits required at an input of the datapath of the one or more datapaths is seamlessly obtainable in a single read operation from the at least one logical 3D memory block (602, 603). In this manner, the elements are seamlessly exchanged between the datapaths and the logical 3D memory blocks, without rearrangement.

In some examples, each of the one or more element(s) is one bit when the polar coder circuit (600, 1600) is configured to perform one of: a polar encoding operation, a polar Successive Cancellation, SC, decoding operation, or each of the one or more element(s) comprises vectors of L bits when the polar coder circuit (1600) is configured to perform a Successive Cancellation List, SCL, decoding operation with a list size of L. In this manner, polar encoding, polar SC decoding and polar SCL decoding can benefit from the simplified controller and seamless reading and writing of elements into the logical 3D memory blocks.

In a second aspect, examples of the present invention describe a communication unit comprising a polar coder circuit according to the first aspect.

In a third aspect, examples of the present invention describe an integrated circuit comprising a polar coder circuit according to the first aspect.

In a fourth aspect, examples of the present invention, a method of polar coding is described according to the first aspect. The method includes: apportioning the at least one logical 3D memory block into three dimensions; directing the one or more datapaths to process bits that are read from the at least one logical 3D memory block across at least one of the first dimension and the second dimension; and directing the one or more datapaths to write processed bits to the at least one logical 3D memory block across at least one of the first dimension and the second dimension.

In a fifth aspect, examples of the present invention describe a non-transitory tangible computer program product comprising executable code stored therein for polar coding according to the fourth aspect.

Although examples of the invention are described with reference to kernal block sizes 'N' that can vary from block to block, it is envisaged in other examples that the described polar coder may operate as an inflexible coder that only supports one block size of 'N'.

Examples of the invention describe a mechanism to provide a seamless flow of data through a polar coder. In some examples, the seamless flow of data through a polar coder may be achieved through a combination of three different design aspects: first an improved operation of the datapaths (described in the datapath sections), secondly the interfacing of the datapaths with the memory (described in the memory sections), and thirdly the control of this interfacing and the addressing of the memory (described in the controller sections). A skilled artisan will appreciate that achieving a seamless flow of data has influenced many design decisions and has proven to be the biggest challenge in the implementation of a polar coder.

Although examples of the invention when applied to polar decoding are described with reference to a use of LLR memory blocks, it is envisaged that these memory blocks are used to store any form of soft bits, and the use of LLR memory blocks to store soft bits as LLRs is used for explanatory purposes only.

Although examples of the invention are described with reference to an integrated circuit implementation within the application of a wireless communication receiver, it is envisaged that in other examples, the invention may be applied in other implementations and in other applications. For example, the circuits and concepts herein described may be composed as a hardware implementation within an Application Specific Integrated Circuit, an Application Specific Instruction Set Processor, an Application Specific Standard Product, a Field Programmable Gate Array, a General Purpose Graphical Processing Unit, System on Chip, Configurable Processor, for example. Similarly, it is envisaged that in other examples, a software implementation may be composed within a Central Processing Unit, a Digital Signal Processor or a microcontroller, for example. Besides wireless communication receivers, the invention may be composed into a wireless communication transceiver, or a communication device for other communication channels, such as optical, wired or ultrasonic channels. Furthermore, the invention may be composed into a storage device, in order to provide FEC for data recovered from optical, magnetic, quantum or solid-state media, for example.

Examples of the present invention further provide a method and architecture to code information according to the principles of polar coding, for the purpose of providing FEC during communication over unreliable channels or during storage in unreliable media. Examples of the present invention further provide a method and architecture to provide flexible support for information blocks that comprise a number of bits that varies from block to block.

In particular, examples of the present invention decompose a polar code graph into several columns, which each comprise a different set of one or more consecutive stages. Each column is further decomposed into several sub-graphs or rows, which may be further decomposed into several sub-rows. The columns and their constituent sub-graphs or rows are processed one after another, in an order that obeys the data dependencies of the polar coding process and which may revisit some rows in some columns several times. The processing of each column comprises several steps, during which the sub-graphs or sub-rows within each row are processed one after another.

Some examples of the present invention are described with reference to the New Radio (NR) standard, which is presently being defined by the 3rd Generation Partnership Project (3GPP) as a candidate for 5th Generation (5G) mobile communication. Presently, polar encoding and decoding has been selected to provide FEC in the uplink and downlink control channels of the enhanced Mobile Broad-Band (eMBB) applications of NR, as well as in the Physical Broadcast Channel (PBCH). Polar encoding and decoding has also been identified as candidates to provide FEC for the uplink and downlink data and control channels of the Ultra Reliable Low Latency Communication (URLLC) and massive Machine Type Communication (mMTC) applications of NR. Alternatively, some examples of the invention are described without reference to a particular standardised application. More broadly, the invention may be applied in any future communication standards that select polar encoding and decoding to provide FEC. Furthermore, the invention may be applied in non-standardised communication applications, which may use polar encoding and decoding to provide FEC for communication over wireless, wired, optical, ultrasonic or other communication channels. Likewise, the invention may be applied in storage applications, which use polar encoding and decoding to provide FEC in optical, magnetic, quantum, solid state and other storage media.

In some examples, the circuits and functions herein described may be implemented using discrete components and circuits, whereas in other examples the operations may be performed in a signal processor, for example in an integrated circuit.

Because the illustrated embodiments of the present invention may, for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

DETAILED DESCRIPTION OF FIGURES

Referring now to FIG. 1, a top-level schematic of a communication unit 100 that includes a polar encoder and polar decoder is illustrated, adapted according to examples of the invention. In this example of a communication unit 100, a skilled artisan will appreciate that a number of other components and circuits (such as frequency generation circuits, controllers, amplifiers, filters, etc.) are not shown for simplicity purposes only. In other examples, it is envisaged that the block 100 may take the form of an integrated circuit comprising the polar coder (and in some instances the block conditioning and polar decoding processing functionality) as well, for example for use in a communication unit, storage unit or any electronic device that is designed to use polar coding. In other examples, it is envisaged that the communication unit 100 may take the form of software running on a general purpose computation processor.

A polar encoder comprises three successive components, namely information block conditioning 101, the polar encoder kernal 102 and encoded block conditioning 103. These components are discussed in the following paragraphs. In order to provide context to the present discussion, FIG. 1 illustrates the communication or storage channel 108. A polar decoder comprises three successive components, namely information block conditioning 112, the polar decoder kernal 111 and the encoded block conditioning 110. These components are also discussed in the following paragraphs. As will be discussed in the following paragraphs, the encoder operates on the basis of an information block 104, kernal information block 105, kernal encoded block 106 and encoded block 107. Correspondingly, the polar decoder operates on the basis of a recovered information block 115, recovered kernal information block 114, soft kernal encoded block 113 and soft encoded block 109, although these are processed in the reverse order.

In a context of a polar encoder, the input to the information block conditioning component 101 may be referred to as an information block 104, having a block size of K. More specifically, this information block is a row vector $a=[a_i]_{i=0}^{K-1}$ comprising K information bits, where $a_i \in \{0, 1\}$. In some alternative examples, the information block may be a column vector. The information block conditioning component 101 interlaces the K information bits with N–K redundant bits, which may be frozen bits [1], Cyclical Redundancy Check (CRC) bits [2], Parity Check (PC)-frozen bits [3], User Equipment Identification (UE-ID) bits [4], or hash bits [5], for example.

Here, frozen bits may always adopt a logic value of '0', while CRC or PC-frozen bits or hash bits may adopt values that are obtained as functions of the information bits, or of redundant bits that have already been interlaced earlier in the process. The information block conditioning component 101 generates redundant bits and interlaces them into positions that are identified by a prescribed method, which is also known to the polar decoder. The information block conditioning component 101 may also include an interleaving operation, which may implement a bit-reversal permutation [1] for example. The output of the information block conditioning component 101 may be referred to as a kernal information block 105, having a block size of N. More specifically, this kernal information block 105 is a row vector $u=[u_j]_{j=0}^{N-1}$ comprising N kernal information bits, where $u_j \in \{0, 1\}$. In some alternative examples, the kernal information block may be a column vector. Here, the information block conditioning must be completed such that N is a power of 2 that is greater than K, in order to provide compatibility with the polar encoder kernal, which operates on the basis of a generator matrix having dimensions that are a power of 2, as will be discussed below. The input to the polar encoder kernal 102 is a kernal information block u 105 and the output of the polar encoder kernal 102 may be referred to as a kernel encoded block 106, having a block size that matches the kernal block size N. More specifically, this kernal encoded block 106 is a row vector: $x=[x_j]_{j=0}^{N-1}$ comprising N kernal encoded bits, where $x_j \in \{0, 1\}$. In some alternative examples, the kernal encoded block may be a column vector. In the case where row vectors are used, the kernal encoded block 106 is obtained according to the modulo-2 matrix multiplication $x=uF^{\oplus n}$, where the modulo-2 sum of two bit values may be obtained as their XOR. Here, the generator matrix $F^{\oplus n}$ is given by the [n=log 2(N)]th Kronecker power of the kernal matrix:

$$F = \begin{bmatrix} 1 & 0 \\ 1 & 1 \end{bmatrix}.$$

Note that successive Kronecker powers of the kernal matrix may be obtained recursively, where each power $F^{\oplus n}$ is obtained by replacing each logic '1' in the previous power $F^{\oplus(n-1)}$ with the kernal matrix and by replacing each logic '0' with a 2×2 zero matrix. Accordingly, the $n^{th}$ Kronecker power $F^{\oplus n}$ of the kernal matrix has dimensions of $2^n \times 2^n$. For example, $$F^{\oplus 2} = \begin{bmatrix} 1 & 0 & 0 & 0 \\ 1 & 1 & 0 & 0 \\ 1 & 0 & 1 & 0 \\ 1 & 1 & 1 & 1 \end{bmatrix}, F^{\oplus 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}.$$

Here, u=[1011] gives x=uF$^{\oplus 2}$=[1101] and u=[11001001] gives x=uF$^{\oplus 3}$=[00110111].

A skilled artisan will appreciate that the level of integration of circuits or components may be, in some instances, implementation-dependent. Furthermore, it is envisaged in some examples that a signal processor may be included in a communication unit 100 and be adapted to implement the encoder and decoder functionality. Alternatively, a single processor may be used to implement a processing of both transmit and receive signals, as shown in FIG. 1, as well as some or all of the baseband/digital signal processing functions. Clearly, the various components, such as the described polar encoder, within a wireless or wired communication unit 100 can be realized in discrete or integrated component form, with an ultimate structure therefore being an application-specific or design selection.

Figure 2:
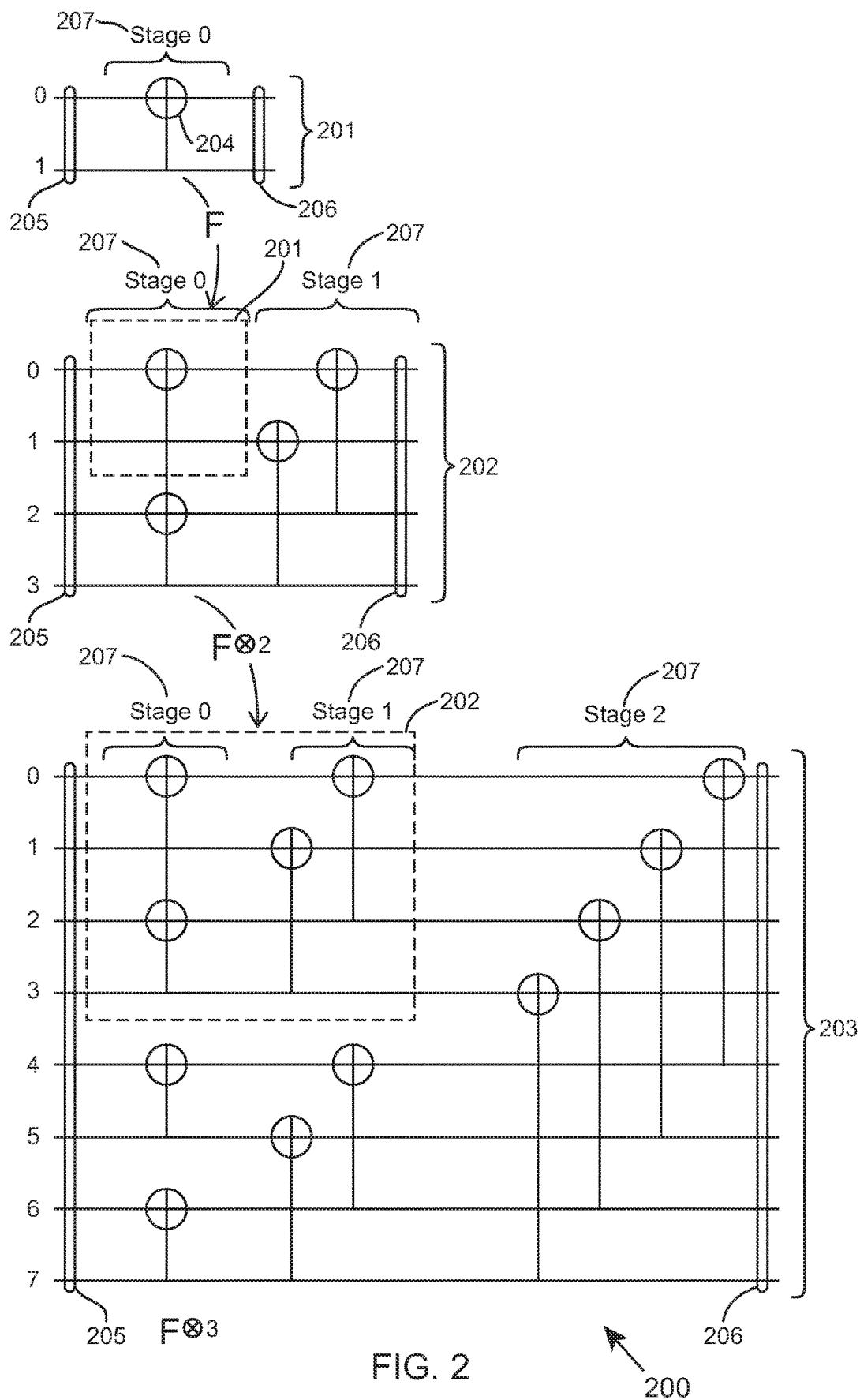
FIG. 2 illustrates an example graphical representation of the generator matrices F, $F^{\oplus 2}$ and $F^{\oplus 3}$, according to example embodiments of the invention.

In some examples, the operation of the polar encoder kernal 102 may be represented by a graphical representation 201, 202, 203 of the generator matrix F$^{\oplus n}$, which is exemplified in FIG. 2. Referring now to FIG. 2 an example graphical representation 200 of the generator matrices F 201, F$^{\oplus 2}$ 202 and F$^{\oplus 3}$ 203 are illustrated according to examples of the invention.

The graphical representation of a generator matrix F$^{\oplus n}$ comprises a network of N log$_2$(N)/2 modulo-2 additions, which are connected to each other, as well as to a set of N=2$^n$ information connections along the height of the graphical representation's left-hand edge and to a set of N encoded connections along the height of its right-hand edge. From left-to-right, the modulo-2 additions are arranged in to a series of n stages, which each has N connections on each of its left and right hand edges to either another stage, or to the left or right hand edge of the graphical representation. Each stage horizontally connects each of the connections on its left hand edge to the corresponding horizontally-aligned connection on its right hand edge, either directly, or via a modulo-2 addition, which is vertically connected to a horizontal connection lower in the stage. Each stage comprises a total of N/2 vertically-aligned modulo-2 additions. In the present invention, the set of n stages is grouped into C<n columns, where each column comprises a different non-overlapping set of consecutive stages.

The graphical representations 201, 202, 203 of the generator matrix F$^{\oplus n}$ are examples of small polar code graphs, whereas in general, the polar code graphs may be much bigger and have any dimension n>0. Thus, the example in FIG. 2 illustrates a much more simplified arrangement than exists in practice, purely for the purpose of explanation and not to obfuscate the description of the invention.

Here, each modulo-2 addition ⊕ 204 may be implemented using a binary eXclusive-OR (XOR) operation. Note that the graph comprises 'N' inputs on its left edge 205 and 'N' outputs on its right edge 206, corresponding to the 'N' kernal information bits of 'u' 105 and the 'N' kernal encoded bits of 'x' 106. The graphical representations of the generator matrices F 201, F$^{\oplus 2}$ 202 and F$^{\oplus 3}$ 203 comprise n=log 2(N) stages 207, each of which comprises N/2 vertically aligned XORs 204, giving a total of N log 2(N)=2 XORs. Note that there are data dependencies between successive stages 207 that enforce a left to right processing schedule. More specifically, the data dependencies prevent the computation of the XORs in a particular stage 207 until after the XORs in the stage 207 to its left have been computed.

In some examples, in common with the recursive nature of successive Kronecker powers F$^{\oplus n}$, successive graphical representations of these generator matrices also have recursive relationships. More specifically, the graphical representation 200 for a polar encoding kernal operation having a kernal block size of N=2 201 comprises a single stage 207, containing a single XOR 204. Notably, in the example polar encoder, the first of the N=2 kernal encoded bits is obtained as the XOR of the N=2 kernal information bits, while the second kernal encoded bit is equal to the second kernal information bit. For greater kernel block sizes 'N', the graphical representation may be considered to be a vertical concatenation of two graphical representations for a kernal block size of N/2, followed by an additional stage 207 of XORs. In analogy with the N=2 kernal described above, the first N/2 of the N kernal encoded bits are obtained as XORs of corresponding bits from the outputs of the two N/2 kernals, while the second N/2 of the kernal encoded bits are equal to the output of the second N/2 kernal.

In this example, the input to the encoded block conditioning component 103 of the polar encoder is a kernal encoded block x 106 and its output may be referred to as an encoded block 107, having a block size of M. More specifically, this encoded block is a row vector comprising M encoded bits b=[b$_k$]$_{k=0}^{M-1}$, where b$_k$∈{0, 1}. In some alternative examples, the encoded block may be a column vector.

Here, the resultant polar coding rate is given by R=K/M, where the encoded block conditioning 103 must be completed such that 'M' is greater than 'K'. The encoded block conditioning component 103 may use various techniques to generate the 'M' encoded bits in the encoded block b 107, where 'M' may be higher or lower than 'N'. More specifically, repetition [6] may be used to repeat some of the 'N' bits in the kernel encoded block 'x', while shortening or puncturing techniques [6] may be used to remove some of the 'N' bits in the kernel encoded block 'x'. Note that shortening removes bits that are guaranteed to have logic values of '0', while puncturing removes bits that may have either of logic '0' or '1' values. The encoded block conditioning component may also include an interleaving operation. Following polar encoding, the encoded block 'b' 107 may be provided to a modulator, which transmits it over a communication channel 108.

Figure 3:
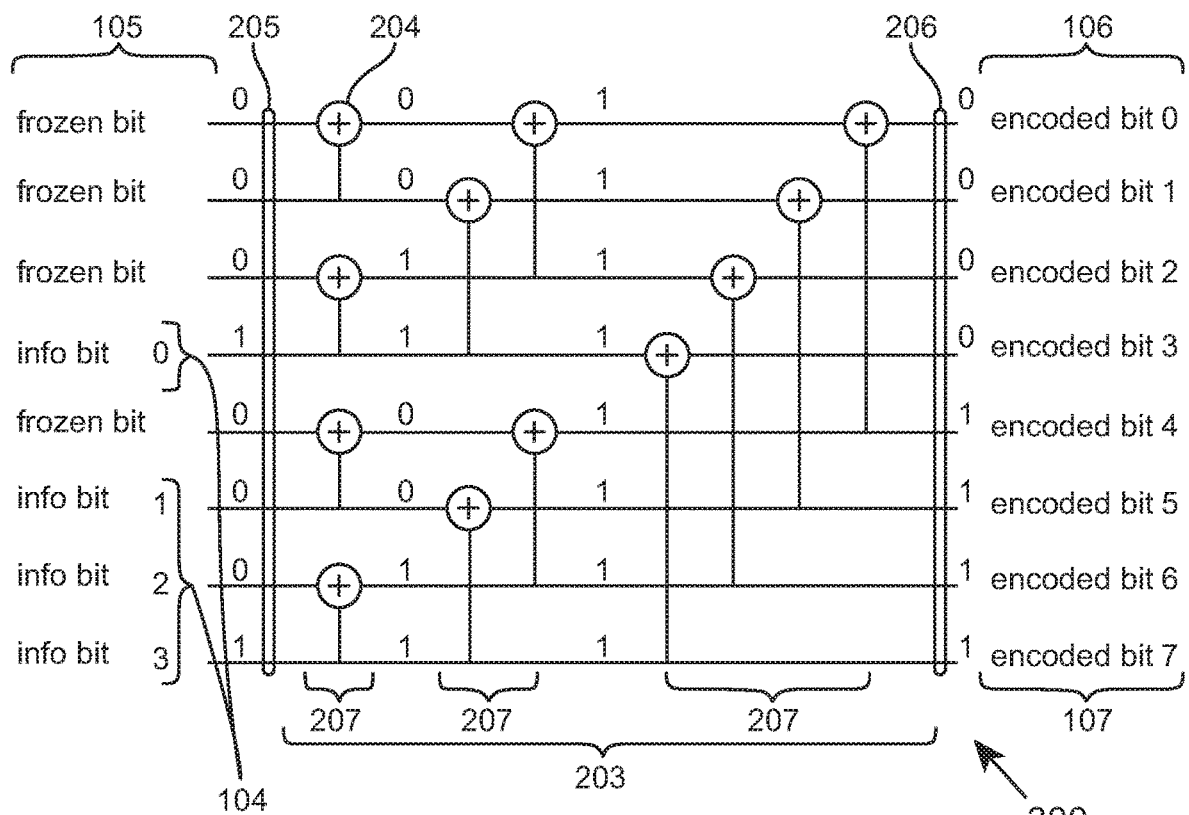
FIG. 3 illustrates an example polar encoding process, using the graphical representation of the generator matrix $F^{\oplus 3}$, illustrating the case where a particular frozen bit pattern is used to convert the K=4 information bits a=[1001] into the M=8 encoded bits b=[00001111], according to example embodiments of the invention.

Referring now to FIG. 3 an example polar encoding process, using an extension of the graphical representation 300 of the generator matrix F$^{\oplus 3}$ 203, illustrates the example where a particular frozen bit pattern is used to convert the K=4 information bits a=[1001] 104 into the M=8 encoded bits b=[00001111] 107. More specifically, information block conditioning 101 is used to convert the K=4 information bits a=[1001] 104 into the N=8 kernal information bits u=[00010001] 105. These are then converted into the N=8 kernal encoded bits x=[00001111] 106 by the polar encoder kernal 102 using the polar code graph 203. Here, the input paths can be traced through the various XOR operations to identify the output. Finally, encoded block conditioning 103 preserves all kernal encoded bits, to provide the M=8 encoded bits b=[00001111] 107.

In the receiver, the demodulator's role is to recover information pertaining to the encoded block. However, the demodulator is typically unable to obtain absolute confidence about the value of the M bits in the encoded block 107, owing to the random nature of the noise in the communication channel 108. The demodulator may express its confidence about the values of the bits in the encoded block 107 by generating a soft encoded block 109, having a block size of M. More specifically, this soft encoded block 109 is a row vector comprising M encoded soft bits $\tilde{b}=[\tilde{b}_k]_{k=0}^{M-1}$. Each soft bit may be represented in the form of a Logarithmic Likelihood Ratio (LLR):

$$\tilde{b}_k = \ln\left[\frac{Pr(b_k = 0)}{Pr(b_k = 1)}\right];$$

where $Pr(b_k='0')$ and $Pr(b_k='1')$ are probabilities that sum to '1'.

Here, a positive LLR $\tilde{b}_k$ indicates that the demodulator has greater confidence that the corresponding bit $b_k$ has a value of '0', while a negative LLR indicates greater confidence in the bit value '1'. The magnitude of the LLR expresses how much confidence, where an infinite magnitude corresponds to absolute confidence in this bit value, while a magnitude of '0' indicates that the demodulator has no information about whether the bit value of '0' or '1' is more likely.

In an alternative approach, each soft bit may be represented by a pair of Logarithmic Likelihoods (LLs):

$$\tilde{b}_k(0)=ln[Pr(b_k=0)]$$

$$\tilde{b}_k(1)=ln[Pr(b_k=1)]$$

A polar decoder comprises three successive components, namely encoded block conditioning 110, the polar decoder kernal 111 and information block conditioning 112, as shown in FIG. 1. These components are discussed in the following paragraphs.

The input to the encoded block conditioning component 110 of the polar decoder is a soft encoded block $\tilde{b}$ 109 and its output may be referred to as a soft kernal encoded block 113, having a block size of N. More specifically, this soft kernal encoded block 113 is a row vector comprising 'N' kernal encoded LLRs $\tilde{x}=[\tilde{x}_j]_{j=0}^{N-1}$. In order to convert the M encoded LLRs into 'N' kernal encoded LLRs, infinite-valued LLRs may be interlaced with the soft encoded block 109, to occupy the positions within the soft kernal encoded block that correspond to the '0'-valued kernal encoded bits that were removed by shortening in the polar encoder. Likewise, '0'-valued LLRs may be interlaced with the soft encoded block 109, to occupy the positions where kernal encoded bits were removed by puncturing. In the case of repetition, the LLRs that correspond to replicas of a particular kernal encoded bit may be summed and placed in the corresponding position within the soft kernal encoded block 109. A corresponding deinterleaving operation may also be performed, if interleaving was employed within the encoded block conditioning component 103 of the polar encoder.

The input to the polar decoder kernal 111 is a soft kernal encoded block $\tilde{x}$ 113 and its output may be referred to as a recovered kernal information block 114, having a block size of 'N'. More specifically, this recovered kernal information block 114 is a row vector comprising 'N' recovered kernal information bits $\hat{u}=[\hat{u}_j]_{j=0}^{N-1}$, where $\hat{u}_j \in \{0, 1\}$. In some examples, he polar decoder kernal 111 may operate using various different algorithms, including Successive Cancellation (SC) decoding [1] and Successive Cancellation List (SCL) decoding [7].

The input to the information block conditioning component 112 of the polar decoder is a recovered kernal information block 114 and its output may be referred to as a recovered information block 115, having a block size of 'K'. More specifically, this recovered information block 115 is a row vector $\hat{a}=[\hat{a}_i]_{i=0}^{K-1}$ comprising 'K' recovered information bits, where $\hat{a}_i \in \{0, 1\}$. The recovered information block may be obtained by removing all redundant bits from the recovered kernal information block $\hat{u}$ 114. A corresponding deinterleaving operation may also be performed, if interleaving was employed within the information block conditioning component 101 of the polar encoder.

1) SC decoding: A polar decoder kernal that operates on the basis of SC decoding may be considered to have a similar graph structure 201, 202, 203 to a polar encoder, as illustrated in FIG. 2. It may be observed that each stage 207 of the graph comprises N/2 basic computation units, which resemble the N=2 graph 201. More specifically, each basic computation unit has two connections on its left-hand edge, which connect to basic computation units in the stage 207 immediately to the left, or which connect to the left-hand edge of the graph 205 if there are no stages to the left. These connections on the left-hand edge of the basic computation unit are horizontally-aligned with two connections on its right-hand edge, which connect to basic computation units in the stage 207 immediately to the right, or which connect to the right-hand edge of the graph 206 if there are no stages to the right. Within the basic computation unit, the first of the two right-hand connections is connected via an XOR 204 to the two-left hand connections, while the second right-hand connections is directly connected to the second left-hand connection. In the left-most stage of the graph, the two connections on the left-hand and right-hand edges of each basic computation unit are vertically consecutive to each other. But in the other stages, the two connections of each basic computation unit are vertically separated from each other by an offset that doubles in each successive stage 207.

An SC decoder performs computations pertaining to the basic computation units, according to a sequence that is dictated by data dependencies. More specifically, there are three types of computations that can be performed for a particular basic computation unit, depending on the availability of LLRs provided on the connections 403, 404 on its right-hand edge, as well as upon the availability of bits provided on the connections 401, 402 on its left-hand edge.

Figure 14:
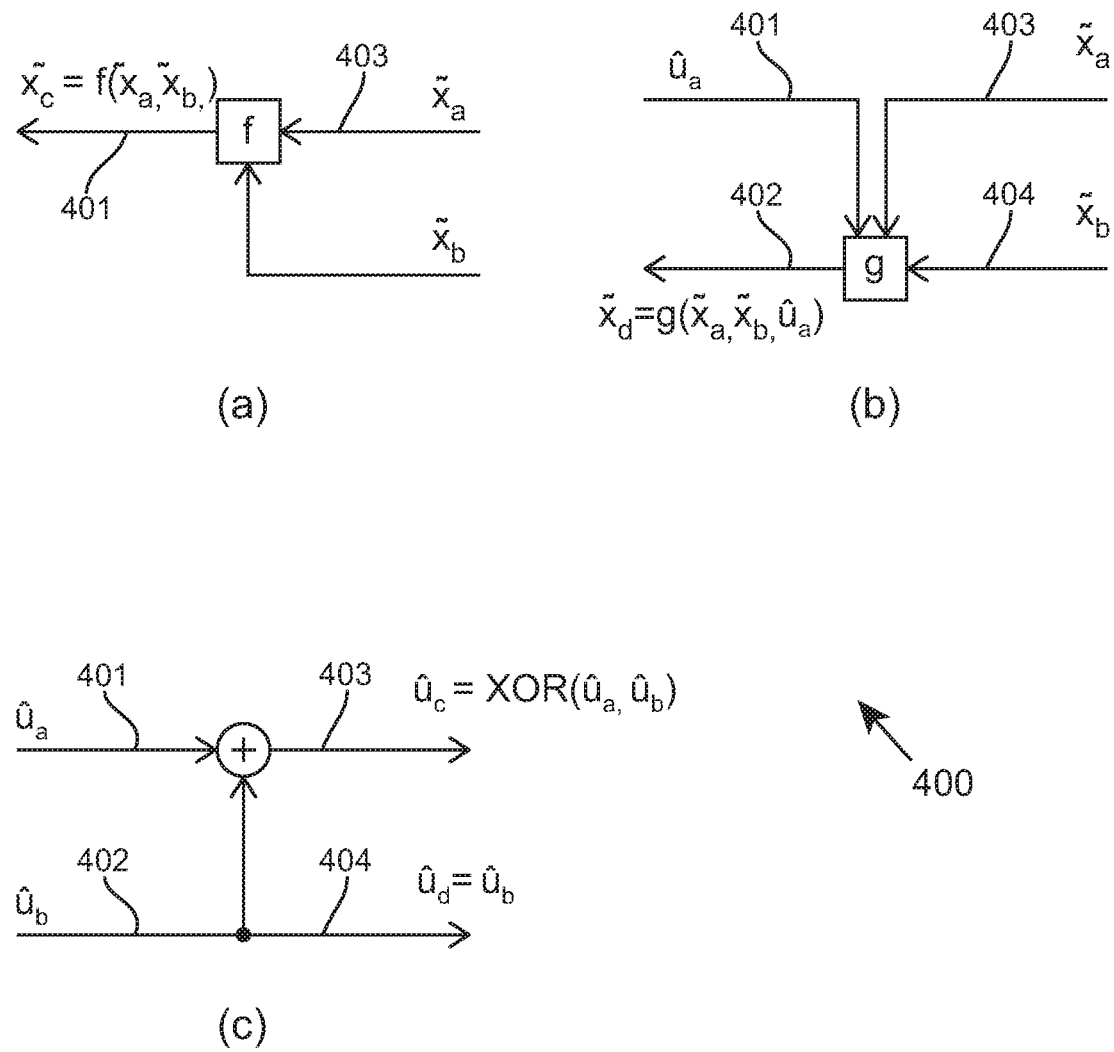
FIG. 14 illustrates an example of the three computations that can be performed for a basic computation unit of the proposed polar decoder kernal: (a) the f function, (b) the g function and (c) partial sum calculation, according to example embodiments of the invention.

The first occasion when a basic computation unit can contribute to the SC decoding process is when an LLR has been provided by both of the connections 403, 404 on its right-hand edge. FIG. 14 illustrates an example of the three computations 400 that can be performed for a basic computation unit of the proposed polar decoder kernal: (a) the f function, (b) the g function and (c) partial sum calculation, according to example embodiments of the invention. As shown in FIG. 14(a), we refer to the first and second of these two LLRs as $\tilde{x}_a$ and $\tilde{x}_b$, respectively. This enables the basic computation unit to compute an LLR $\tilde{x}_c$ for the first 401 of the two connections on its left-hand edge, according to the f function:

$$\tilde{x}_c = f(\tilde{x}_a, \tilde{x}_b) \quad (1)$$
$$= 2\tanh^{-1}(\tanh(\tilde{x}_a/2)\tanh(\tilde{x}_b/2))$$
$$\approx \text{sign}(\tilde{x}_a)\,\text{sign}(\tilde{x}_b)\min(|\tilde{x}_a|, |\tilde{x}_b|), \quad (2)$$

where sign(·) returns '−1' if its argument is negative and '+1' if its argument if positive.

Later in the SC decoding process, a bit $\hat{u}_a$ will be provided on the first 401 of the connections on the left-hand edge of the basic computation unit, as shown in FIG. 14(b). Together with the LLRs $\tilde{x}_a$ and $\tilde{x}_b$ that were previously provided using the connections 403, 404 on the right-hand edge, this enables the basic computation unit to compute an LLR $\tilde{x}_d$ for the second 402 of the two connections on its left-hand edge, according to the g function:

$$\tilde{x}_d = g(\tilde{x}_a, \tilde{x}_b, \hat{u}_a) \quad (3)$$
$$= (-1)^{\hat{u}_a}\tilde{x}_a + \tilde{x}_b.$$

Later still, a bit $\hat{u}_b$ will be provided on the second 402 of the connections on the left-hand edge of the basic computation unit, as shown in FIG. 14(c). Together with the bit $\hat{u}_a$ that was previously provided using the first 401 of the connections on the left-hand edge, this enables the partial sum computation of bits $\hat{u}_c$ and $\hat{u}_d$ for the first 403 and second 404 connections on the right-hand edge of the basic computation unit, where:

$$\hat{u}_c = \text{XOR}(\hat{u}_a, \hat{u}_b), \quad (4)$$

$$\hat{u}_d = \hat{u}_b \quad (5)$$

As may be appreciated from the discussions above, the f function of (1) or (2) may be used to propagate LLRs from right-to-left within the graph, while the partial sum computations of (4) and (5) may be used to propagate bits from left-to-right and while the g function of (3) may be used to switch from propagating bits to propagating LLRs.

In order that LLRs can be propagated from right to left, it is necessary to provide LLRs on the connections on the right-hand edge 206 of the graph. This is performed at the start of the SC decoding process, by providing successive LLRs from the soft kernal encoded block $\tilde{x}$ 113 on successive connections on the right-hand edge 206 of the graph. Likewise, it is necessary to provide bits on the connections of the left-hand edge 205 of the graph, in order to facilitate the propagation of bits from left to right. Here, a further data dependency beyond those described above is imposed. If the position of a particular connection on the left-hand edge of the graph corresponds to the position of an information bit in the kernal information block u 105, then the bit that is input into that connection depends on the LLR that is output from that connection. More specifically, if a positive LLR is output on the connection, then a value of 0 may be selected for the corresponding bit of the recovered kernal information block $\hat{u}$ 114 and then input into the connection. Meanwhile, a negative LLR allows a value of '1' to be selected for the corresponding bit of the recovered kernal information block 114 and then input into the connection. In the case of a connection corresponding to a redundant bit within the kernal information block u 105, the value of that redundant bit may be input into the connection as soon as it is known. Here, the value of frozen and UE-ID bits may be known before the SC decoding process begins, but the value of CRC, PC and hash bits may not become available until related information bits have been recovered.

In combination, the data dependencies described above impose a requirement for the information bits within the recovered kernal information block $\hat{u}$ 114 to be obtained one at a time on the connections on the left edge 205 of the graph, in order from top to bottom. More specifically, the SC decoding process begins by using the f function (1) or (2) to propagate LLRs from the right hand edge 206 of the graph, to the top connection on the left-hand edge 205 of the graph, allowing the first bit to be recovered. Following this, each successive bit from top to bottom is recovered by using the partial sum computations of (4) and (5) to propagate bits from left to right, then using the g function of (3) for a particular basic computation unit to switch from bit propagation to LLR propagation, before using the f function to propagate LLRs to the next connection on the left-hand edge 205 of the graph, allowing the corresponding bit to be recovered. This process is illustrated in the example of FIG. 15.

Figure 15:
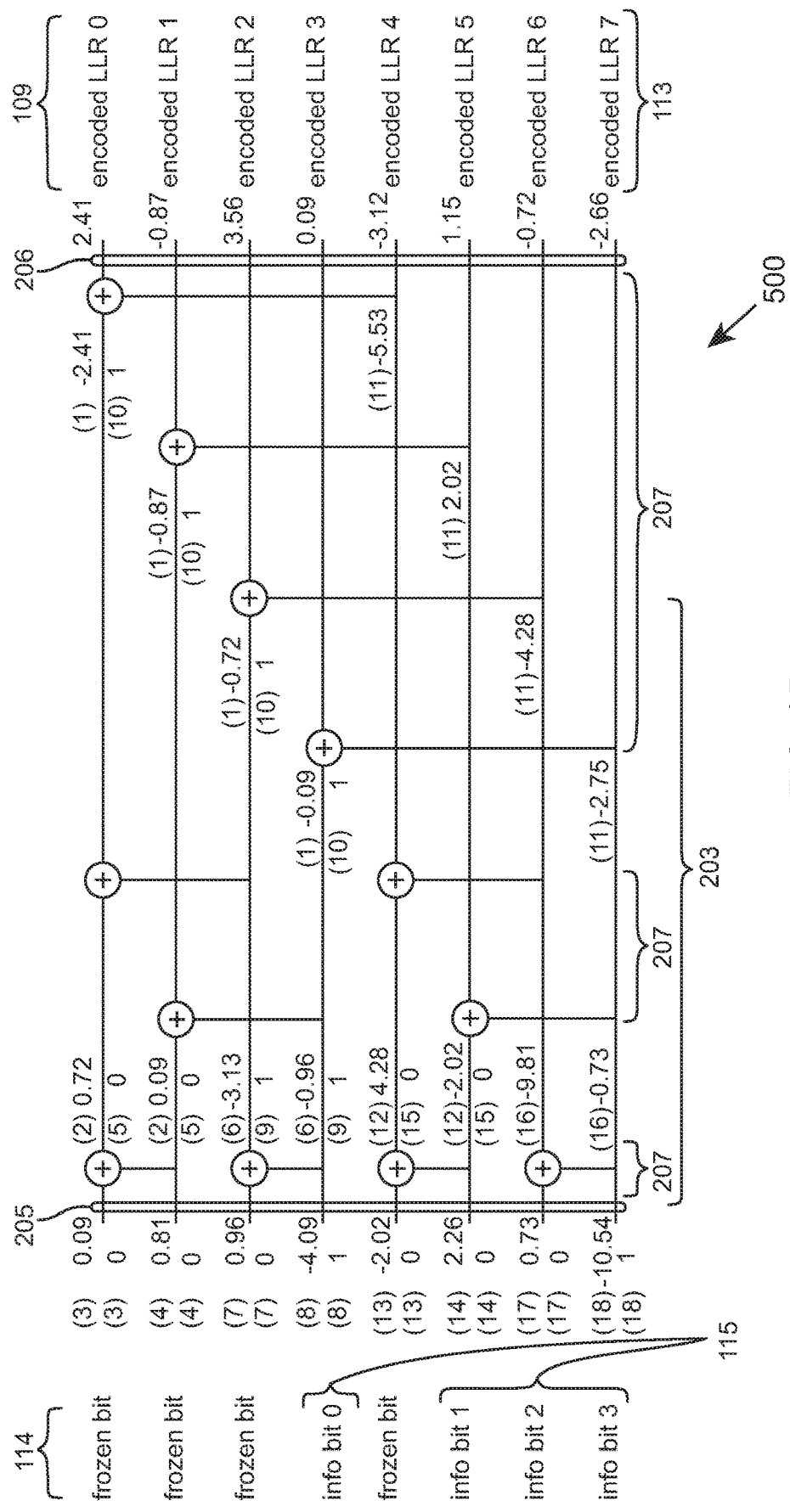
FIG. 15 illustrates an example of an SC decoding process, using the graphical representation of a generator matrix $F^{\oplus 3}$, for a case where a particular frozen bit pattern is used to convert a particular vector ~b of M=8 encoded LLRs into the K=4 recovered information bits ˆa=[1001], according to example embodiments of the invention.

FIG. 15 illustrates an example of an SC decoding process 500, using a graphical representation of a generator matrix $F^{\oplus 3}$ 203 for a case where a particular frozen bit pattern is used to convert a particular vector ~b of M=8 encoded LLRs 109 into the K=4 recovered information bits $\hat{a}=[1001]$ 115, according to example embodiments of the invention. The LLRs obtained using the f and g functions of equations (2) and (3) are shown above each connection. The bits obtained using the partial sum computations of equations (4) and (5) are shown below each connection. The accompanying numbers in parenthesis identify the step of the SC decoding process where the corresponding LLR or bit becomes available.

2) SCL Decoding:

In one example of the herein described SC decoding process, the value selected for each bit in the recovered information block 115 depends on the sign of the corresponding LLR, which in turn depends on the values selected for all previous recovered information bits. If this approach results in the selection of the incorrect value for a particular bit, then this will often result in the cascading of errors in all subsequent bits. The selection of an incorrect value for an information bit may be detected with consideration of the subsequent frozen bits, since the decoder knows that these bits should have values of '0'. More specifically, if the corresponding LLR has a sign that would imply a value of '1' for a frozen bit, then this suggests that an error has been made during the decoding of one of the preceding information bits. However, in the SC decoding process, there is no opportunity to consider alternative values for the preceding information bits. Once a value has been selected for an information bit, the SC decoding process moves on and the decision is final.

This motivates SCL decoding [7], which enables a list of alternative values for the information bits to be considered. As the decoding process progresses, it considers both options for the value of each successive information bit. More specifically, an SCL decoder maintains a list of candidate kernal information blocks, where the list and the kernal information blocks are built up as the SCL decoding process proceeds. At the start of the process, the list comprises only a single kernal information block having a length of zero bits. Whenever the decoding process reaches a frozen bit, a bit value of 0 is appended to the end of each kernal information block in the list. However, whenever the decoding process reaches an information bit, two replicas of the list of candidate kernal information blocks is created. Here, the bit value of '0' is appended to each block in the first replica and the bit value of 1 is appended to each block in the second replica. Following this, the two lists are merged to form a new list having a length which is double that of the original list. This continues until the length of the list reaches a limit L, which is typically chosen as a power of two. From this point onwards, each time the length of the list is doubled when considering an information bit, the worst L among the 2L candidate kernal information blocks are identified and pruned from the list. In this way, the length of the list is maintained at L until the SCL decoding process completes.

Here, the worst candidate kernal information blocks are identified by comparing and sorting metrics that are computed for each block [8], based on the LLRs obtained on the left-hand edge 205 of the polar code graph. These LLRs are obtained throughout the SCL decoding process by using separate replicas of the partial sum computations of (4) and (5) to propagate the bits from each candidate kernal information block into the polar code graph, from left to right. Following this, separate replicas of the g and f computations of (1)-(3) may be used to propagate corresponding LLRs from right to left, as in the herein described example SC decoding process. The metric associated with appending the bit value $\hat{u}_{l,j}$ in the position $j \in [0, N-1]$ to the candidate kernal information block l is given by:

$$\phi_{l,j}(\hat{u}_{l,j}) = \phi_{l,j-1} + \ln(1 + e^{-(1-2\hat{u}_{l,j})\tilde{x}_{l,j}}) \qquad (6)$$

$$\approx \begin{cases} \phi_{l,j-1} & \text{if } \hat{u}_{l,j} = \frac{1}{2}(1 - \text{sign}(\tilde{x}_{l,j})) \\ \phi_{l,j-1} + |\tilde{x}_{l,j}| & \text{otherwise} \end{cases}, \qquad (7)$$

where $\tilde{x}_{l,j}$ is the corresponding LLR and $\phi_{l,j-1}$ is the metric that was calculated for the candidate kernal information block in the previous step of the SCL decoding process. Note that since the metrics accumulate across all bit positions $j \in [0, N-1]$, they must be calculated for all L candidate kernal information blocks whenever a frozen bit value of '0' is appended, as well as for all 2L candidates when both possible values of an information bit are considered. In the latter case, the 2L metrics are sorted and L candidates having the highest values are identified as being the worst and are pruned from the list.

Following the completion of the SCL decoding process, the candidate kernal information block having the lowest metric may be selected as the recovered kernal information block 114. Alternatively, in CRC-aided SCL decoding [9], all candidates in the list that do not satisfy a CRC are pruned, before the candidate having the lowest metric is selected and output.

Figure 4:
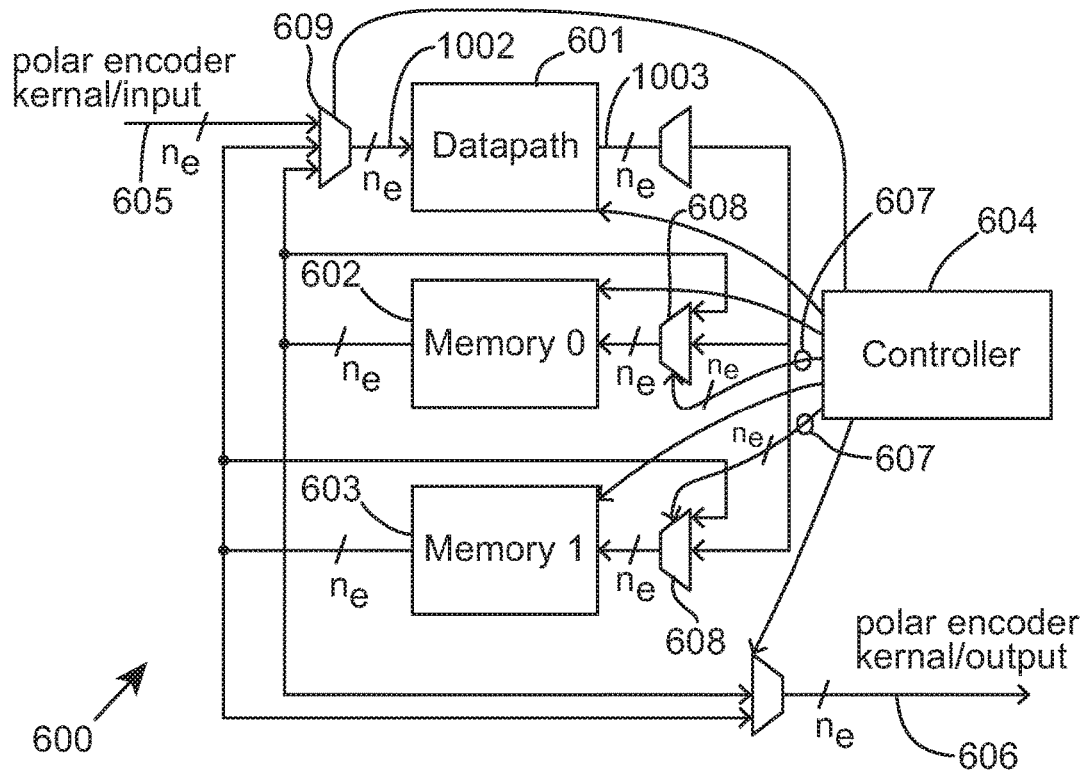
FIG. 4 illustrates an example schematic of the proposed polar encoder kernal, according to example embodiments of the invention.

Encoder Architecture Example:

Referring now to FIG. 4, an example schematic of the proposed polar encoder kernal 600 is illustrated, according to example embodiments of the invention. The proposed polar encoder kernal 102 comprises a datapath 601, two memory blocks 602, 603 and a controller 604. In contrast to known processor architectures for implementing an encoder, examples of the present invention describe the processing of each column by reading from one memory and writing into the other, with the roles of the two memory blocks alternating for successive columns. Each column may include one or more stages of the polar code graph. Furthermore, the processing may be spread over successive clock cycles, depending on the block size of the datapath.

In contrast to the known polar encoders, examples of the present invention decompose the polar code graph into several columns, which each comprise a different set of one or more consecutive stages. The columns are processed one after another, in order from left to right. Each column is further decomposed into several sub-graphs, where, in some examples, the one or more sub-graphs within each column are each configured to span the width of the column.

In some examples, the sub-graphs within a particular column contain mutually exclusive sets of XORs and interconnections, where any particular XOR or interconnection within a particular sub-graph is not connected to any XOR or interconnection(s) in any other sub-graph in the same column. The processing of each column comprises several steps, during which the sub-graphs within the column are processed one after another, one sub-graph at a time. This is in contrast to the prior art of [37], [24], which decomposes the polar code graph into only a single column, comprising several rows, which are processed one after another, in order from top to bottom.

Whilst the examples of the present invention require a greater number of steps to complete the polar encoder kernal operation, the amount of hardware required, and the critical path length advantageously depend only on the maximum number of stages in a column, rather than on the maximum number of stages in the polar code graph, as in the prior art. This ensures that a high utility of the hardware is maintained for all block sizes, achieving superior hardware efficiency to the prior art.

Under the control of the controller 604, the datapath 601 is directed to process one sub-graph of one column in each step of the polar encoder kernal operation. More specifically, the input to the datapath 601 is read from one of the two memory blocks 602, 603 and the output of the datapath 601 is written to the other of the two memory blocks 602, 603. Here, the roles of the two memory blocks alternate during the processing of successive columns, such that the memory block that is written to during the processing of one column is read from during the processing of the next column. The bits are arranged within these memory blocks 602, 603 in a manner that allows the datapath 601 to perform seamless read and write operations, without the requirement for complex interconnection networks or complex control signals.

The proposed polar encoder kernal 600 enables the flexible encoding of one kernal information block 105 at a time, where successive kernal information blocks can have kernal block sizes N that can vary from block to block. More specifically, the kernal block size N can adopt the value of any power of two between 2 and Nmax, where Nmax is a parameter that is fixed at design time.

At the start of the polar encoding process, the kernal information block $u = [u_j]_{j=0}^{N-1}$ (say kernal information block 105 from FIG. 1) is provided to the bit input 605 of the polar encoder kernal 102, over a series of N/min(N; $n_e$) consecutive steps. The bit input has a width that can accept $n_e$ bits in each step, where the parameter $n_e$ is fixed at design time. In the example where N<$n_e$, zero-valued bits are appended to the end of the kernal information block before it is provided to the proposed polar encoder kernal 600, in order to increase its length to $n_e$. Following the completion of the polar encoding process, a series of N/min(N, $n_e$) consecutive steps is used to output one or more bits from the kernal encoded block $x = [x_j]_{j=0}^{N-1}$ 106 on the bit output 606 of the proposed polar encoder kernal 600, which also has a width of $n_e$ bits. In the example where N<$n_e$, zero-valued bits may be removed from the end of the output of the polar encoder kernal 600.

In a first example, the input 605 and output 606 of the polar encoder kernal 600 may be configured to have the same width of $n_e$ bits as the memory 602, 603 and datapath 601. In a second example, however, it is envisaged that the input 605 and output 606 of the polar encoder kernal 600 may be configured to have different widths to the memory 602, 603 and datapath 601 components, thereby allowing the width of the interfaces with the information and encoded block conditioning components 101, 103 to be selected independently of the datapath 601 width. This allows the hardware resources and number of clock cycles consumed by the block conditioning components 101, 103 and the polar encoder kernal 102 to be separately optimised.

Figure 5:
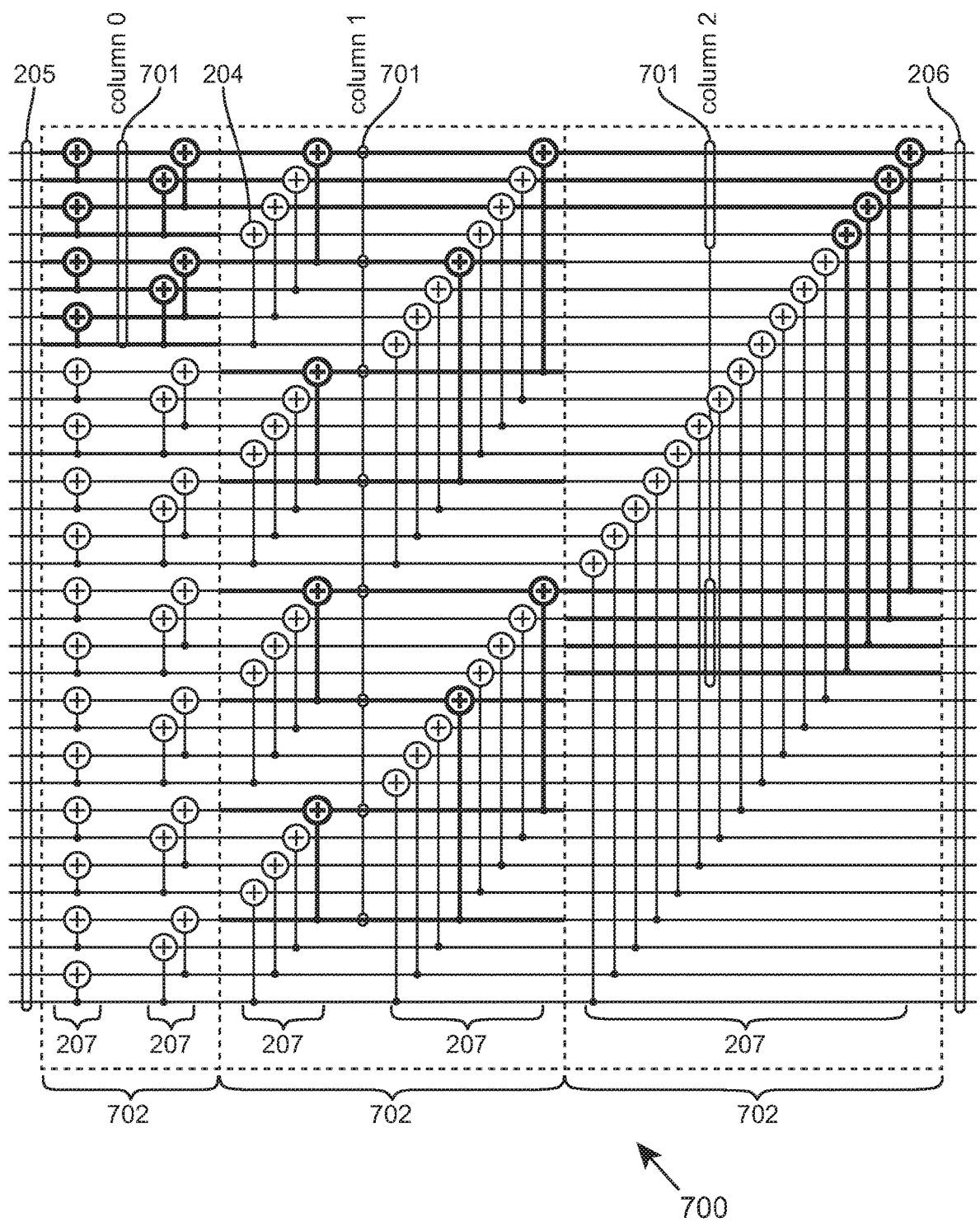
FIG. 5 illustrates an example graphical representation of the generator matrix $F^{\oplus 5}$, which has been grouped into C=3 columns comprising s=[2; 2; 1] stages, which corresponds to $s_d$=2, according to example embodiments of the proposed polar encoder kernal.

Referring now to FIG. 5, an example graphical representation 700 of the generator matrix $F^{\oplus 5}$, which has been grouped into C=3 columns comprising s=[2; 2; 1] stages, which corresponds to $s_e$=2 is illustrated, according to example embodiments of the invention. Here, $n_e$=8, which results in each column being decomposed into $N/n_e$=4 sub-graphs, providing a total of 12 sub-graphs across C=3 columns. Each column 702 is enclosed in a green box. The first sub-graph 701 in each column is highlighted in bold.

When encoding a kernal information block 105 having a block size of N, the proposed polar encoder kernal 600 operates on the basis of a graphical representations of the polar code generator matrix, as described above. Here, the n=log 2(N) stages 207 within the graphical representations are grouped into a number C of columns, where each column 702 comprises a particular number of consecutive stages 207. Each column 702 may be referred to by its index $c \in [0, C-1]$ where the left-most column has the index c=0 and the right-most column has the index c=C-1. The number of stages 207 in each column may be expressed using the row vector $s=[s_c]_{c=0}^{C-1}$, where $S_o$ is the number of stages in the left-most column and $s_{C-1}$ is the number of stages in the right-most column. Here, the vector s must be chosen such that: $\Sigma_{c=0}^{C-1} s_c = n_c$. To be more explicit, each stage 207 in the polar code graph comprises N/2 XORs 204, which may be reordered horizontally without changing the fundamental connectivity of the graph. Each column 702 comprises one or more horizontally consecutive stages.

In some examples, the particular number of stages 207 in each column 702 is selected depending on the kernal block size N, as well as the parameter $s_e$, which in some examples is fixed at design time. Here, $s_e$ specifies the maximum number of stages 207 that may be accommodated in each column 702, which can adopt any value in the range '1' to $n_{max}$=log 2($N_{max}$).

In this particular example, the graph is decomposed into $C=\lceil n/s_e \rceil$ number of columns, where n=$\log_2$(N) is the number of stages in the graph. More specifically, the first C-1 columns each comprise $s_e$ stages 207, while the right-most column comprises $s_{C-1}$=n-(C-1)$s_e$ stages, where $s_{C-1}$ may adopt any value in the range '1' to $s_e$, depending on the kernal block size N. This is exemplified in FIG. 5, where s=[2; 2; 1] results from $s_e$=2 in the example where the graph comprises n=5 stages 207.

In some alternative examples, the n stages 207 may be distributed among the C columns 702 using any other combination that satisfies $s_c \leq s_e$ for all $c \in [0, C-1]$. In some examples the graph may be decomposed into a maximum of $C_{max}=\lceil n_{max}/s_c \rceil$ number of columns, where the right-most column comprises a maximum of $s_{C-1, max}=n_{max}-(C_{max}-1)s_e$ stages 207 and all other columns comprise a maximum of $s_{c, max}=s_e$ stages 207. The set of columns is associated with a vector of so-called sub-code radixes $r=[r_c]_{c=0}^{C-1}$, where each sub-code radix is given by:

$$r_c = 2^{\sum_{c'=0}^{c} s_{c'}}.$$

Here, the sub-code radix $r_c$ of a particular column 702 quantifies the kernal block size N that would result if the graph comprised only the stages 207 in that column and in the columns to its left. Note that the sub-code radix $r_c$ of each successive column 702 grows from left to right. Each column 702 is decomposed into R=max(N/$n_e$, 1) independent sub-graphs 701, each having N/R=min(N, $n_e$) horizontally-aligned connections on its left- and right-hand edges, but no connections to any other sub-graphs within the column. Here, $n_e$ specifies the maximum sub-graph block size, which is a parameter that is fixed at design time and which can adopt the value of any power of two in the range $2^{s_o}$ to $N_{max}$. The connections on the left-hand and right-hand edges of a sub-graph 701 in the left-most column are vertically consecutive to each other. This is exemplified in the left-most column of FIG. 5, where R=4 results from $n_e$=8 in the example where the graph comprises n=5 stages 207. As exemplified by the middle column of FIG. 5, columns 702 having an index $c \in [1, C-1]$ are comprised of sub-graphs 701 with connections on the left- and right-hand edges that are vertically offset from each other by $r_{c-1}$ positions, unless $r_{c-1}$>R. When $r_{c-1}$>R, the sub-graph comprises N/$r_{c-1}$ groups of $r_{c-1}$/R vertically consecutive connections, where the groups are vertically offset from each other by $r_{c-1}$ positions, as exemplified in the right-most column of FIG. 5. In some examples, the vertical offset is used to select which XORs and interconnections form each sub-graph.

Figure 6:
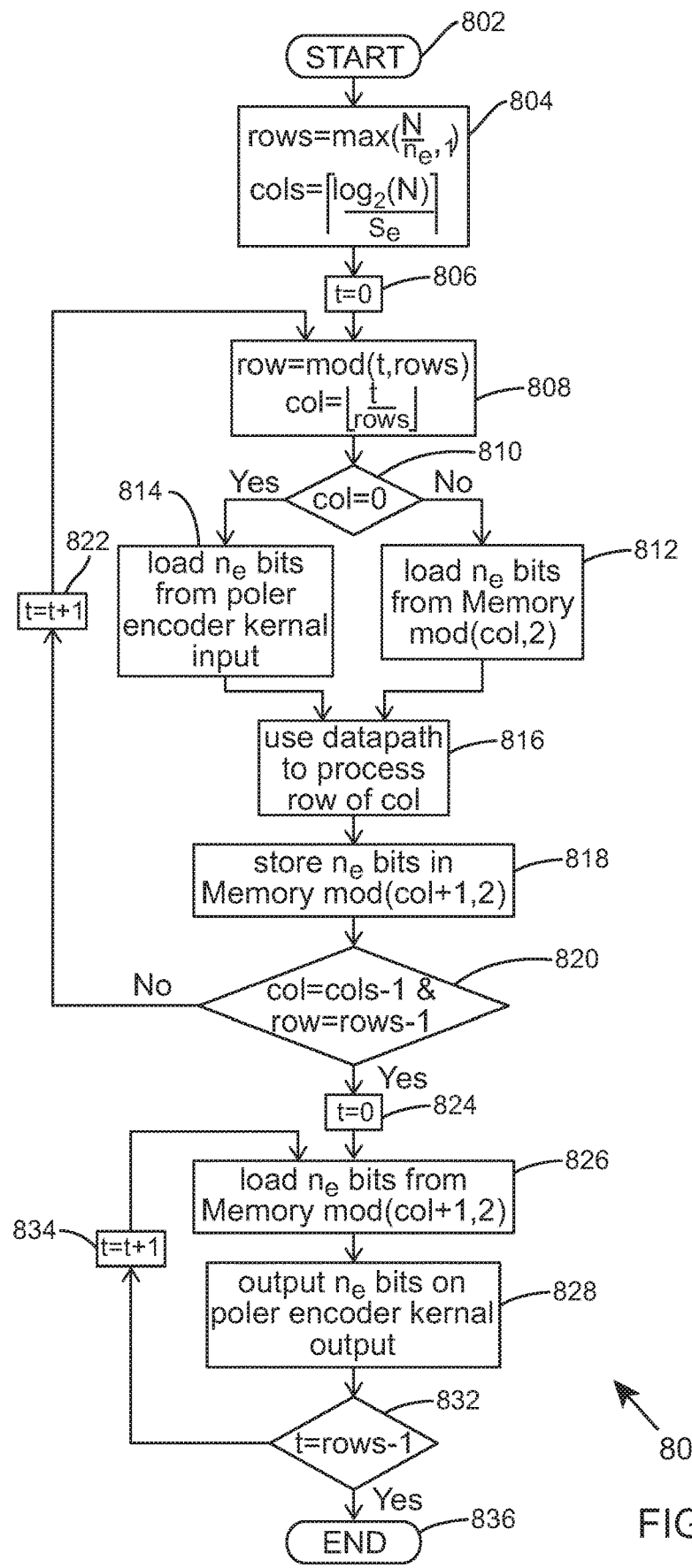
FIG. 6 illustrates an example flow chart of the encoding process employed by the proposed polar encoder kernal whereby each cycle around the main loops of the flow chart corresponds to one step of the data encoding process, according to example embodiments of the invention.

Referring now to FIG. 6 (and with reference to FIG. 4 for a hardware understanding of the operations followed) a flow chart 800 of the encoding process employed by the proposed polar encoder kernal 102, 600 is illustrated according to examples of the invention. The flowchart 800 starts at 802 and, at 804, the number of sub-graphs in each column is set to R=max(N/$n_e$; 1) and the number of columns has been set to C=ceil($\log_2$(N)/$s_e$). At 806 the main encoding loop is initiated, with a counter t set to '0'.

At 808, the current column is identified using the index to col=floor(t/R) and the sub-graph to be processed within the current column is identified using the index row=mod(t, R). At 810, a determination is made as to whether the column being processed is =0. If at 810, the column being processed is not =0, then the flowchart moves to 812 whereby $n_e$ bits are loaded from the memory block 602, 603 having the index mod(col, 2). However, if at 810, the column being processed is =0, then the flowchart moves to 814 whereby $n_e$ bits are loaded from the polar encoder kernel input. After 812 or 814, the flowchart moves to 816 whereby the datapath (such as datapath 601 from FIG. 4 and other figures) is used to process the current sub-graph of the selected column. At 818, $n_e$ bits are then stored in a memory block having the index mod(col+1, 2). Note that the input to the datapath 601 is read from one of the two memory blocks (such as memory blocks 602, 603 from FIG. 4 and other figures) and the output of the datapath 601 is written to the other of the two memory blocks 602, 603. Here, the roles of the two memory blocks alternate during the processing of successive columns, such that the memory block that is written to during the processing of one column is read from during the processing of the next column. At 820, a determination is then made as to whether col=C-1 and the row=R-1. If the col=C-1 or the row=R-1 is not valid, then the counter is incremented (t:=t+1) at 822. Thereafter, the flowchart loops to 808. If the determination of col=C-1 and the row=R-1 is valid, then the counter is reset at 824, with t=0. At 826, the $n_e$ bits are loaded from memory block having the index mod(col+1, 2) and at 828 the encoder outputs $n_e$ bits on the polar encoder kernal output 606. At 832, a determination is made as to whether the counter t has reached R−1. If the counter of t has not reached the R−1 at 832, then the counter is incremented at 834. If the counter t has reached R−1 at 832, then the flowchart ends at 836 and the conversion of the kernal information block into the kernal encoded block is complete.

Thus, in accordance with the data dependencies described previously, the proposed polar encoder kernal 102, 600 completes the processing for each column (e.g. one of the columns in FIG. 5) one after another, from left to right. Within each column, the sub-graphs 701 are processed one after another, in order from top to bottom, where the processing of each sub-graph constitutes one step in the proposed polar encoding process, as shown in FIG. 6. In alternative examples, the sub-graphs 701 within each column 702 may be processed in any order, whereby such alternative examples may require modifications to the design described above.

This approach is in contrast to the prior art of [37], [24], which decomposes the polar code graph into only a single column, comprising several rows, which are processed one after another, and specifically in order from top to bottom. While the present invention requires a greater number of steps to complete the polar encoder kernal operation, the amount of datapath hardware required and the critical path length depends only on the maximum number of stages in a column, rather than on the maximum number of stages $n_{max}=\log_2(N_{max})$ in the polar code graph, as in the prior art. This ensures that a high utility of the hardware is maintained for all block sizes, achieving superior hardware efficiency to the prior art. More specifically, the proposed approach exploits all of its parallelism in almost every step of the encoding process, irrespective of the number of stages 207 in the graph, resulting in maximised hardware efficiency for all block lengths.

Figure 7:
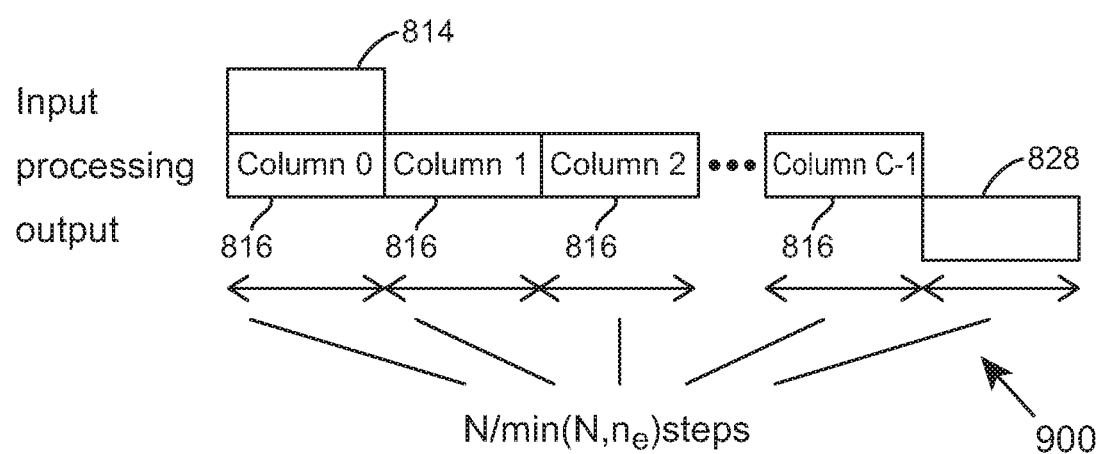
FIG. 7 illustrates an example timing diagram for the proposed polar encoder kernal, according to example embodiments of the invention.

Referring now to FIG. 7, an example timing diagram 900 for the proposed polar encoder kernal 102 and its example operation described in FIG. 6, is illustrated according to example embodiments of the invention.

As shown in FIG. 7, the whole process comprises a total of $T=\Sigma_{c=0}^{C-1} N/n_c = \lceil \log_2(\max(N, n_e))/s_e \rceil N/\min(N, n_e)$ steps. Note that the kernal information block 105 can be loaded into the proposed polar encoder kernal 102 concurrently with the processing of the left-most column in the graph. However, a further $N/\min(N, n_e)$ steps are required to output the kernal encoded block 106. In an alternative example (not shown), the outputting of one or more bits from of the kernal encoded block 106 may begin towards the end of the processing of the right-most column, thereby allowing some concurrency to be achieved. Each step may correspond to a single clock cycle in a hardware implementation, depending on if, and how, pipelining is applied, which may be used to optimise the clock frequency of the polar encoder kernal.

Encoder Datapath Example:

The datapath 601 of the proposed polar encoder is designed to perform the processing associated with one sub-graph of the polar code graph in each step of the polar encoding process. In this manner, the kernal information bits input on the left-hand edge of the polar code graph may be successively combined by the datapath into intermediate bits during successive steps of the polar encoding process, until the kernal encoded bits that are output on the right-hand edge of the polar code graph are obtained.

The datapath 601 of the proposed polar encoder is parameterised by $s_e$ and $n_e$, which are referred to here as the number of datapath stages and the datapath block size, the number of datapath stages $s_e$ can adopt any value in the range '1' to $n_{max}$, while the datapath block size $n_e$ can adopt the value of any power of two in the range $2^{s_e}$ to $N_{max}$. As exemplified in FIG. 8, the datapath 601 resembles a vertical concatenation of $n_e/2^{s_e}$ graph representations of the generator matrix $F^{\otimes s_e}$, which also resembles the left-most $s_e$ stages 207 in a graph representation of the generator matrix $F^{\otimes \log_2(n_e)}$. In this manner, having a larger $n_e$ is similar to a processing of more than one sub-graph at a time.

In alternative example arrangements (not shown), the datapath 601 may resemble any ordering of $s_e$ different stages 207 from a graphical representation of the generator matrix $F^{\otimes \log_2(n_e)}$ albeit with different RAM and controller designs to those described above.

Figure 8:
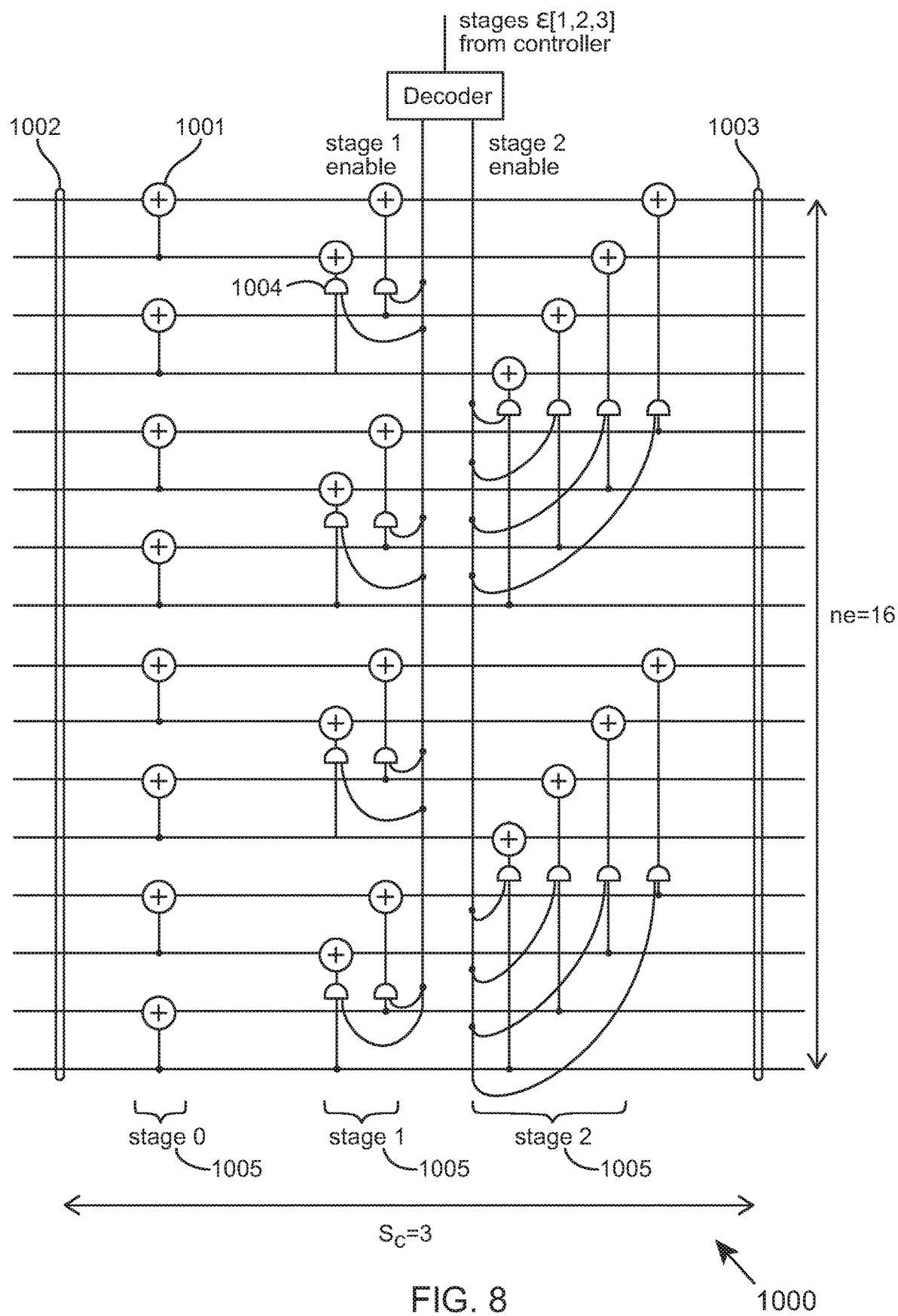
FIG. 8 illustrates an example schematic of the datapath in the proposed polar encoder kernal, for the example of $s_c$=3 and $n_c$=16, according to example embodiments of the invention.

Referring now to FIG. 8 an example schematic 1000 of the datapath 601 in the proposed polar encoder kernal 102, is illustrated for the example of $s_e=3$ and $n_e=16$. As exemplified in FIG. 8, the datapath 601 comprises a total of $s_e n_e/2$ XOR gates 1001, which propagate bits from the left edge 1002 of the datapath to its right edge 1003, along paths having a critical length comprising $s_e$ XOR gates. The operation of the datapath 601 is also dictated by the number of stages $s_c$ in the current column 702, which may be lower than $s_e$ in the example of the right-most column, as illustrated in Figure FIG. 5 and described in the accompanying discussion. When $s_c < s_e$, the number of stages in the datapath is reduced to match $s_c$ by disabling the XOR gates 1001 in the right-most stages of the datapath. In some examples, this disabling operation may be achieved by using AND gates 1004, as shown, to mask the corresponding vertical connections in the datapath. More specifically, a vertical connection may be enabled by providing a one-valued control input to the corresponding AND gate, allowing the bit value carried by the vertical connection to pass. By contrast, a vertical connection may be disabled by providing a zero-valued control input to the corresponding AND gate, forcing the vertical connection to provide a zero-valued bit to the corresponding XOR gate. In turn, this forces the XOR gate to pass the bit value provided on its left-hand input straight through to its output, effectively disabling the XOR gate.

In alternative example arrangements, stages 1005 (other than the right-most stages) may be disabled, in order to reduce the number of stages from $s_e$ to $s_c$. However, these alternative example arrangements may require a different controller design to that described above, as appreciated by a skilled artisan.

In some alternative example arrangements, it is envisaged that a designer may insert pipelining registers between some or all of the stages 1005 in the XOR graph, which may require a modification to the design of the controller. Here, pipelining may be introduced to increase the clock frequency of the polar encoder kernal, at the cost of increasing the number of clock cycles required. By carefully selecting if and how to apply pipelining, the throughput and latency of the polar decoder kernal may be optimised, such that the advantage of increased clock frequency maximally outweighs the disadvantage of requiring more clock cycles.

Encoder Memory Example:

Referring back to FIG. 4, the proposed polar encoder kernal 102 employs two three-dimensional blocks of memory, namely Memory '0' 602 and Memory '1' 603. Each of these memory blocks comprises $2^{s_e}$ RAMs, having widths of $n_e$ bits and depths of $\max(N_{max}/(2^{s_e} n_e), 1)$ addresses, where the RAMs, their width and their depth represent the three dimensions of the memory block. The total memory requirement of the proposed polar encoder kernal 102 is given by $2 \max(N_{max}, 2^{s_e} n_e)$ bits. To elaborate further, the memory blocks are three-dimensional in the sense that they have RAM, width and depth dimensions. This logical three-dimensional memory structure is compatible with, but not dependent on, a physical three-dimensional memory structure, where the RAMs may be physically stacked in a third physical dimension within an ASIC, for example. Conversely, it is envisaged that in other examples, the 'logical' three-dimensional memory structure can also be implemented in fewer 'physical' dimensions, where the RAMs are positioned side-by-side within an ASIC, rather than stacked in a third dimension, for example. Thus, in examples of the invention, three logical dimensions can be implemented using a different number of physical dimensions.

In some alternative example arrangements, it is envisaged that a designer may swap the roles of the RAM and width dimensions, instead for example by employing $n_e$ RAMs, having widths of $2^{s_o}$ bits. Also, rather than accommodating the two memory blocks 602, 603 in the RAM dimension using two distinct groups of RAMs, in some example alternative arrangements it is envisaged that a designer may accommodate the two blocks of memory within a single group of RAMs, either by doubling their widths or by doubling their depths, therefore accommodating the two memory blocks in the width or depth dimensions instead. To elaborate further, this implies that the two logical three-dimensional blocks of memory may be merged into a single logical three-dimensional block of memory. However, these alternative example arrangements may require different datapath interfaces and a different controller design to that described above, as appreciated by a skilled artisan.

Figure 9:
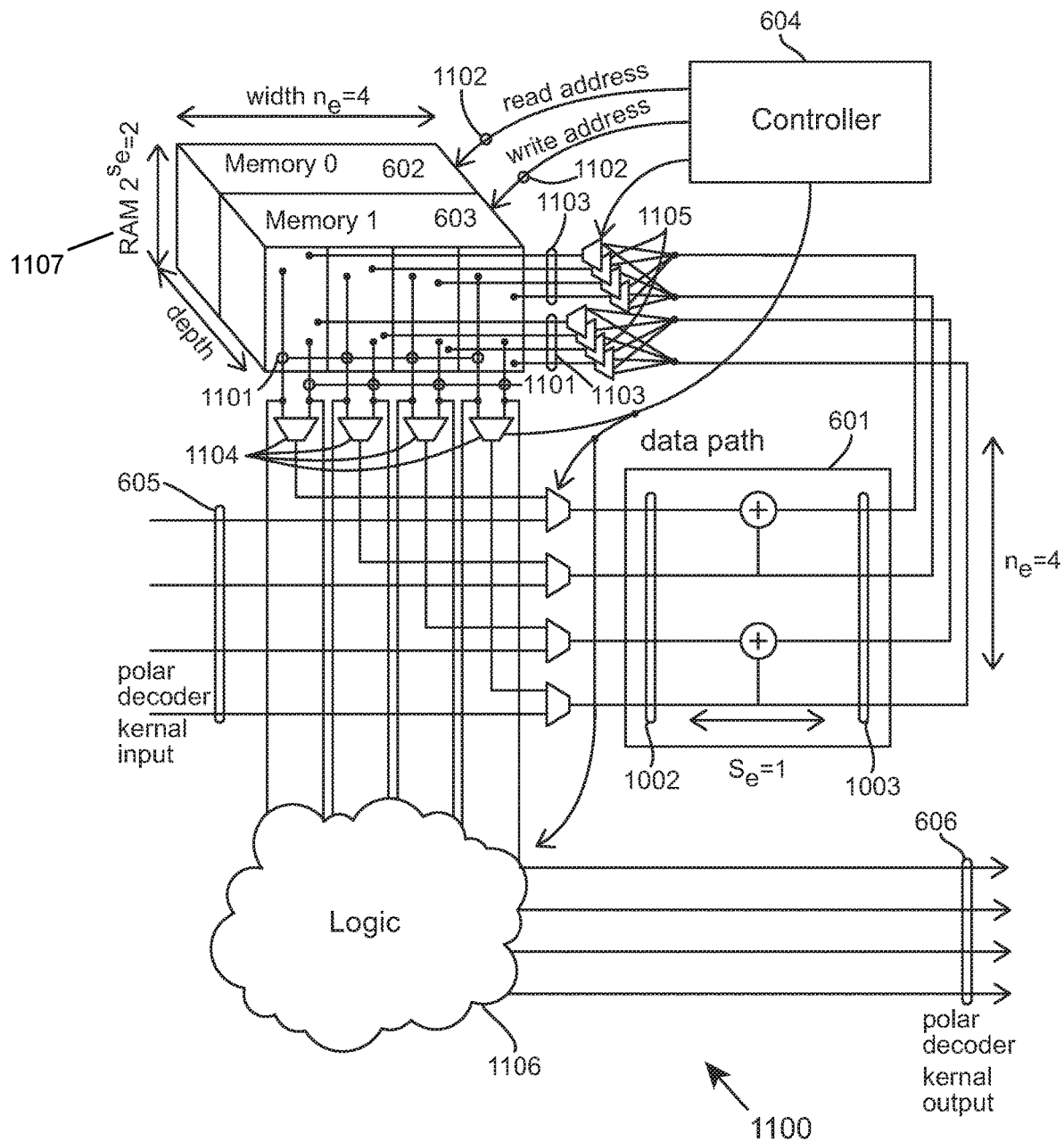
FIG. 9 illustrates an example schematic of the interaction between the datapath, memory and controller of the proposed polar encoder kernal, for the example of $s_c$=1 and $n_c$=4, according to example embodiments of the invention.

Referring now to FIG. 9 an example schematic 1100 of the interaction between the datapath 601, memory 602, 603 and controller 604 of the proposed polar encoder kernal 102, for the example of $s_e=1$ and $n_e=4$, is illustrated according to example embodiments of the invention. As illustrated, each RAM in each block of memory has an $n_e$-bit read port 1101. This read port outputs the $n_e$ bits across the width of a particular one of the max($N_{max}/(2^{s_o}n_e)$, 1) addresses across the depth of the RAM. Here, the particular address is selected by an input provided on an address port 1102, as shown in FIG. 9. Likewise, each RAM has a $n_e$-bit write port 1103, as shown in FIG. 9. This write port accepts inputs that can update the $n_e$ bits across the width of a particular address, which is selected by the input provided on the address port 1102. However, these $n_e$ bits are only updated if corresponding write enable signals 607 are asserted. It is assumed that $n_e$ individual write enable signals can be used to control whether each of the $n_e$ bits is written individually. If this is not supported natively by a particular hardware RAM implementation, then the write port 1103 can be driven by $n_e$ multiplexers 608, which can be used to multiplex the input bits with feedback from the read port 1101. In this way, the $n_e$ write enable signals can individually control the bits selected by these $n_e$ multiplexers, either writing the new bit value to the RAM, or maintaining the current bit value by writing the corresponding bit obtained from the read port 1101. For the sake of simplicity, this mechanism is not depicted in FIG. 9, although it is shown in FIG. 4.

During the processing of each successive column 702 in the graph from left to right, the roles of the two memory blocks 602, 603 alternate. More specifically, for columns having even indices $c \in \{0, 2, 4, \ldots\}$, bits are read from Memory '0' 602 (or directly from the $n_e$-bit input 605 to the proposed polar encoder kernal 102 in the example of column '0'), provided to the datapath 601 and the resultant bits are written to Memory '1' 603. By contrast, bits are read from Memory '1' 603, provided to the datapath 601 and the resultant bits are written to Memory '0' 602 in the example of columns having odd indices $c \in \{1, 3, 5, \ldots\}$. In this way, the memory block that was written to during the processing of a particular column 702 is read from during the processing of the next column. This alternated operation of the two memory blocks 602, 603 may be achieved by multiplexing 609 the read data ports of the RAMs in Memory '0' 602 with those of the corresponding RAMs in Memory '1' 603. Likewise, the write enable signals 608 of the RAMs in Memory '0' may be shared with those of the corresponding RAMs in Memory '1', but masked alternately. For the sake of simplicity, these mechanisms are not depicted in FIG. 9, although they are shown in FIG. 4.

The interfaces between the memory blocks 602, 603 and the datapath 601 are designed specifically to avoid the requirement for complicated routing networks, which would be required to allow any bit in the memory blocks 602, 603 to be read or written by any of the inputs or outputs of the datapath 601. Instead, the arrangement of the bits in the memory block is designed such that only simple routing networks are required between the memory blocks 602, 603 and the datapath 601. Likewise, it is designed so that only a limited number of control signals are required from the controller 604.

This is achieved by carefully arranging the bits within the three dimensions of the memory blocks 602, 603 in a manner that is sympathetic to the specific data dependencies of a polar encoder kernal. This is necessary because owing to the different arrangement of XORs in each column, consecutive columns in the polar code graph must be decomposed into sub-graphs having different arrangements, as exemplified in FIG. 5. As a result, the bits that the datapath 601 writes at the same time during the processing of the sub-graphs in one column will not be read by the datapath 601 at the same time when processing the sub-graphs in the next column. However, irrespective of this, the proposed arrangement of bits in the memory block allows the datapath 601 to seamlessly read the input bits that it requires at the same time, as well as to seamlessly write the output bits that it generates at the same time.

More specifically, the address ports of the $2^{s_o}$ RAMs within a particular memory block 602, 603 are all tied together, only requiring the controller 604 to generate a single address for each of the memory blocks 602, 603. Furthermore, the bit input 1002 on the left-hand edge of the datapath 601 reads from the memory blocks 602, 603 on a simple width-wise basis, as detailed below. By contrast, the bit output 1003 on the right-hand edge of the datapath 601 writes to the memory blocks 602, 603 on a simple RAM-wise basis, as detailed below. In an alternative example arrangement, the width-wise bit memory accesses may be replaced with RAM-wise accesses and vice-versa, although this would imply different datapath interfaces and controller designs to those described below.

For both width-wise and RAM-wise interfaces between a memory block 602, 603 and the datapath 601, the bit having the position $l \in [0, n_e-1]$ in the input 1002 or output 1003 of the datapath 601 is read from or written to a particular position within the width of a particular address within the depth of a particular one of the RAMs in the memory block. This location in the memory block 602, 603 may be identified by the width coordinate $w_l \in [0, n_e-1]$ the depth coordinate $d_l \in [0, \max(N_{max}/(2^{s_o}n_e), 1)-1]$ and the RAM coordinate $r_l \in [0, 2^{s_o}-1]$. As mentioned above, the arrangement of the bits in each memory block 602, 603 and the operation of the proposed polar encoder kernal 102 is such that the address ports of the $2^{s_o}$ RAMs within a particular bit memory block 602, 603 can all be tied together. This implies that, for both width-wise and RAM-wise interfaces, all $n_e$ of the bits that are accessed together will each have the same depth coordinate, which is to say that $d_l$ has the same value for all $l \in [0, n_e-1]$. Furthermore, the bit in the width-wise datapath input 1002 having the position $l \in [0, n_c-1]$ only ever reads from locations in the memory block 602, 603 having the corresponding width coordinate $w_l = l$. However, this bit in the datapath interface may need to read from any of the possible RAM coordinates $r_l \in [0, 2^{s_o}-1]$ at different times during the polar encoding process. Owing to this, a $2^{s_c}$: 1 multiplexer 1104 is advantageously the only circuitry required to provide the $l^{th}$ bit to the width-wise datapath input 1002. More specifically, this multiplexer 1104 selects between the bits provided by the $l^{th}$ position in the read ports 1101 of each of the $2^{s_o}$ RAMs, as shown in FIG. 9. Here, the controller 604 is required to provide $n_e$ RAM read coordinates to the memory block, which may be decoded in order to provide separate control signals to each of these $n_e$ multiplexers 1104.

Furthermore, the bit having the position $l \in [0, n_e-1]$ in the RAM-wise output 1003 of the datapath is only ever written to locations in the memory block 602, 603 having the corresponding RAM coordinate $r_l = \mod(l, 2^{s_o})$. However, this bit may need to be written to any of the possible width coordinates $w_l \in [0, n_e-1]$ at different times during the polar encoding process. Owing to this, a $n_e/2^{s_o}$:1 multiplexer 1105 is advantageously the only circuitry required to provide each of the $n_e$ inputs to each of the RAMs' $2^{s_o}$ write ports 1103, as shown in FIG. 9. This is because each input of the RAM having the RAM coordinate $r_l$ is only selected from the sub-set of datapath output bits 1003 having positions $l \in [0, n_e-1]$ that satisfy $\mod(l, 2^{s_o}) = r_l$. Here, the controller 604 is required to provide $n_e$ width write coordinates to the memory block 602, 603, which may be decoded to assert $n_e$ of the write enable signals 607, as well as to provide control signals for the corresponding sub-set of $n_e$ multiplexers 1105.

Following the completion of the decoding process, the memory block 602, 603 that was written to most recently is read over a series of steps by the bit output 606 of the proposed polar encoder kernal 102, which has a width of $n_e$ bits. However, these read operations are not performed width-wise in the general case, where the number of stages in the graph $n = \log 2(N)$ is not divisible by the number of stages in the datapath $s_e$. For this reason, in some examples, a permutation network 1106 is provided to interface the memory blocks 602, 603 with the bit output 606 of the proposed polar encoder kernal 102, as shown in FIG. 9.

Encoder Controller Example:

As described above in FIG. 7, the proposed polar encoding process comprises a total of:

$T = \sum_{c=0}^{C-1} N/n_c = \lceil \log_2(\max(N, n_e))/s_e \rceil N/\min(N, n_e)$ steps. Here, the processing of the sub-graphs 701 within each successive column 702 are completed, before advancing to the next column in order, from left to right. The controller 604 of FIG. 4 includes a counter t, which adopts the logic value '0' at the start of the encoding process and increments towards T−1 in each successive step. As described above, each step of the proposed polar encoding process involves reading $n_e$ bits from one memory block 602, 603 or from the bit input 605 to the proposed polar encoder kernal 102, processing them in the datapath 601 and then writing the resultant $n_e$ bits to the other memory block, where the roles of the two memory blocks 602, 603 alternate in successive columns 702. The controller 604 is designed such that regardless of which column 702 in the graph is being processed, each memory read operation seamlessly provides a set of $n_e$ bits that may be combined by the datapath 601, in order to complete a set of XOR operations according to the connections in the graph. Furthermore, the controller 604 is designed such that each memory write operation seamlessly arranges the resulting set of $n_e$ bits in the memory blocks 602, 603, so that they can be seamlessly read in the fashion described above when the processing advances to the next column 702. During the first $N/\min(N, n_e)$ steps of the encoding process, the processing is performed concurrently with the loading of the kernal information block $u = [u_j]_{j=0}^{N-1}$ 105 from the input 605 to the polar encoder kernal 102, which has a width of $n_e$ bits. In the example where $N < n_e$, zero-valued bits are appended to the end of the kernal information block 105 before it is provided to the proposed polar encoder kernal 102, in order to increase its length to $n_e$. Following this, the bit input of the proposed polar encoder kernal 102 provides $n_e$ bits in each step, in order of increasing bit index 'j'. More specifically, during the step in the loading process having the index $t \in [0, N/\min(N, n_e)-1]$, the bit provided to the position $l \in [0, n_e-1]$ in the input to the proposed polar encoder kernal 102 is $u_{tn_e + l}$. During the first $N/\min(N, n_e)$ steps of the encoding process, these bits are provided directly to the corresponding bit inputs 1002 of the datapath 601, as shown in FIG. 4. After the first $N/\min(N, n_e)$ steps in the encoding process, the input 1002 to the datapath 601 is loaded from one or other of the memory blocks 602, 603. During the step in the encoding process having the index $t \in [N/\min(N, n_e), \lceil \log_2(\max(N, n_e))/s_e \rceil N/\min(N, n_e)-1]$, the bit that is provided to the position $l \in [0, n_e-1]$ in the input 1002 to the datapath 601 is read from the depth $d_l$, RAM $r_l$ and width $w_l$ coordinates of the corresponding memory block, according to:

$$d_l = \mod\left(t, \max\left(\frac{N}{2^{s_e} n_e}, 1\right)\right)$$

$$r_l = \mod\left(\left\lfloor \frac{(tn_e + l)2^{s_e}}{\max(N, n_e)} \right\rfloor, 2^{s_e}\right),$$

$$w_l = l$$

Here, it may be observed that the width coordinates $w_l = l$ that the datapath input bits 1002 are read from are independent of the step index t and may therefore be hardwired according to the width-wise operation. By contrast, the depth $d_l$ and RAM $r_l$ coordinates must be controlled by the controller 604, as a function of the step index t. Note that the depth coordinates dl are independent of the bit index l, only requiring the controller 604 to provide a single read address, which is shared by all RAMs in the memory block 602, 603. However, the RAM coordinates $r_l$ are dependent on the bit index I, requiring the controller 604 to generate a separate control signal for each of the $n_e$ bits.

During the step in the polar encoding process having the index:

$t \in [0, \lceil \log_2(\max(N, n_e))/s_e \rceil N/\min(N, n_e)-1]$, the bit that is provided by the position $l \in [0, n_e-1]$ in the output 1003 of the datapath 601 is written to the depth $d_l$ and RAM $r_l$ and width $w_l$ coordinates of the corresponding memory block 602, 603, according to:

$$d_l = \mod\left(\left\lfloor \frac{t}{2^{s_e}} \right\rfloor, \max\left(\frac{N}{2^{s_e}n_e}, 1\right)\right),$$

$$r_l = \mod(l, 2^{s_e}),$$

$$\omega_l = \mod\left(\frac{l\max(N, n_e)}{2^{s_e}} + \mod\left(\left\lfloor \frac{m_e + l}{2^{s_e}} \right\rfloor, \frac{\max(N, n_e)}{2^{s_e}}\right), n_e\right).$$

Here, it may be observed that the RAM coordinates $r_l=\mod(l, 2^{s_e})$ that the datapath output bits 1003 are written to are independent of the step index t and may therefore be hardwired according to the RAM-wise operation. By contrast, the depth $d_l$ and width $w_l$ coordinates must be controlled by the controller 604, as a function of the step index t. Note that the depth coordinates $d_l$ are independent of the bit index l only requiring the controller 604 to provide a single write address, which is shared by all RAMs in the memory block 602, 603. However, the width coordinates $w_l$ are dependent on the bit index l, requiring the controller 604 to generate a separate control signal for each of the $n_c$ bits. As shown in FIG. 7, a further $N/(\min(N, n_e)$ steps are used following the completion of the polar encoding process, in order to read encoded bits from the appropriate memory block 602, 603 and provide them to the output 606 of the polar encoder kernel 102, which has a width of $n_e$ bits. Collectively, these bits form the kernel encoded block $x=[x_j]_{j=0}^{N-1}$ 106, where zero-valued bits may be removed from the end of the output 606 of the polar encoder kernel 102 in the example where $N<n_e$. In this example, the counter t is reset to a logic '0' value at the start of the outputting process and is incremented towards $N/\min(N, n_e)-1$ in each successive step.

During the $t^{th}$ step in the outputting process, the bit that is provided to the position $l \in [0, n_e-1]$ in the output 606 of the proposed polar encoder kernel 102 is read from the depth $d_l$, RAM $r_l$ and width $w_l$ coordinates of the corresponding memory block 602, 603, according to:

$$d_l = \mod\left(\left\lfloor \frac{t}{\alpha} \right\rfloor, \max\left(\frac{N}{2^{s_e}n_e}, 1\right)\right),$$

$$r_l = \mod\left(\left\lfloor \frac{t2^{s_e}\max(N, n_e) + l2^{s_e} + m_e 2^{s_e}}{\max(N, n_e)\alpha} \right\rfloor, 2^{s_e}\right),$$

$$\omega_l = \mod\left(\frac{l\max(N, n_e)}{\alpha} + \left\lfloor \frac{l + m_e}{\alpha} \right\rfloor, n_e\right),$$

where $\alpha = 2^{\mod(-\log_2(\max(N, n_e)), s_e)}$. Here, it may be observed that the depth $d_l$, RAM $r_l$ and width $w_l$ coordinates must be controlled by the controller 604, as a function of the step index t. Note that the depth coordinates $d_l$ are independent of the bit index l, only requiring the controller 604 to provide a single write address, which is shared by all RAMs in the memory block 602, 603. However, the RAM $r_l$ and width $w_l$ coordinates are dependent on the bit index l, requiring the controller 604 to generate separate control signals for each of the $n_e$ bits.

The above-described method of controlling both memory read and memory write operations results in a characteristic arrangement of bits within the memory blocks 602, 603. FIGS. 10 to 13 provide various examples of this characteristic arrangement, before and after the processing of each column 702 in the polar code graph. Each FIG. illustrates the index $j \in [0, N-1]$ of the connection between two adjacent columns 702 in the polar graph that provides the bit stored at each RAM, depth and width coordinate in the memory block 602, 603.

Figure 10:
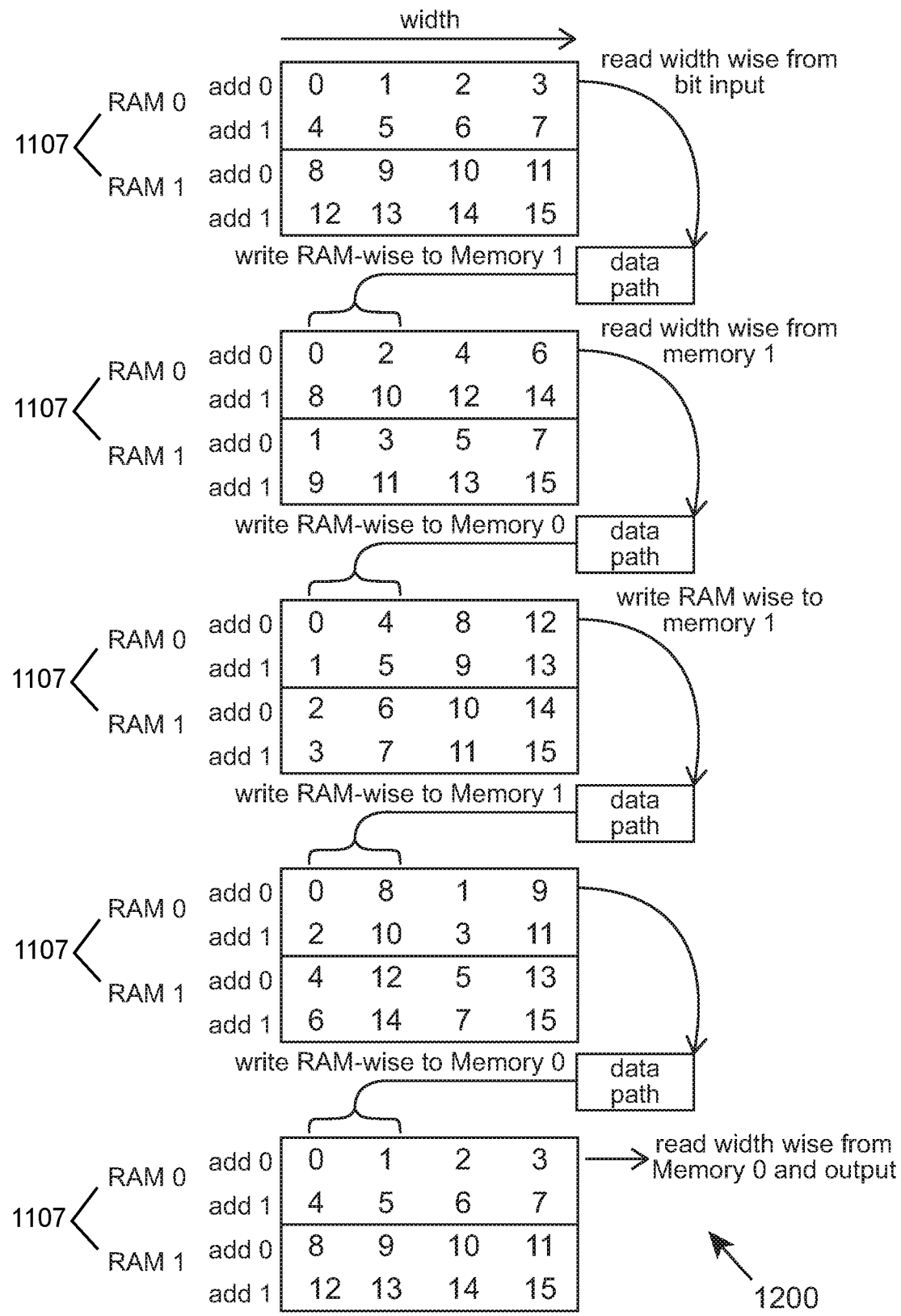
FIG. 10 illustrates an example mapping of bit indices to positions in the memory blocks in the case where N=16, $s_e$=1 and $n_e$=4, according to example embodiments of the proposed polar encoder kernal.

Referring now to FIG. 10 an example mapping 1200 of bit indices to positions in the memory blocks 602, 603 using a depth comprising multiple addresses in the example where $N > 2^{s_e}n_e$ and in particular where $N=16$, $s_e=1$ and $n_e=4$ is illustrated according to examples of the invention. Here, each memory block 602, 603 comprises $2^{s_e}=2$ RAMs, each having a depth of: $\max(N/2^{s_e}n_e, 1)=2$ address and a width of $n_e=4$ bits. A total of $T=\lceil \log_2(\max(N, n_e))/s_e \rceil N/\min(n, n_e)=16$ steps are required to complete the processing and a further $N/\min(N, n_e)=4$ steps are required to output the encoded bits. Here, it may be seen that each read operation is performed width-wise and each write operation is performed RAM-wise, as described above. In the particular example of FIG. 10, the number of stages $n=\log 2 (N)$ in the polar code graph is divisible by the number of stages in the datapath $s_e$. Owing to this, the outputting process may read the encoded bits from the corresponding memory block 602, 603 in a width-wise manner. More specifically, it may be observed that $$\omega_l = \mod\left(\frac{l\max(N, n_e)}{\alpha} + \left\lfloor \frac{l + m_e}{\alpha} \right\rfloor, n_e\right)$$

simplifies to $w_l=l$ in this example.

Figure 11:
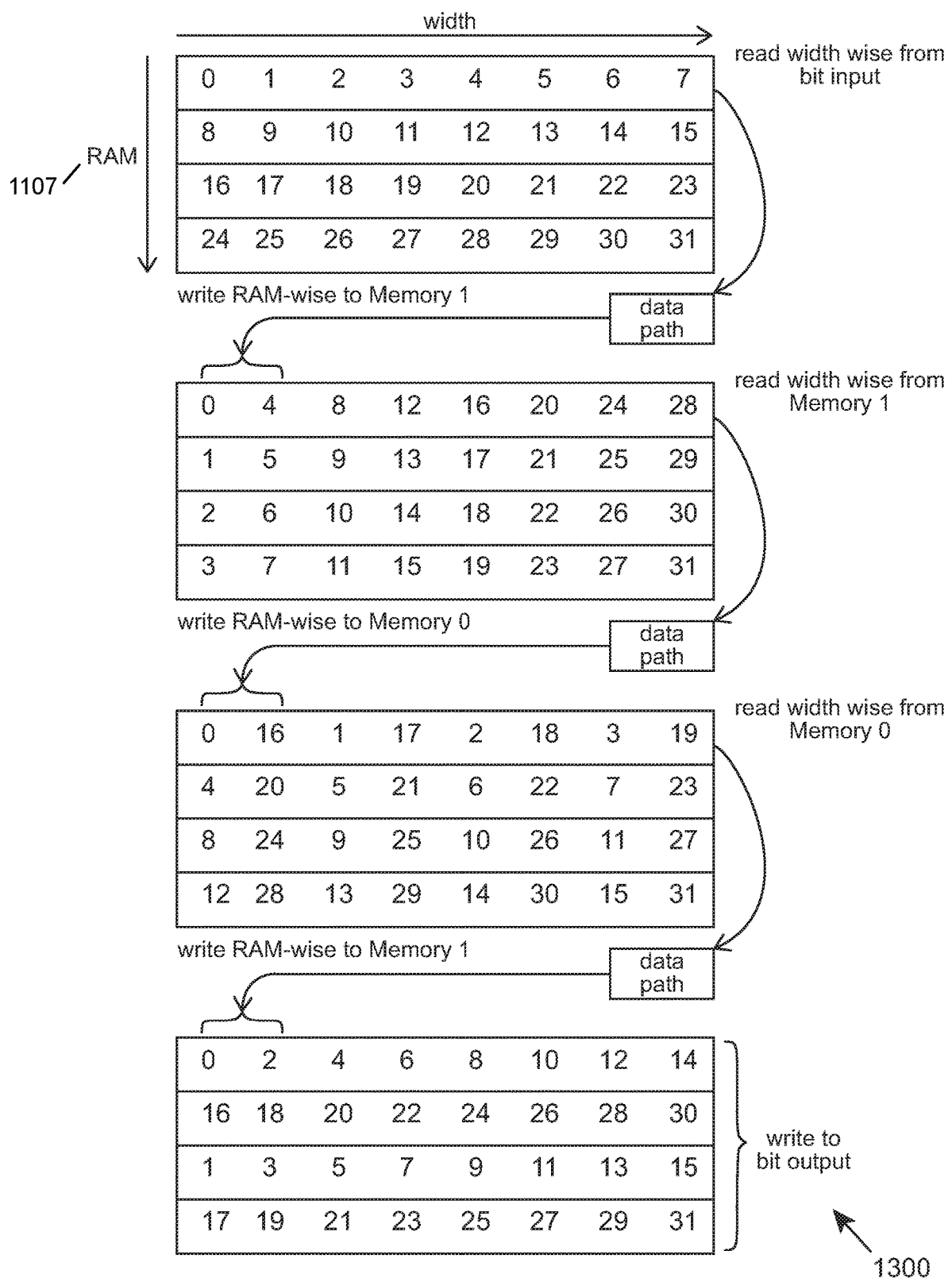
FIG. 11 illustrates an example mapping of bit indices to positions in the memory blocks in the case where N=32, $s_e$=2 and $n_e$=8, according to example embodiments of the proposed polar encoder kernal.

Referring now to FIG. 11, an example mapping 1300 of bit indices to positions in the memory blocks 602, 603 in the example where $N=32$, $s_e=2$ and $n_e=8$ is illustrated according to examples of the invention. Here, each memory block 602, 603 comprises $2^{s_e}=4$ RAMs, each having a depth of max $(N/(2^{s_e}n_e), 1)=1$ address and a width of $n_e=8$ bits. A total of $T=\lceil \log_2(\max(N, n_e))/s_e \rceil N/\min(N, n_e)=12$ steps are required to complete the processing and a further $N/\min(N, n_e)=4$ steps are required to output the encoded bits. FIG. 11 corresponds to the example provided in FIG. 5. In this example, $N=2^{s_e}n_e$ and so each memory block 602, 603 uses a depth of only a single address. In this particular example, the width-wise reading and the RAM-wise writing of the memory block bits corresponds to reordering the indices in successive matrices of FIG. 11 from a row-first, column-second ordering to a column-first, row-second ordering. Here, it may be observed that the highlighting of the first sub-graph in each column of FIG. 5 corresponds to the first set of $n_e$ bits that are processed by the datapath 601 in each of the three columns 702, namely [0 1 2 3 4 5 6 7], [0 4 8 12 16 20 24 28] and [0 16 1 17 2 18 3 19], respectively. This illustrates how the RAM-wise writing of bits seamless enables the width-wise reading of bits to naturally provide the correct combination of bits for the next operation of the datapath 601. Note that since n is not divisible by $S_e$ in this example, the outputting process cannot be completed in a purely width-wise manner.

Figure 12:
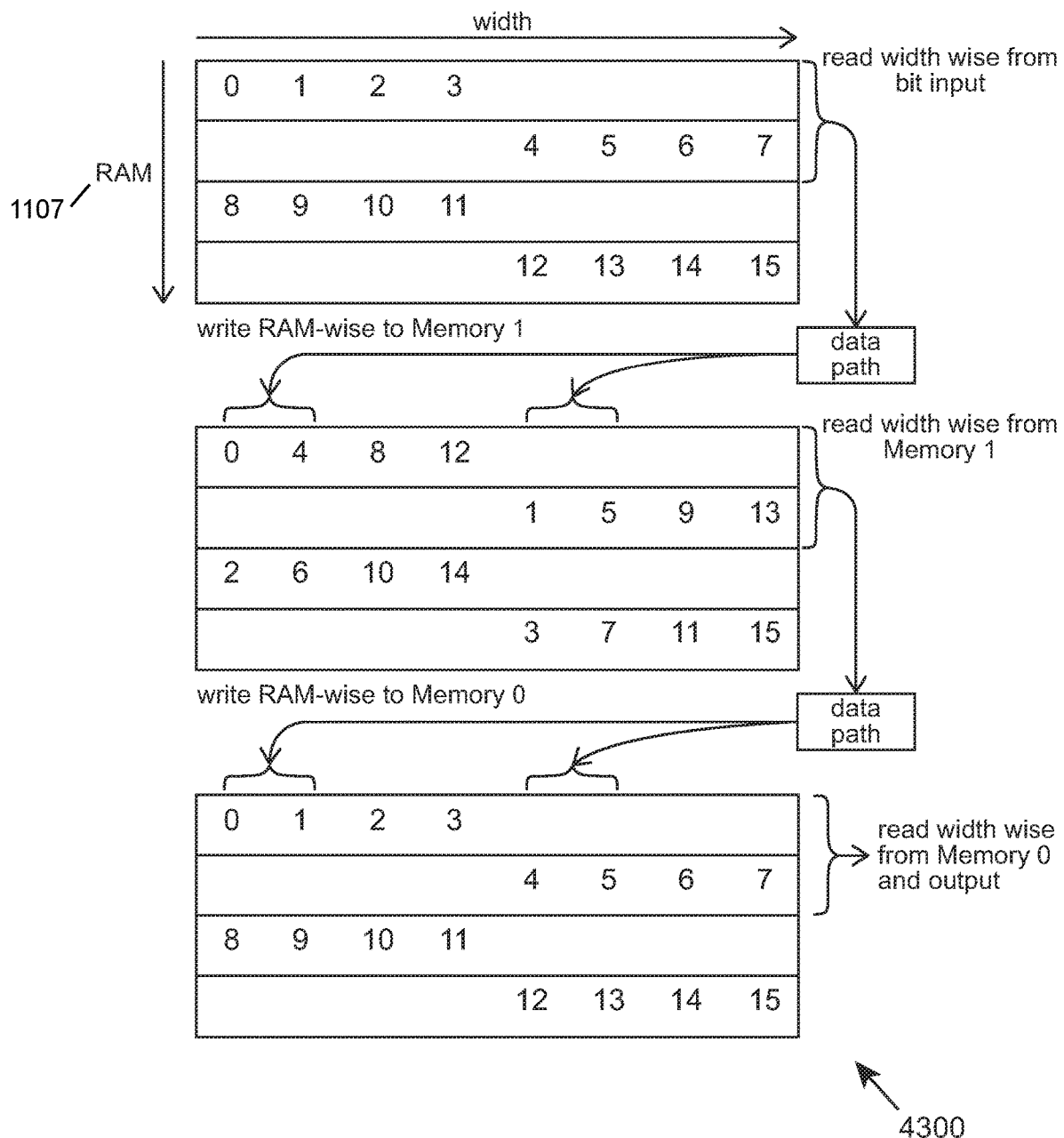
FIG. 12 illustrates an example mapping of bit indices to positions in the memory blocks in the case where N=16, $s_e=2$ and $n_e=8$, according to example embodiments of the proposed polar encoder kernal.

Referring now to FIG. 12, an example mapping 4300 of bit indices to positions in the memory blocks 602, 603 in the example where $N<2^{s_e}n_e$, and in particular where $N=16$, $s_e=2$ and $n_e=8$ is illustrated according to examples of the invention. Here, each memory block 602, 603 requires a depth of only a single address, but the kernal block length N is not sufficient to fill the capacity of this single address in all RAMs of the memory block 602, 603. Thus, each memory block 602, 603 comprises $2^{s_e}=4$ RAMs, each having a depth of $\max(N/2^{s_e}n_e, 1)=1$ address and a width of $n_e=8$ bits. A total of $T=\lceil \log_2(\max(N, n_e))/s_e \rceil N/\min(N, n_e)=4$ steps are required to complete the processing and a further $N/\min(N, n_e)=2$ steps are required to output the encoded bits. In this example, the width-wise read and RAM-wise write operations naturally result in a diagonal arrangement of bits within the memory block 602, 603, as illustrated.

Figure 13:
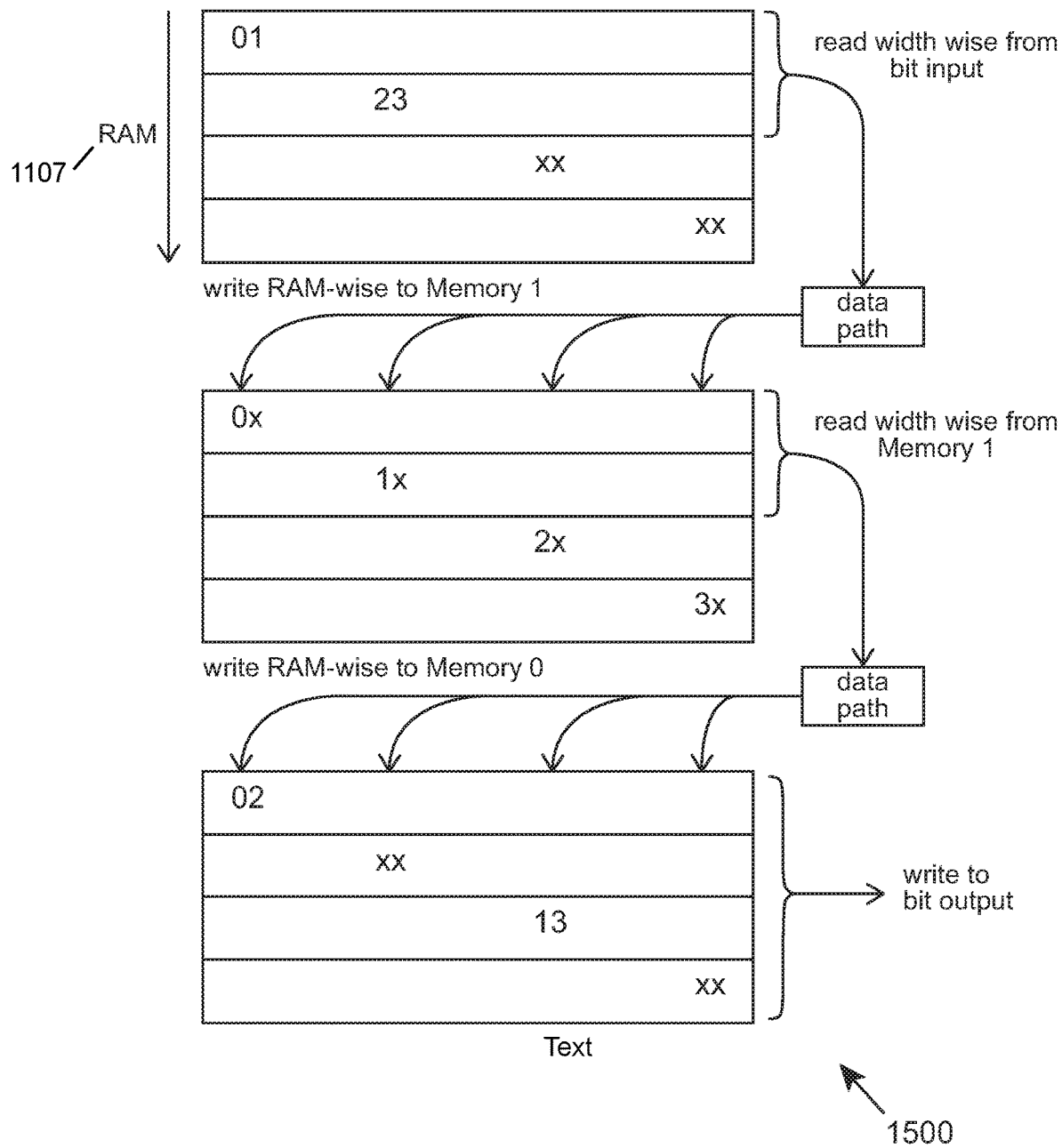
FIG. 13 illustrates an example mapping of bit indices to positions in the memory blocks in the case where N=4, $s_e=2$ and $n_e=8$, according to example embodiments of the proposed polar encoder kernal.

Referring now to FIG. 13, an example mapping 1500 of bit indices to positions in the memory blocks 602, 603 in the example where N=4, $s_e$=2 and $n_e$=8 is illustrated according to examples of the invention. Here, each memory block 602, 603 comprises $2^{s_o}$=4 RAMs, each having a depth of max (N/($2^{s_o}n_e$), 1)=1 address and a width of $n_e$=8 bits. A total of T=⌈$\log_2$(max(N, $n_e$))/$s_e$⌉N/min(N, $n_e$)=2 steps are required to complete the processing and a further N/min(N, $n_e$)=1 step is required to output the encoded bits.

Proposed Polar Decoder Kernal

Figure 16:
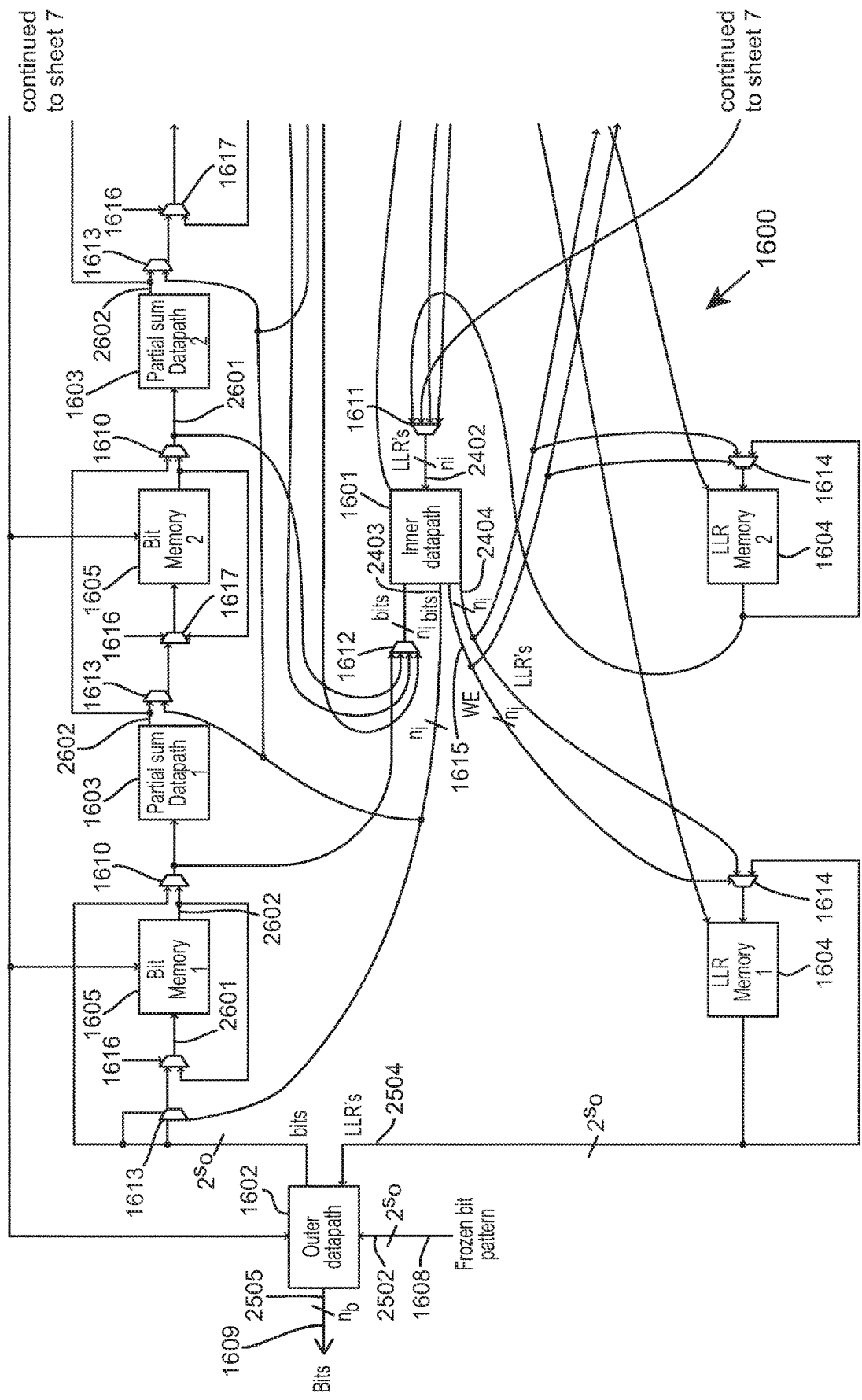
FIG. 16 illustrates an example schematic of the proposed polar decoder kernal for the case where $C_{max}=5$, according to example embodiments of the invention.
Figure 16:
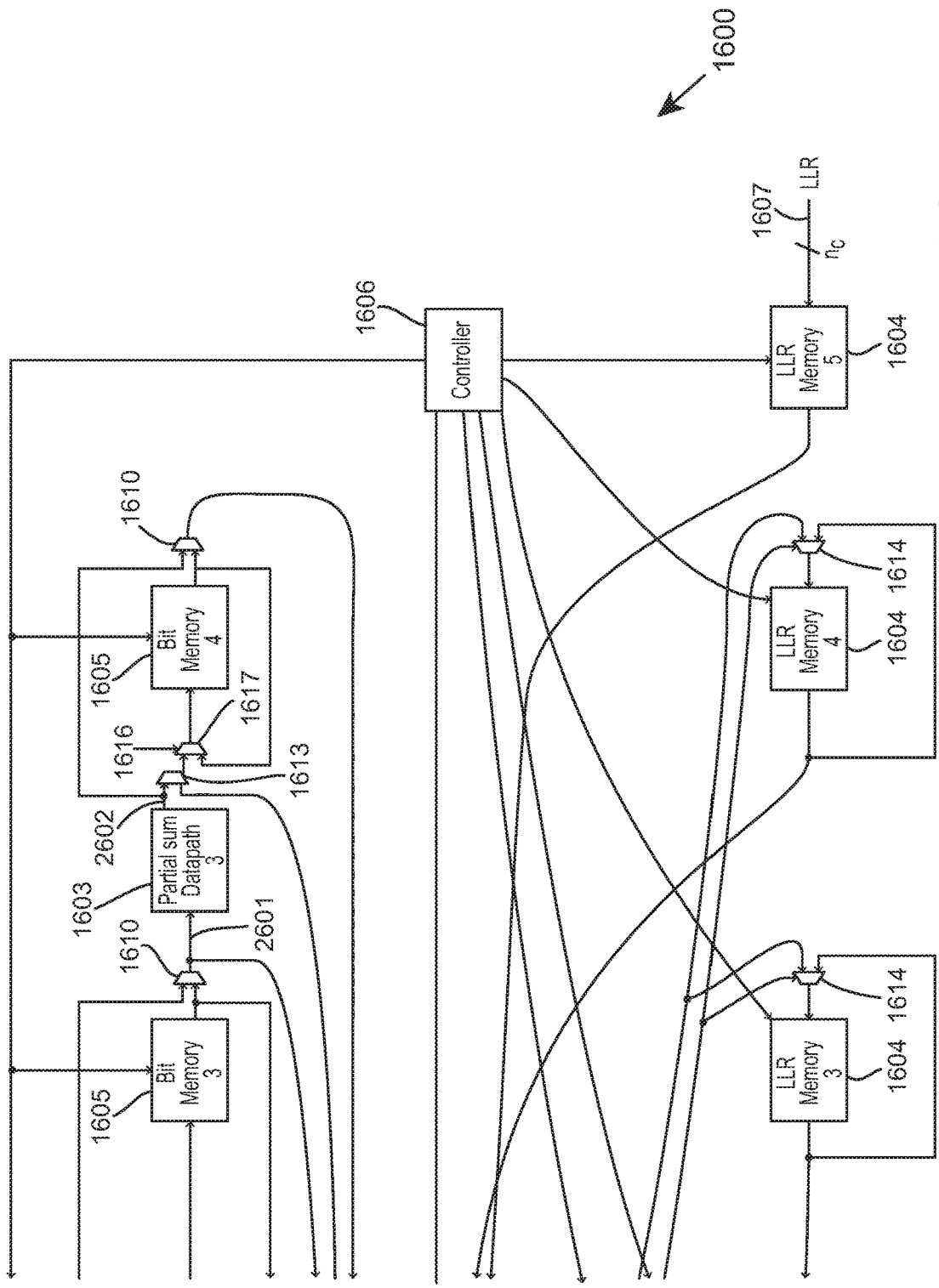

Referring now to FIG. 16, an example schematic of the proposed polar decoder kernal 1600 is illustrated for the case where $C_{max}$=5, according to example embodiments of the invention. The proposed polar decoder kernal 111 comprises datapath 1601, 1602, 1603, memory 1604, 1605, and controller 1606 components. More specifically, an inner datapath 1601, an outer datapath 1602 and $C_{max}$-2 replicas of the partial sum datapath 1603 are employed. Furthermore, $C_{max}$-1 bit memory blocks 1605 are employed, together with $C_{max}$ LLR memory blocks 1604. In contrast to known processor architectures for implementing a decoder, examples of the present invention can flexibly group all stages in the polar code graph into a number of columns in the range 1 to $C_{max}$, depending on the kernal block size N at run-time, where in some examples $C_{max}$ may be selected at design time. By contrast, some prior art always uses a fixed number of columns that does not vary with kernal block size, whilst some prior art can only group the left-most stages into a column, with the requirement for all other stages to remain individual.

In this way, examples of the present invention accrue the advantage of using columns, which is that the number of steps required to complete the polar decoding process is reduced. Examples of the present invention also retain the flexibility to support long kernal block sizes N, without the requirement for columns having excessive widths and therefore hardware requirements. Likewise, some examples of the present invention retain the flexibility to support short kernal block sizes N, whilst retaining high utility of the inner datapath hardware, and therefore maintaining hardware efficiency.

More specifically, rather than processing one stage of the polar code graph at a time, the proposed architecture achieves a higher degree of parallelism by processing the several consecutive stages within each column at once. This parallel processing can be fully exploited throughout the majority of the f and g computations, achieving greater hardware utility than line and semi-parallel architectures. Furthermore, since several consecutive stages are processed at once, memory is only required at the interfaces between each pair of consecutive groupings of stages, rather than at the interfaces between each pair of consecutive individual stages. This significantly reduces the overall memory requirement of the proposed architecture relative to previous implementations, which is particularly impactful since memory is the biggest contributor to hardware resource usage. Finally, a simple mechanism for propagating partial sum bits is proposed, which is also impactful since partial sum propagation is the second biggest contributor to hardware resource usage in previous implementations.

More specifically, under the control of the controller 1606, each of the inner datapath 1601, the outer datapath 1602 and the partial sum datapaths 1603 may be directed to process one sub-row of one row of one column in each step of the polar encoder kernal operation. Here, the inputs to the datapath 1601, 1602 or 1603 are read from the LLR and/or bit memory blocks 1604 and 1605 that reside at the appropriate interface on one or other edge on either side of the current column, depending on whether information is propagating from left-to-right or right-to-left in the polar code graph. Likewise, the outputs of the datapath 1601, 1602 or 1603 are written to the LLR and/or bit memory blocks 1604 and 1605 that reside at the appropriate interface on either side of the current column, depending on the direction of information flow. In this way, bits or LLRs can be passed between processing performed in adjacent columns by reading and writing to the same memory block 1604 or 1605.

The LLRs and bits are arranged within these memory blocks 602, 603 in a manner that allows the datapaths 1601, 1602 or 1603 to perform seamless read and write operations, without the requirement for complex interconnection networks or complex control signals.

Architecture

The proposed polar decoder kernal 111 enables the flexible decoding of one recovered kernal information block 114 at a time, where successive recovered kernal information blocks can have kernal block sizes N that can vary from block to block.

More specifically, the kernal block size N can adopt the value of any power of two between 2 and $N_{max}$, where $N_{max}$ is a parameter that is fixed at design time. At the start 1801 of the polar decoding process, the soft kernal encoded block $\tilde{x}=[\tilde{x}_j]_{j=0}^{N-1}$ 113 is loaded 1802 into the LLR input 1607 of the polar decoder kernal 111, over a series of N/min(N, $n_l$) consecutive steps. The LLR input 1607 has a width that can accept $n_l$ LLRs in each step, where the parameter $n_l$ is fixed at design time. Here, each LLR may be represented using a two's complement fixed-point number, having a bit width that is fixed at design time. In the case where N<$n_l$, an equal number of zero-valued LLRs are inserted after each LLR in the soft kernal encoded block 113, in order to increase its length to $n_l$ before it is provided to the proposed polar decoder kernal 111. During the polar decoding process, the redundant bit patterns and the corresponding redundant bit values are provided to corresponding inputs 1608 of the proposed polar decoder kernal 111. Each of these inputs has a width that can accept $2^{s_o}$ pattern bits or redundant bits in each step, which are provided to the proposed polar decoder kernal 111 using an on-demand basis, according to the needs of the polar decoding process. In the case where N<$2^{s_o}$, asserted frozen bit flags are appended to the frozen bit pattern, in order to increase its length to $2^{s_o}$.

Following the completion of the polar decoding process, a series of N/min(N, $n_b$) consecutive steps is used to output 1803 the recovered kernal information block $\hat{u}=[\hat{u}_j]_{j=0}^{N-1}$ 114 on the bit output 1609 of the proposed polar decoder kernal 111, which has a width of $n_b$ bits. In the case where N<$n_e$, zero-valued bits may be removed from the end of the output 1609 of the proposed polar decoder kernal 111. When decoding a soft kernal encoded block 113 having a block size of N, one described example of the proposed polar decoder kernal 111 operates on the basis of a graph representation 201, 202, 203 of the polar code generator matrix $F^{\otimes n}$. Here, the n=log 2(N) stages 207 within the graph 201, 202, 203 are grouped into a number C of columns 1701, 1702, where each column comprises a particular number of consecutive stages 207. Each column 1701, 1702 may be referred to by its index c∈[0, C-1], where the left-most column 1701 has the index c=0 and the right-most column has the index c=C-1. The number of stages in each column 1701, 1702 may be expressed using the row vector $s=[s_c]_{c=0}^{C-1}$, where $s_0$ is the number of stages in the left-most column 1701 and $s_{C-1}$ is the number of stages in the right-most column. Here, s must be chosen such that $\Sigma_{c=0}^{C-1} s_c = n$. This is exemplified in FIG. 17 for the case where the graph representation 1700 of the generator matrix $F^{\otimes 6}$ is grouped into C=4 columns 1701, 1702, comprising s=[1; 2; 2; 1] stages 207. In the proposed polar decoder kernal 111, the left-most column with the index c=0 is referred to as the outer column 1701, while the other columns having the indices $c \in [1, C-1]$ are referred to as the set of inner columns 1702. The particular number of stages in each column 1701,1702 is selected depending on the kernal block size N, as well as the parameters $s_o$ and $s_i$, which are fixed at design time. Here, $s_o$ specifies the maximum number of stages that may be accommodated in the outer column 1701, which can adopt any value in the range '0' to $n_{max} = \log_2(N_{max})$. Meanwhile $s_i$ specifies the maximum number of stages that may be accommodated in each inner column 1702, which can adopt any value in the range 1 to $n_{max} - s_o$. If the number of stages in the graph n=log 2(N) satisfies $n \leq s_o$, then the graph 201, 202, 203 is decomposed into only C=1 column, namely the outer column 1701, which will comprise $s_o = n$ stages 207. Otherwise, the graph 201, 202, 203 is decomposed into $C=\lceil (n-s_o)/s_i \rceil + 1$ number of columns, where the outer column 1701 comprises $s_0 = s_o$ stages 207, the right-most inner column 1702 comprises $s_{C-1} = n - s_o - (C-2) s_i$ stages 207 and all other inner columns 1702 comprise $s_c = s_i$ stages 207. This is exemplified in FIG. 17, where s=[1; 2; 2; 1] results from $s_o = 1$ and $s_i = 2$ in the case where the graph 201, 202, 203 comprises n=6 stages 207. Note that in alternative arrangements, the $n-s_o$ right-most stages 207 could be distributed among the C-1 inner columns 1702 using any other combination that satisfies $s_c \leq s_i$ for all $c \in [1, C-1]$, although this requires modifications to the design described throughout this section.

Note that if the maximum number of stages in the graph $n_{max} = \log_2(N_{max})$ satisfies $n_{max} = s_o$, then the graph 201, 202, 203 will always be decomposed into only $C_{max} = 1$ column 1701, comprising a maximum of $s_{0, max} = n_{max}$ stages 207. Otherwise, the graph 201, 202, 203 is decomposed into a maximum of $C_{max} = \lceil (n_{max} - s_o)/s_i \rceil + 1$ number of columns 1701, 1702, where the outer column 1701 comprises a maximum of $s_{0, max} = s_o$ stages 207, the right-most inner column 1702 comprises a maximum of $s_{C-1, max} = n_{max} - s_o - (C_{max} - 2) s_i$ stages 207 and all other inner columns 1702 comprise a maximum of $s_{c, max} = s_i$ stages 207. The set of columns 1701, 1702 is associated with a vector of sub-code radixes $r = [r_c]_{c=0}^{C-1}$, where each sub-code radix is given by:

$$r_c = 2^{\sum_{c'=0}^{c} s_{c'}}.$$

Here, the sub-code radix $r_c$ of a particular column 1701, 1702 quantifies the kernal block size N that would result if the graph 201, 202, 203 comprised only the stages 207 in that column and in the columns to its left. Note that the sub-code radix $r_c$ of each successive column 1701, 1702 grows from left to right. The corresponding maximum sub-code radixes are given by:

$$r_{c,max} = 2^{\sum_{c'=0}^{c} s_{c', max}}.$$

Each column 1701, 1702 comprises a number of rows, which may be expressed using the vector $R = [R_c]_{c=0}^{C-1}$, where the number of rows in a particular column is given by $R_c = N/r_c$ Here, each row 1703 comprises a sub-graph comprising $s_c$ stages 207 and $r_c$ consecutive connections on its left and right edges, which are horizontally-aligned. It may be observed in FIG. 17 that the row definition given above results in there being no interconnections between any pair of rows 1703 within any particular column 1701, 1702. Each row 1703 of each column 1701, 1702 may be visited one or more times by the polar decoding process, in order to perform XOR operations, or f and g functions, for example. More specifically, processing associated with particular rows in particular columns may be performed on more than one temporally-separated occasion during the polar decoding process, where each set of temporally-separated processing may be referred to as a 'visit' to the row. However, the visits to the rows 1703 in columns 1701, 1702 to the right of the graph 201, 202, 203 involve more computations than the visits within columns to the left of the graph, since the number of connections within the rows 1703 of each column $r_c$ grows from left to right. However, it may be observed in FIG. 17 that the rows 1703 in the right-most columns may be decomposed into sub-rows 1704, which have no connections between each other. Owing to this, the computations associated with a particular visit to a row 1703 at a particular time during the polar decoding process may be spread over several consecutive steps, each of which performs computations 1804, 1805, 1806 for a different sub-row 1704 in the row 1703. In this way, the polar decoding process is completed one step at a time, where each step may correspond to one or more hardware clock cycles, depending on if and how pipelining is employed. By using more sub-rows 1704 per row 1703 in the columns 1702 to the right of the graph 201, 202, 203, the number of computations performed in each step of the decoding process can be maintained at a relatively constant level, irrespective of which column is being visited. Formally, the number of sub-rows that comprise each row 1703 of each column 1701, 1702 may be expressed using the vector $S = [S_c]_{c=0}^{C-1}$. Here $S_c$ must be a power of two and must not exceed $r_c/2^{s_c}$ in order to ensure that there are no connections between sub-rows 1704. Note that this implies that the rows 1703 in the outer column 1701 cannot be further decomposed into sub-rows 1704. Each sub-row 1704 comprises a sub-graph comprising $s_c$ stages 207 and $n_c = r_c/S_c$ horizontally-aligned connections on its left and right edges, which are vertically offset from each other by $r_c/n_c$ positions. Here, $n_c$ is referred to as the block size of the sub-row 1704, which must be a power of two in the range $[2^{s_c}, r_c]$. In the proposed polar decoder kernal 111, the particular block size of the sub-rows 1704 in each inner column 1702 is selected as $n_c = \min(r_c, n_i)$. Here, $n_i$ specifies the maximum inner sub-row block size, which is a parameter that is fixed at design time and which can adopt the value of any power of two in the range $2^{s_i}$ to $N_{max}$. Each row 1703 of each column 1701, 1702 is enclosed in a dashed box. The first sub-row 1704 in the first row 1703 of each column 1701, 1702 is highlighted in bold.

Figure 17:
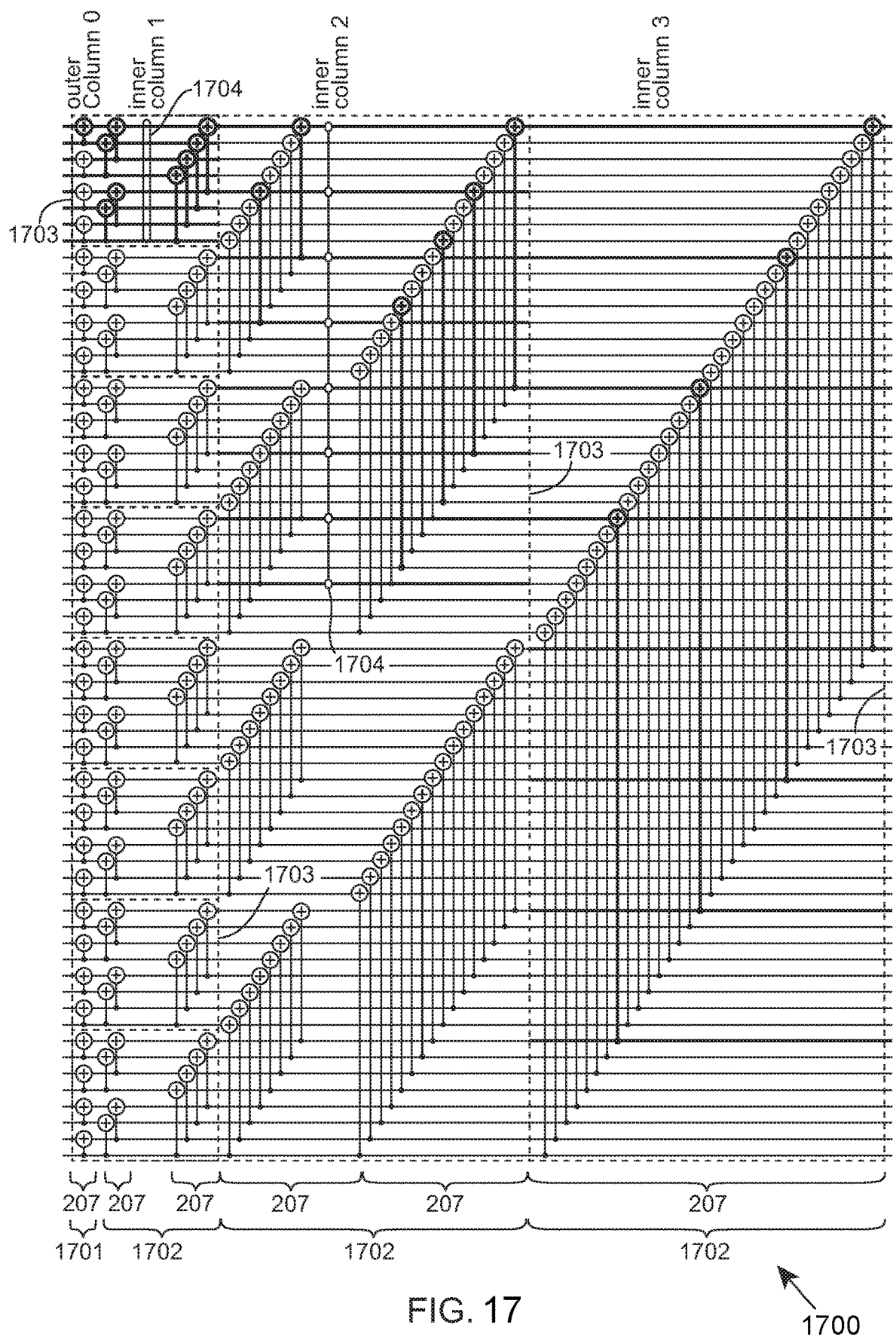
FIG. 17 illustrates an example graphical representation of the generator matrix $F^{\oplus 6}$, which has been grouped into C=4 columns comprising s=[1; 2; 2; 1] stages, and which correspond to $s_o=1$ and $s_i=2$, according to example embodiments of the proposed polar decoder kernal.

This is exemplified in FIG. 17, where S=[1; 1; 4; 8] results from $n_i = 8$ in the case where the graph 201, 202, 203 comprises n=6 stages 207.

Figure 18:
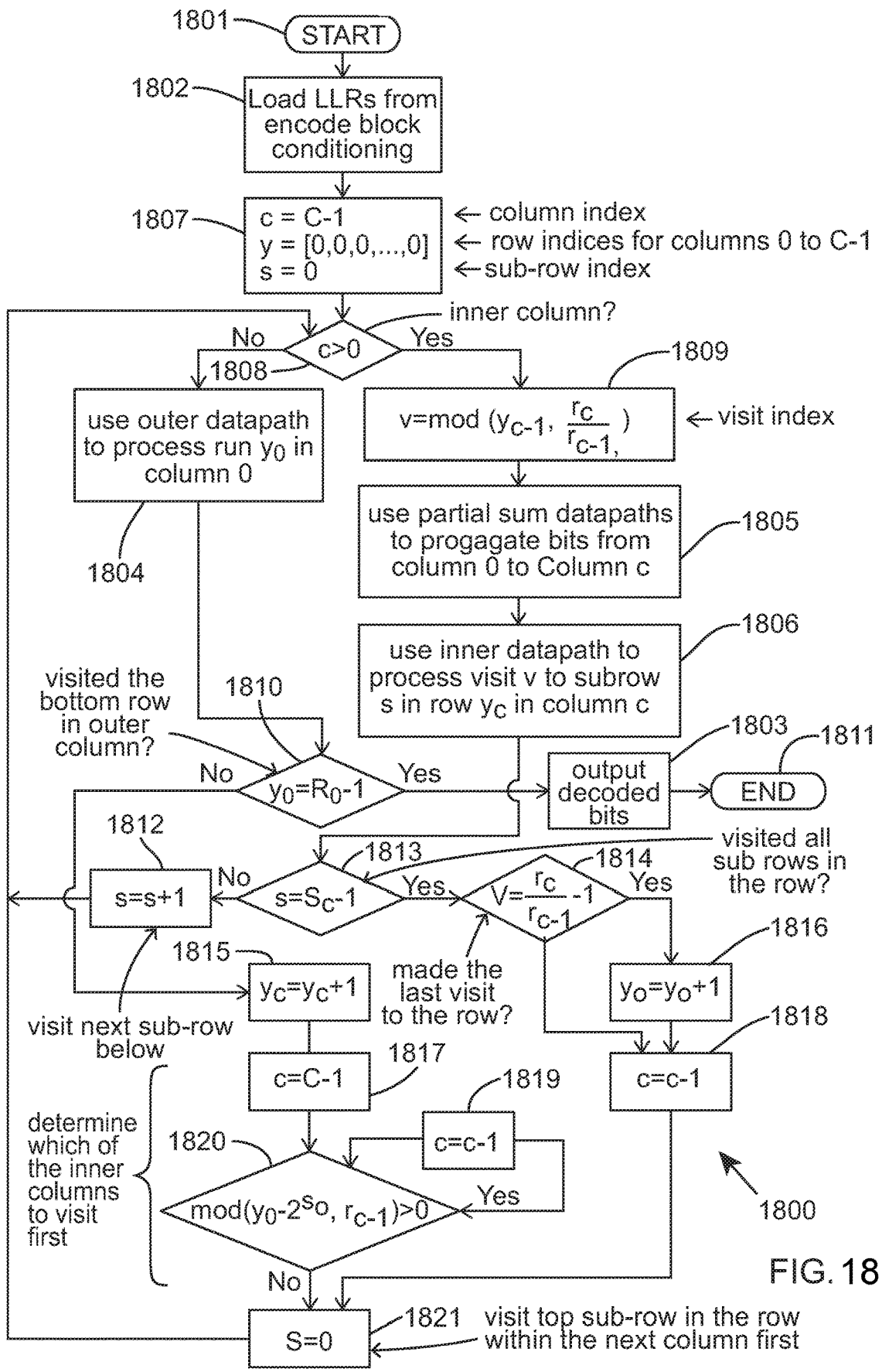
FIG. 18 illustrates an example flowchart of a decoding process employed by the proposed polar decoder kernal, whereby each cycle around the main loop of the flowchart corresponds to one step of the decoding process, according to example embodiments of the invention.

FIG. 18 illustrates an example flowchart 1800 of a decoding process employed by the proposed polar decoder kernal, whereby each cycle around the main loop of the flowchart corresponds to one step of the decoding process, according to example embodiments of the invention. The flowchart starts at 1801 and, at 1802, the LLRs of the soft kernal encoded block 113 are loaded into the proposed polar encoder kernal 111. At 1807, the current column index c is initialised as c=C−1, the current row indices y are initialised as a zero-valued vector of length C and the current sub-row index s is initialised as 0.

At 1808, the determination c>0 is used to identify if the current column is an inner column. If so, then the flowchart proceeds to 1809, where v=mod($y_{c-1}$, $r_c/r_{c-1}$) is determined to identify the index of the current visit to the current sub-row in the current row of the current column. Following this, at 1805, the partial sum datapaths 1 to c are used to propagate propagate partial sum bits from column 0 to the current column. Following this, at 1806, the inner datapath is used to process the current visit to the current sub-row in the current row of the current column. At 1813, the determination s=$S_c$−1 is used to determine if the visit with index v has now been made to all sub-rows in the current row. If not, then the sub-row index s is incremented at 1812, so that the next sub-row will be visited next. The flowchart then returns to 1808, to continue processing the sub-rows in the current row of the current inner column.

By contrast, if it was determined at 1813 that the visit with index v has now been made to all sub-rows in the current row of the current inner column, then the flowchart proceeds to 1814. Here, the determination v=$r_c/r_{c-1}$−1 is used to determine if the last visit has now been made to all sub-rows in the current row of the current inner column. If not then the flow chart proceeds to 1818, or if so then the flowchart first proceeds to 1816, before advancing to 1818. At 1816, the row index for the current column is incremented, so that when the current inner column is visited again later in the polar decoding process, it will be the next row down that will be visited. At 1818, the current column index c is decremented, so that the column to the left will be visited next, be it the outer column or another of the inner columns. At 1821, the sub-row index s is reset to 0, so that the next visit to a row in an inner column will start with its top sub-row. Following this, the flow chart returns to 1808.

If, at 1808, the determination c>0 identifies that the current column is the outer column, then the flowchart proceeds to 1804. Here, the outer datapath is used to process the current row $y_0$ in the outer column. Following this, the determination $y_0$=$R_0$−1 is used at 1810 to determine if the bottom row in the outer column has been visited. If not, then the flowchart proceeds to 1815, where the row index for the outer column is incremented, so that when the outer column is visited again later in the polar decoding process, it will be the next row down that will be visited. Next, a process is used in 1817, 1820 and 1819 to determine which of the inner columns should be visited next. In 1817, the column index c is initialised to that of the right-most inner column C−1. In 1819, c is continually decremented, until mod($y_0 2^{s_o}$, $r_{c-1}$)=0 at 1820. Following this, the flowchart proceeds to 1821, where the sub-row index s is reset to 0, before the flow chart returns to 1808.

By contrast, if it was determined at 1810 that the bottom row in the outer column has been visited, then the recovered kernel information block 114 is output from the proposed polar decoder kernal 111 and the process ends at 1811.

In some examples, the proposed polar decoder kernal 111 completes the decoding process in accordance with the data dependencies. As the decoding process proceeds, computations are performed for different rows 1703 in different columns 1701, 1702, according to a particular schedule, as illustrated in the flowchart of FIG. 18. Each row 1703 in the outer column 1701 will be visited once by the process, while each row 1703 of each particular inner column 1702 will be visited $2^{s_c}$ times by the process, where $s_c$ is the number of stages in that column. The decoding process begins by passing the LLRs of the soft kernal encoded block x̃ 113 to the single row 1703 in the right-most column. The decoding process then uses the f function of (1) or (2) to perform calculations upon these LLRs during a first visit to this single row 1703 in the right-most column. Whenever a visit to a row 1703 in an inner column 1702 has been completed, it will pass the resultant LLRs to one of the connected rows 1703 in the column to the left, where the particular row 1703 is selected as the top-most one that has not been visited yet. The decoding process will then use the f function of (1) or (2) to perform calculations upon these LLRs during a first visit to this row 1703 in the column to the left. Whenever a visit 1804 to a row 1703 in the outer column 1701 has been completed, it will contribute bits to the recovered kernal information block û 114. Following this, the partial sum equations of (4) and (5) will be used to pass 1805 partial sum bits from this row 1703 in the outer column 1701 to the left-most inner column 1702 having a horizontally-aligned row 1703 where fewer than $2^{s_c}$ visits have been completed so far. At the same time, the decoding process will perform a visit to this row 1703, in which the g function of (3) is used to combine these bits with the LLRs that were provided at the start of the first visit to the row 1703. Note that each visit to a row 1703 in an inner column 1702 may be performed spread over a number of consecutive steps of the decoding process, where each step 1806 operates on a different one of the sub-rows 1704 in the row 1703. Here, the sub-rows 1704 may be processed in any order, although the flowchart 1800 of FIG. 18 illustrates the case where they are processed from top to bottom. Here, the partial sum bits are propagated 1805 from the outer column 1701 to the sub-row 1704 in the inner column 1702 within the same step where they are used by the g function of (3), as discussed below. Note that this same approach may be used for both the SC and the SCL decoding processes. In the case of SCL decoding, each visit to each sub-row 1704 uses parallel processing to simultaneously perform the computations associated with all L candidate kernal information blocks in the list. To elaborate further, rather than operating on individual bits and LLRs, the processing resources associated with the visits to each sub-row can be replicated L times, so that they can operate in parallel on vectors comprising L bits or LLRs, where each of the L bits or LLRs in the vectors corresponds to a different one of the L candidate kernal information blocks.

Figure 19:
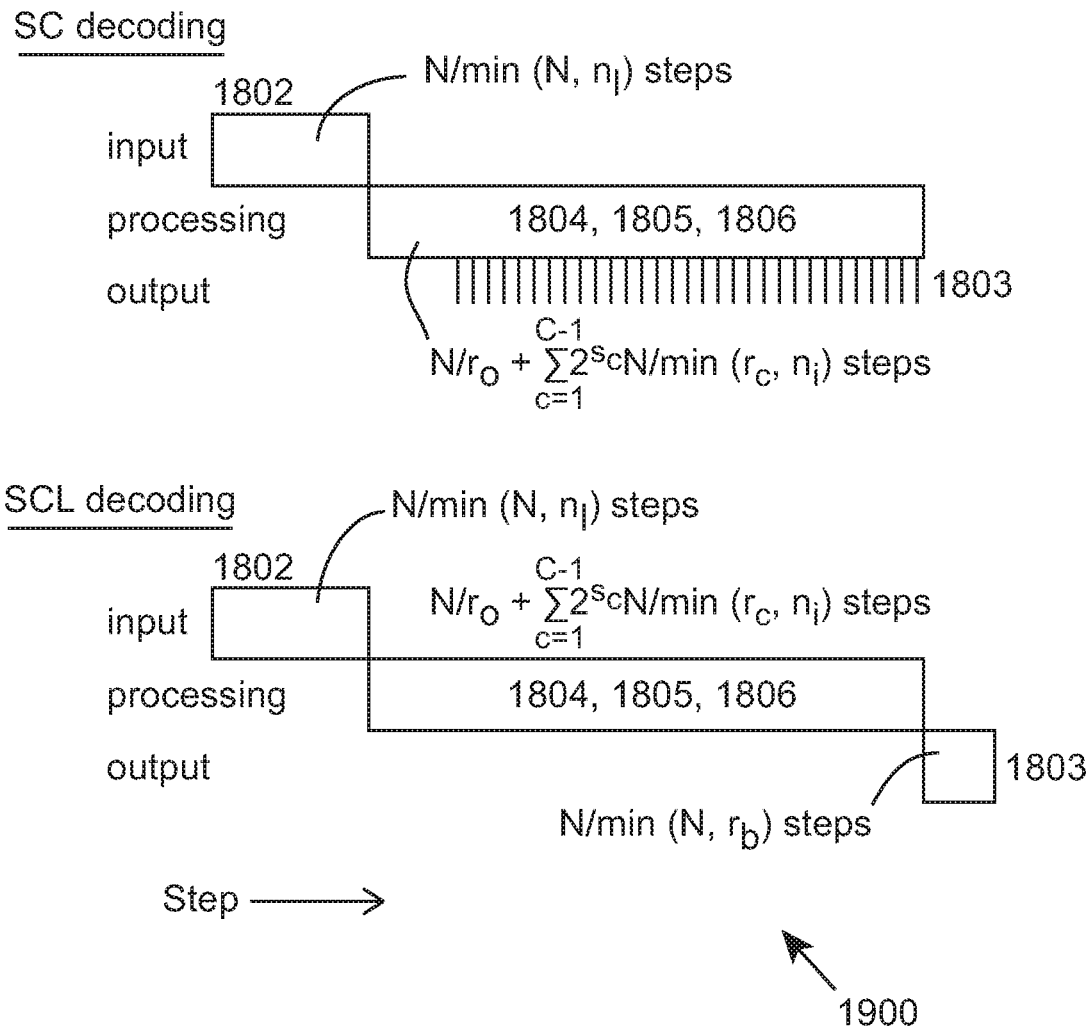
FIG. 19 illustrates an example timing diagram for the proposed polar decoder kernal, according to example embodiments of the invention.

FIG. 19 illustrates an example timing diagram 1900 for the proposed polar decoder kernal, according to example embodiments of the invention.

Figure 20:
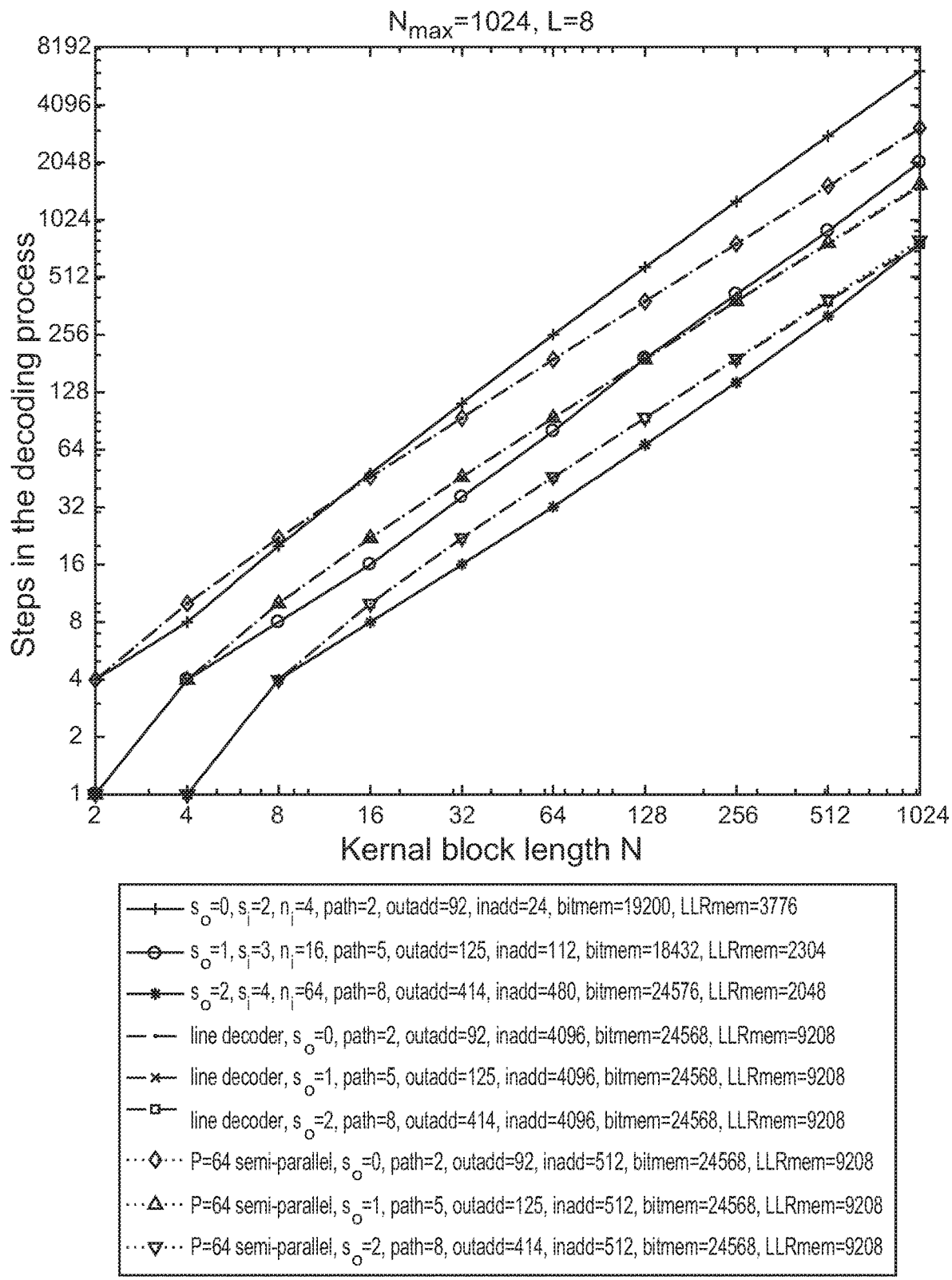
FIG. 20 illustrates an example plot of a number of steps required by the decoding process of the proposed polar decoder kernal, according to example embodiments of the invention.

As shown in FIG. 19, the total number of steps required to complete the decoding process may be obtained by combining the number of visits made to each row 1703 in each column 1701, 1702 with the number of sub-rows 1704 in each column, giving a total of $N/r_0 + \sum_{c=1}^{C-1} 2^{s_c} N/\min(r_c, n_i)$ steps, as plotted in FIG. 20.

FIG. 20 illustrates an example plot 2000 of a number of steps required by the decoding process of the proposed polar decoder kernal, according to example embodiments of the invention. It plots the number of steps required by the decoding process of the proposed polar decoder kernal 111, as functions of the kernal block length N, the number of stages $s_o$ in the outer datapath 1602, the number of stages $s_i$ in the inner datapath 1601 and the block size $n_i$ of the inner datapath. For the case of L=8 list decoding and for each combination of $s_o$, $s_i$ and $n_i$, 'path' quantifies the number of fixed-point adders in the critical datapath length, 'outadd' quantifies the number of fixed-point adders that must be laid out in the outer datapath 1602, 'inadd' quantifies the number of fixed-point adders that must be laid out in the inner datapath 1601. Furthermore, for the case of $N_{max}$=1024, 'LLRmem' quantifies the required LLR memory 1604 capacity in LLRs, while 'bitmem' quantifies the required bit memory 1605 capacity in bits, including the memory for the candidate kernal information blocks obtained by the outer datapath 1602.

Note that a further N/min(N, $n_t$) steps are required to load 1802 the LLRs of the soft kernal encoded block 113 into the proposed polar decoder kernal 111, before the decoding process can begin. Note that in an alternative example arrangement, the processing of the right-most column 1702 may begin towards the end of the loading 1802 of the soft kernal encoded block 113, thereby allowing some concurrency to be achieved, subject to a modification to the illustrated design. In the case of SC decoding, the recovered kernel information block 114 can be output 1803 from the proposed polar decoder kernal 111 concurrently with the processing of the outer column 1701 in the graph 201, 202, 203, $n_b$=$2^{s_o}$ bits at a time, albeit sporadically according to when the outer column 1701 is visited 1804 by the decoding process. However, in the case of SCL decoding, the outputting 1803 of the recovered kernal information block 114 cannot begin until after all processing has been completed and the best among the L candidate kernal information blocks has been selected. In this case, a further N/min(N, $n_b$) steps are required to output 1803 the recovered kernal information block 114. Each step may correspond to a single clock cycle in a hardware implementation, depending on if and how pipelining is applied.

The number of steps used by three parameterisations of the proposed polar decoder kernal is plotted as a function of the kernal block length N in FIG. 20. The legend of this figure also quantifies the computation and memory resources used by each parameterisation, as will be detailed in the following sections. As may be expected, fewer steps are used by parameterisations having more stages $s_i$ in the outer datapath 1602, more stages $s_i$ in the inner datapath 1601 and greater inner datapath block sizes $n_i$. Although the datapaths of these faster parameterisations use more computation resources with longer critical paths, they tend to use less memory resources, since they use fewer columns. FIG. 10 compares the proposed polar decoder kernal with the line decoder of [14] and the semi-parallel decoder of [15], which have been parameterised to use the multi-bit technique of [26] to recover $2^{s_o}$ kernal information bits at a time. As shown in FIG. 10, the proposed polar decoder having the parameter $s_o$=2 completes the decoding process using fewer steps than the benchmarkers employing the same value of $s_o$=2. Furthermore, it uses fewer computation resources and it uses less than 25% of the amount of LLR memory. Furthermore, the proposed polar decoder kernal employs an elegant method for partial sum propagation, which has a small hardware overhead. Since LLR memory and the partial sum propagation are the two biggest contributors to hardware resource usage, it may be expected that the hardware efficiency of the proposed polar decoder may be four to five times better than that of state-of-the-art polar decoders.

This proposed approach can be considered to employ a conventional polar code graph 201, 202, 203 as the basis of LLR propagation using the f and g functions of (1)-(3). However, a novel rearrangement of the polar code graph 201, 202, 203 is employed as the basis of bit propagation 1805 using the partial sum equations of (4) and (5).

Figure 21:
FIG. 21 illustrates an example rearranged graphical representation of the generator matrix $F^{\oplus 6}$, for the case of employing C=4 columns comprising s=[1; 2; 2; 1] stages, according to example embodiments of the proposed polar decoder kernal.

FIG. 21 illustrates an example rearranged graphical representation 2100 of the generator matrix $F^{\otimes 6}$, for the case of employing C=4 columns comprising s=[1; 2; 2; 1] stages, according to example embodiments of the invention.

This rearranged graph is exemplified in FIG. 21, for an example where the graph 201, 202, 203 representation of the generator matrix $F^{\otimes 6}$ has been decomposed into C=4 columns comprising s=[1; 2; 2; 1] stages 207. Here, it may be observed that the bottom $r_{c-1}$ XORs in each stage 207 of each row 1703 of the inner columns 1702 have been removed, where $r_{c-1}$ is the sub-code radix of the column to the left, as defined above. Instead, XORs 2101 have been introduced at the interface between each inner column 1702 and the column to its right. More specifically, each of the top $r_c - r_{c-1}$ bits that are passed from each row 1703 of each inner column 1702 to the column to its right is XORed 2101 with a particular one of the bottom $r_{c-1}$ bits that are passed from that row 1703. Here, the particular bit is identified such that both bits in each XORed pair have the same index modulo $r_{c-1}$, where each bit index will be in the range 0 to N−1 before the modulo operation and 0 to $r_c$−1 after the modulo operation.

As shown in FIG. 16, the proposed polar decoder kernal 111 comprises inner datapath 1601, outer datapath 1602, partial sum datapath 1603, LLR memory block 1604, bit memory block 1605 and controller 1606 components. More specifically, while the proposed polar decoder kernal 111 comprises only a single instance of the outer datapath 1602 and inner datapath 1601, it comprises $C_{max}$−2 instances of the partial sum datapath 1603, $C_{max}$−1 instances of the bit memory block 1605 and $C_{max}$ instances of the LLR memory block 1604. Here, the outer datapath 1602 is interfaced with the bit output of the polar decoder kernal 111 and can be considered to reside within the outer column 1701, which has the index c=0. Meanwhile, the inner datapath 1601 can be considered to reside within different inner columns 1702 having different indices c∈[1, C−1] during different steps of the decoding process. Furthermore, the partial sum datapath 1603 with the index c∈[1, C−2] can be considered to reside within the inner column 1702 of the polar code graph 201, 202, 203 having the corresponding index c.

Furthermore, an inner column 1702 having the index c∈[1, C−2] can be considered to interface with the column to its left via the bit memory block 1605 and LLR memory block 1604 having the index c, as well as to interface with the column to its right via the bit memory block 1605 and LLR memory block 1604 having the index c+1. Furthermore the right-most column 1702 having the index C−1 can be considered to interface with the LLR input 1607 of the proposed polar decoder kernal 111 via the LLR memory block 1604 having the index $C_{max}$. As shown in FIG. 16, the outer datapath 1602, the bit memory blocks 1605 and the partial sum datapaths 1603 form a chain, which represent the C columns 1701, 1702 in the polar code graph 201, 202, 203. The inner datapath 1601 can take inputs from and provide outputs to different points in this chain, as the decoding process visits different inner columns 1702 in the graph 201, 202, 203. FIG. 16 also illustrates, in some example embodiments, a mechanism for bypassing 1610 the bit memory blocks 1605 in this chain. This is the mechanism alluded to above, which allows bits to propagate 1805 from the outer datapath 1602, through successive partial sum datapaths 1603 and into the inner datapath 1601 within a single step of the decoding process, irrespective of which inner column 1702 is being visited. Note that in the case of SCL decoding in some examples, the datapaths 1601, 1602, 1603 and memories 1604, 1605 have sufficient resources to perform the computation for all L candidate kernal information blocks in parallel. To elaborate further, rather than operating on individual bits or LLRs, the resources of the datapaths and memories can be replicated L times, so that they can operate in parallel on vectors comprising L bits or LLRs, where each of the L bits or LLRs in the vectors corresponds to a different one of the L candidate kernal information blocks.

The proposed polar decoder kernal 111 has significant differences to all previously proposed approaches to polar decoding. The programmable architecture of [10], [11] adopts a serial approach, which performs the computations associated with a single f or g function in each step, using a schedule that obeys the aforementioned data dependencies. By contrast, the proposed approach performs all computations associated with a sub-row 1704 in each step, resulting in a much higher parallelism, much higher throughput and much lower latency. The unrolled decoder of [12], [13] achieves a very high degree of parallelism by employing a different piece of dedicated hardware for each f or g computation in the polar decoding process. However, each step of a polar decoding process uses the hardware for only a single f or g computation, resulting in a high latency. While this approach can achieve a high throughput by overlapping many decoding processes at once, it suffers from a limited degree of flexibility. By contrast, the proposed approach is fully flexible, since its computation hardware can be reused for each sub-row 1704 in the polar code graph 201, 202, 203, even if they comprise fewer stages 207 or have smaller block sizes than those assumed by the hardware. The line decoder of [14] achieves a high degree of parallel processing, by simultaneously performing all f and g computations associated with the right-most stage 207 of a polar code graph 201, 202, 203 having particular dimensions. However, the aforementioned data dependencies may prevent this parallelism from being fully exploited when processing the other stages 207 in the graph 201, 202, 203. Instead, successively smaller subsets of the hardware may be reused to perform the processing of each successive stage 207 to the left, resulting in a poor hardware efficiency and flexibility. Motivated by this, the semi-parallel decoders of [8], [15]-[24] improve the hardware efficiency and flexibility by reducing the degree of parallel processing, requiring several processing steps to perform the computations for the right-most stages 207, but still suffering from being unable to exploit all parallelism for the left-most stages 207. By contrast, each step of the proposed approach achieves a high degree of parallelism by simultaneously performing computations that span not only up and down the length of each column, but also across the multiplicity of stages 207 in each column 1701, 1702. More specifically, the proposed approach uses a tree-structure to perform the computations for each sub-row 1704, which ensures that the full degree of parallelism is exploited in the typical case, irrespective of which column 1701, 1702 is being visited and irrespective of the graph dimensions. This enables a high degree of flexibility, a high hardware efficiency, a high throughput and a low latency.

While there are several previously proposed approaches to polar decoding that employ the concept of columns 1701, 1702, there are none that apply it in the fully generalised manner of the proposed polar decoder kernal 111, where an arbitrary number of columns 1701, 1702 may be employed, each comprising a potentially different and arbitrary number of stages 207. The tree structures of [14], [25]-[29] operate on the basis of a single column 1701 that comprises all stages 207 in the polar code graph 201, 202, 203, but this approach supports only a single kernal block length and can result in a large hardware resource requirement. The polar code graph 201, 202, 203 is decomposed into two columns 1701, 1702 comprising an equal number of stages 207 in the approach of [30], [31], but again this approach supports only a single kernal block length. By contrast, the approach of [32], [33] uses an outer column 1701 that may comprise several stages 207, but all other stages are processed separately, using the semi-parallel approach described above. In contrast to these approaches, the proposed polar decoder kernel 111 can benefit from the generalised application of columns 1701, 1702, owing to its novel memory architectures. These are necessary because particular groupings of bits and LLRs are written at the same time during the processing of one column 1701, 1702, but different groupings of bits and LLRs are read at the same time during the processing of the adjacent columns 1701, 1702. The proposed memory architectures seamlessly enable read and write operations using these groupings, ensuring that the correct groups of bits and LLRs are elegantly delivered to the right place at the right time. Furthermore, a significant memory reduction is facilitated by the proposed approach, since bits and LLRs are only stored at the boundary between each pair of consecutive columns 1701, 1702, rather than at the greater number of boundaries between each pair of consecutive stages 207.

These same novel memory architectures are also used as the basis of the partial sum propagation 1805 in the proposed polar decoder kernal 111, where a bypass mechanism 1610 is used to pass bits from the outer column 1701 to any of the inner columns 1702 in a single step of the decoding process. This is in contrast to the partial sum propagation methods that have been proposed previously. In [8], [15], [30], partial-sum update logic is used to accumulate different combinations of the decoded bits and a complicated interconnection network is used to deliver them to the processing of the corresponding g functions. This results in a large hardware overhead and a long critical path, which limits the achievable hardware efficiency, throughput and latency. By contrast, the feed-forward architecture of [19], [21], [28], [32], [34] uses dedicated hardware to propagate partial sum bits to each successive stage 207 of the polar code graph 201, 202, 203. However, the complexity of the feed-forward architecture grows rapidly for each successive stage 207, limiting the range of kernal block lengths that can be supported and limiting the hardware efficiency. By contrast, the approach of [17], [22], [27], [35] uses a simplified polar encoder kernal 102 to implement the partial sum, although this does not benefit from reusing calculations that are performed as a natural part of the decoding process, like in the proposed approach.

Datapaths

The proposed polar decoder kernal 111 uses dedicated hardware datapaths 1601, 1602, 1603 to implement the f and g LLR functions of (2) and (3), as well as the partial sum functions of (4) and (5). While the latter may be implemented using networks of XOR gates 204, the f and g functions may be implemented using networks of fixed-point processing units 2201. In some examples, the inner datapath 1601 may perform the computations 1806 associated with one visit to one sub-row 1704 in one row 1703 of one inner column 1702. Likewise, in some examples, the outer datapath 1602 may perform the computations 1804 associated with one row 1703 in the outer column 1701. Finally, in some examples of the partial sum chain described herein, each instance of the partial sum datapath 1603 may be used to propagate 1805 partial sums through one inner column 1702.

Figure 22:
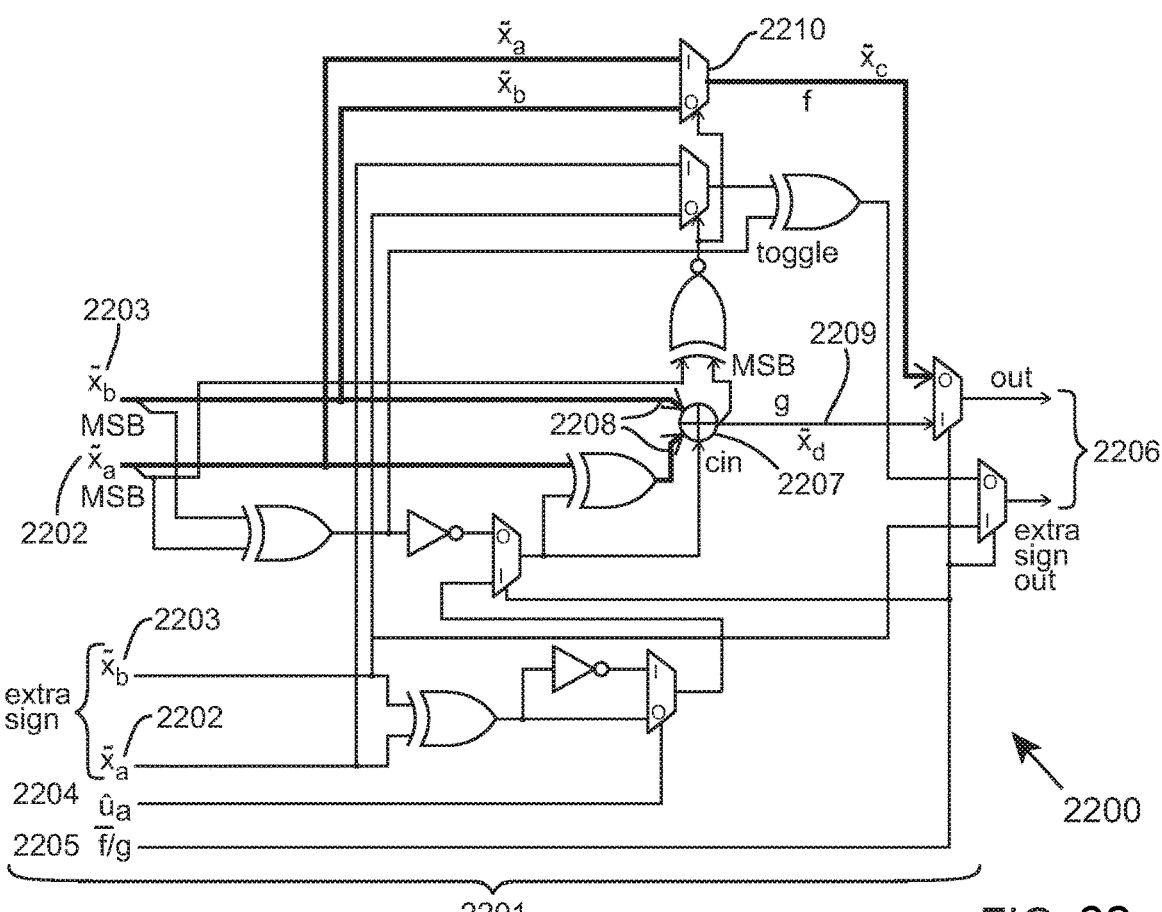
FIG. 22 illustrates an example schematic of a proposed processing unit that can be reconfigured to perform either the 'f' function of (2) or the 'g' function of (3), according to example embodiments of the invention.

FIG. 22 illustrates an examples schematic 2200 of a proposed processing unit 2201 that can be reconfigured to perform either the 'f' function of (2) or the 'g' function of (3), according to example embodiments of the invention.

1) Processing Unit and Fixed-Point Number Representation:

The proposed processing unit 2201 of FIG. 22 accepts two fixed-point input LLRs $\tilde{x}_a$ 2202 and $\tilde{x}_b$ 2203, as well as a bit input $\hat{u}_a$ 2204 and a mode input 2205. Depending on binary value provided by the mode input 2205, the processing unit 2201 combines the other inputs to produce a fixed-point output LLR 2206 $\tilde{x}_c = f(\tilde{x}_a, \tilde{x}_b)$ or $\tilde{x}_d = g(\tilde{x}_a, \tilde{x}_b, \hat{u}_a)$, according to either (2) or (3), as depicted in FIG. 14.

Some previous implementations of polar codes in the literature [10], [13] have used the two's complement fixed point number representation to represent each LLR $\tilde{x}$ as a vector of W bits $[\tilde{x}_w]_{w=1}^W$, where $\tilde{x}_1$ is both the Most Significant Bit (MSB) and the sign bit, $\tilde{x}_W$ is the Least Significant Bit (LSB) and $\tilde{x} = -2^{W-1}\tilde{x}_1 + \Sigma_{w=2}^W 2^{W-w}\tilde{x}_w$. With this approach, the g function of (3) may be implemented using a single adder. Here, subtraction may be implemented when required by complementing all of the bits in the two's complement fixed-point representation of the LLR being subtracted, then adding it to the other LLR, together with an additional '1' using the carry-in input of the full adder circuit. In the f function of (2), it is necessary to negate $\tilde{x}_a$ and $\tilde{x}_b$ if they are negative, in order to determine the absolute values $|\tilde{x}_a|$ and $|\tilde{x}_b|$, respectively.

Figure 23:
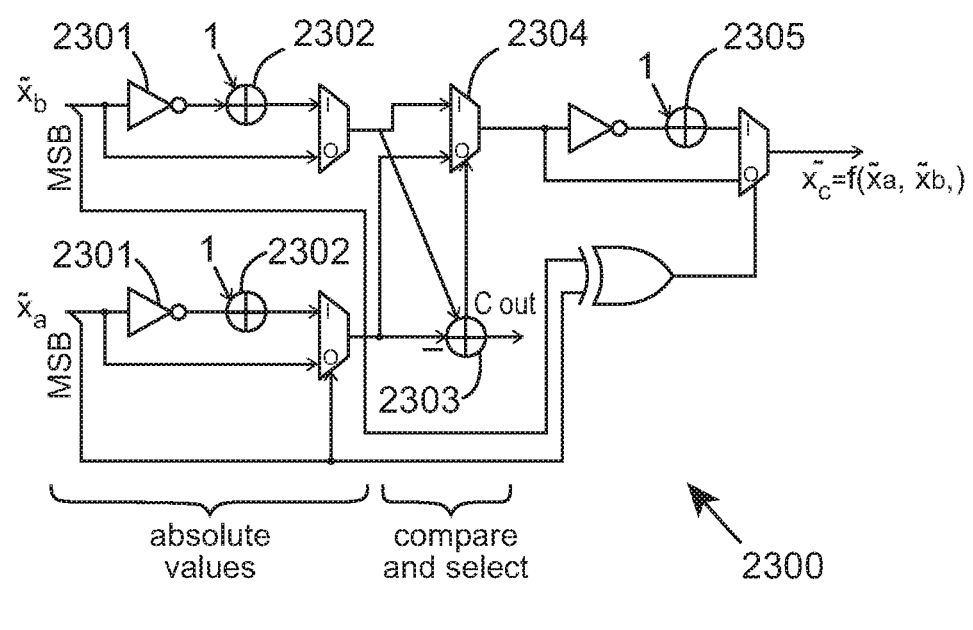
FIG. 23 illustrates an example of the known art on the two's complement implementation of the 'f' function of (2): (a) Naive implementation; (b) A reduced hardware implementation; (c) A reduced critical path implementation.
Figure 23:
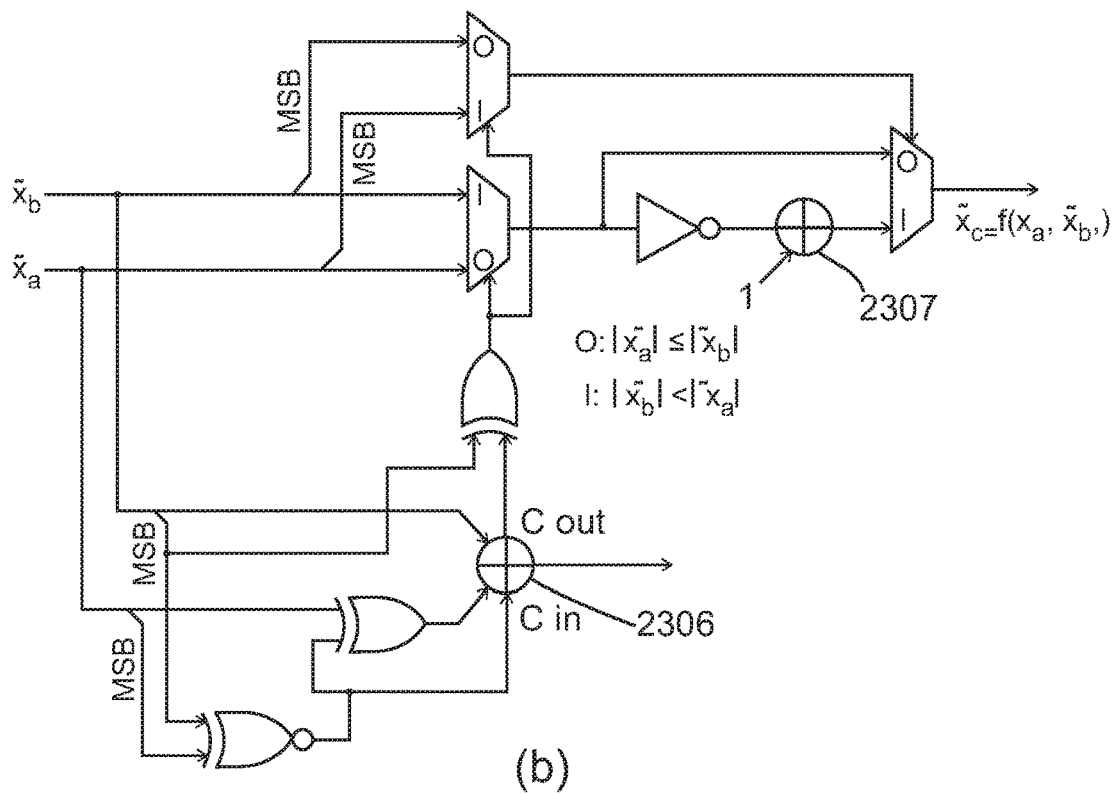
Figure 23:
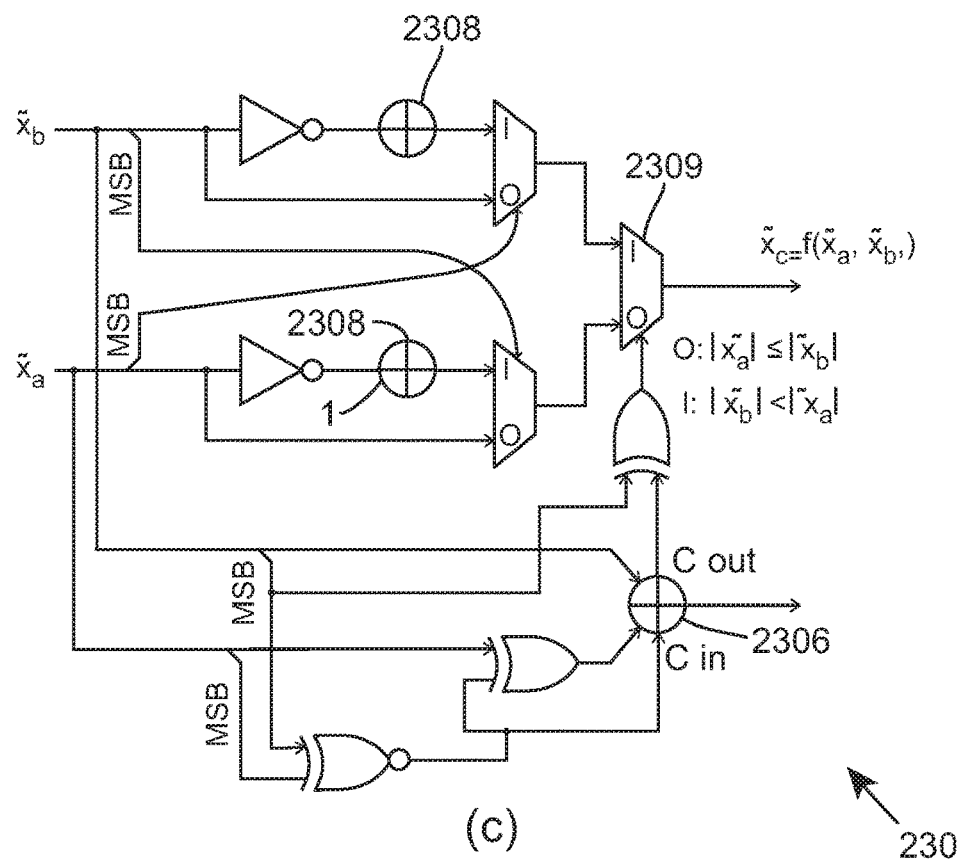

FIG. 23 illustrates an example 2300 of the known art on the two's complement implementation of the 'f' function of (2): (a) Naive implementation; (b) A reduced hardware implementation; (c) A reduced critical path implementation.

In a naive implementation of the f function, each of these two negations can be implemented by complementing 2301 all bits in the two's complement fixed-point representation of the LLR and adding 1, using an adder circuit 2302, producing the absolute values shown in FIG. 23a. Following this, $\min(|\tilde{x}_a|, |\tilde{x}_b|)$ can be implemented by using a third adder 2303 to subtract $|\tilde{x}_a|$ from $|\tilde{x}_b|$ and using the sign bit of the result to select 2304 either $|\tilde{x}_a|$ or $|\tilde{x}_b|$, according to the compare and select operations shown in FIG. 23a. Finally, depending on the signs of $\tilde{x}_a$ and $\tilde{x}_b$, it may be necessary to negate $\min(|\tilde{x}_a|, |\tilde{x}_b|)$, requiring a fourth adder 2305. In more sophisticated two's complement implementations, the functionality of the first three adders 2302, 2303 described above may be achieved using only a single adder 2306. This enables the f function to be implemented using two adders in series, where the second adder 2307 performs a negation when necessary, as shown in FIG. 23b. In order to reduce the critical path length to only a single adder, an alternative implementation can implement the f function using three adders 2306, 2308 in parallel, as shown in FIG. 23c. Here, one adder 2306 is used to combine the functionality of the first three adders 2302, 2303 described above and to determine whether $f(\tilde{x}_a, \tilde{x}_b)$ should be given by $\tilde{x}_a$, $-\tilde{x}_a$, $\tilde{x}_b$ or $-\tilde{x}_b$. Meanwhile, the other two adders 2308 calculate $-\tilde{x}_a$ and $-\tilde{x}_b$, in case these values are selected 2309 by the first adder 2306. Some other previous implementations of polar codes in the literature [15], [16], [26], [36] have used the sign-magnitude fixed point number representation to represent each LLR $\tilde{x}$ as a vector of W bits $[\tilde{x}_w]_{w=1}^W$, where $\tilde{x}_1$ is the sign bit, $\tilde{x}_2$ is the MSB, $\tilde{x}_W$ is the LSB and $\tilde{x} = (-1)^{\tilde{x}_1} \cdot (\Sigma_{w=2}^W 2^{W-w}\tilde{x}_w)$. Meanwhile, some previous implementations [29] have used the one's complement fixed point number representation, where $\tilde{x} = (-1)^{\tilde{x}_1} \cdot (\Sigma_{w=2}^W 2^{W-w} \text{XOR}(\tilde{x}_w, \tilde{x}_1))$. While these approaches allow the f function of (2) to be completed using a single adder, additional adders are required to convert to and from the two's complement fixed point number representation, in order to perform the g function of (3). Alternatively, these approaches can be implemented using only a single adder to perform both the f and g function, at the cost of sometimes introducing an error of ±1 into the resultant LLRs $\tilde{x}_c$ and $\tilde{x}_d$, which degrades the error correction capability of the polar decoder [29].

In contrast to these previous implementations, the input LLRs, output LLR and internal operation of the proposed processing unit 2201 of FIG. 22 employ a fixed-point number representation in which a two's complement number is appended onto an additional sign bit. More specifically, each input LLR $\sim x$ 2202, 2203 is represented as a vector of W+1 bits $[\tilde{x}_w]_{w=0}^W$, where $\tilde{x}_0$ is the additional sign bit, $\tilde{x}_1$ serves as both the MSB and the two's complement sign bit, $\tilde{x}_W$ is the LSB and $\tilde{x} = (-1)^{\tilde{x}_0} \cdot (-2^{W-1}\tilde{x}_1 + \Sigma_{w=2}^W 2^{W-w}\tilde{x}_w)$. Here, the sign of the LLR may be obtained as $\text{sign}(\tilde{x}) = (-1)^{\text{XOR}(\tilde{x}_0, \tilde{x}_1)}$. In other words, the additional sign bit indicates whether the value represented by the two's complement fixed point number should be negated or not, in order to recover the true LLR value. Note that in alternative arrangements, the W+1 bits of the proposed fixed-point number representation may be reordered, for example by placing the additional sign bit last rather than first in the vector and/or by using an LSB-first rather than MSB-first two's complement representation. Note that while some of the previous efforts referenced above have momentarily used binary flags to indicate that an accompanying two's complement fixed point number requires negation. However, these flags are not passed between processing units or into memory. In particular, none of the processing units of previous efforts have the input circuitry required to accept inputs 2202, 2203 adopting the proposed fixed-point number representation.

The proposed processing unit 2201 employs only a single adder 2207, which may be shared to perform both the g function of (3) and the f function of (2), as characterised by the schematic and truth tables of FIG. 22. The two inputs 2208 to the adder each have W bits, which derive from the two's complement parts of $\tilde{x}_a$ and $\tilde{x}_b$, while the output 2209 comprises W+1 bits, in order to avoid overflow. Depending on the value of $\hat{u}_a$, as well as the additional sign bits of $\tilde{x}_a$ and $\tilde{x}_b$, the two's complement part of the LLR $\tilde{x}_d = g(\tilde{x}_a, \tilde{x}_b, \hat{u}_a)$ may be implemented by using the adder 2207 to either add the two's, complement part of $\tilde{x}_a$ to that of $\tilde{x}_b$, or to subtract the two's complement part of $\tilde{x}_a$ from that of $\tilde{x}_b$. A high degree of hardware reuse is achieved because the $\min(|\tilde{x}_a|, |\tilde{x}_b|)$ term of the f function can also be implemented by using the adder 2207 to perform either this addition or this subtraction, depending on the values of both sign bits in both of $\tilde{x}_a$ and $\tilde{x}_b$. The MSB of the resulting two's complement number may then be used to select 2210 either the two's complement part of $\tilde{x}_a$ or $\tilde{x}_b$ to provide that of the LLR $\tilde{x}_c = f(\tilde{x}_a, \tilde{x}_b)$. For both the f and g functions the additional sign bit of the LLRs $\tilde{x}_c$ and $\tilde{x}_d$ can be obtained using simple combinational logic, as characterised by the truth tables of FIG. 22. Owing to the additional bit introduced by the adder 2207 the output 2206 of the proposed processing unit 2201 comprises W+2 bits, where the represented LLR $\tilde{x}_c$ or $\tilde{x}_d$ is given by $\tilde{x} = (-1)^{\tilde{x}_0} \cdot (-2^W \tilde{x}_1 + \Sigma_{w=2}^{W+1} 2^{W+1-w} \tilde{x}_w)$. Note that the proposed approach does not introduce any ±1 errors into the resultant LLRs $\tilde{x}_c$ or $\tilde{x}_d$, preserving the same error correction capability as the two's complement fixed-point number representation, but using only a single adder 2207 per processing unit 2201.

Note that in the outer datapath 1602 of Section II-B3, some processing units 2201 are only ever required to perform one or other of the f or g functions. In these cases, the mode input 2205 and all circuitry that is specific to the unused mode can be removed. Note that the two's complement fixed-point numbers that are provided to the LLR input 1607 of the proposed polar decoder kernal 111 can be converted to the proposed fixed-point number representation by appending them onto a zero-valued additional sign bit. Following this, the proposed fixed-point number representation may be used throughout the proposed polar decoder kernal 111, without the need to ever convert to a two's complement or any other fixed-point number representation. Alternatively, the LLR memory 1604 required to store each LLR can be reduced by one bit by using an adder to convert the LLR to a two's complement fixed-point number, before it is written. More specifically, if the additional sign bit is set, the two's complement number can be negated by inverting all of its bits and then using the adder to increment the resultant value. In order to convert back to the proposed fixed-point number representation when reading the LLR from the LLR memory block 1604, the two's complement fixed-point number can be appended onto a zero-valued additional sign bit.

2) Inner Datapath:

The inner datapath 1601 is used to perform all LLR and bit calculations for each visit 1806 to each sub-row 1704 in the inner columns 1702 of the polar code graph 201, 202, 203. In some examples, as described herein, the inner datapath 1601 may be parameterised by $s_i$ and $n_i$. Here, these parameters are referred to as the number of inner datapath stages and the inner datapath block size, respectively. Note that using a larger value for $n_i$ is similar to processing more than one sub-row having a smaller $n_i$ at the same time. In this example, the values of these parameters are fixed at design time, where the number of inner datapath stages $s_i$ can adopt any value in the range 1 to $n_{max}-s_o$, while the inner datapath block size can adopt the value of any power of two in the range $2^{s_i}$ to $N_{max}$.

Figure 24:
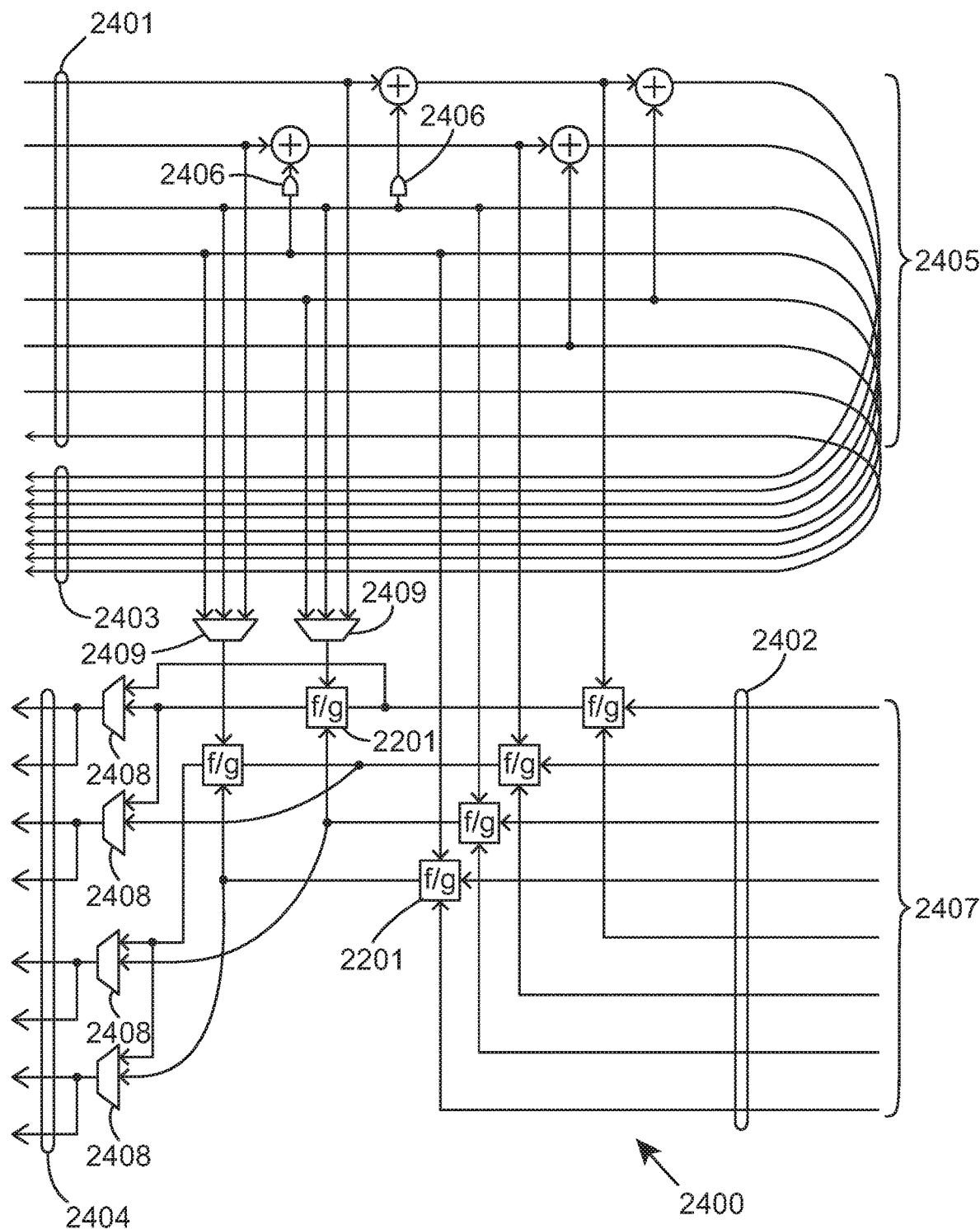
FIG. 24 illustrates an example schematic of the inner datapath in the proposed polar decoder kernal, for the example of $s_i=2$ and $n_i=8$, according to example embodiments of the invention.

FIG. 24 illustrates an example schematic 2400 of the inner datapath in the proposed polar decoder kernal, for the example of $s_i=2$ and $n_i=8$, according to example embodiments of the invention. This example of the inner datapath 1601 schematic may be suitable for SC decoding. In the case of SCL decoding, L number of parallel replicas of this schematic may be used, where L is the list size. To elaborate further, rather than operating on individual bits and LLRs, the resources of the inner datapath can be replicated L times, so that it can operate in parallel on vectors comprising L bits or LLRs, where each of the L bits or LLRs in the vectors corresponds to a different one of the L candidate kernal information blocks. The inner datapath 1601 has an input v that identifies which visit is being made to the current sub-row 1704, where the visit index is in the range 0 to $2^{s_c}-1$. Note that this input is not shown in FIG. 24, for the sake of simplicity. In the case of SC decoding, the inner datapath 1601 takes inputs from $n_i$ bits on its left-hand edge 2401. In this example, these input bits originate from the outer datapath 1602 as described herein and previous visits of the inner datapath 1601 to the inner columns 1702 to the left, via successive hops through the partial sum datapaths 1603 and the bit memory blocks 1605. This vector of bit inputs may be decomposed into $2^{s_c}$ equal-length sub-vectors, corresponding to the $2^{s_c}$ connected rows 1703 in the column immediately to the left. However, during a particular visit v to the current sub-row 1704, only the first v sub-vectors will contain valid bits, since the processing will only have been completed for the first v connected rows 1703 in the column to the left. Note that since the lowest connected row 1703 in the column to the left will not be visited until after the final visit to the current row 1703 in the current column, the last sub-vector of the input bits will never provide valid bits. Motivated by this, the last $n_i/2^{s_i}$ inputs and all connected circuitry may be removed in an alternative arrangement. Furthermore, the inner datapath 1601 takes inputs from $n_i$ LLRs on its right-hand edge 2402, which originate from previous visits of the inner datapath 1601 to the column 1702 immediately to the right, via the corresponding LLR memory block 1604. Here, the proposed aforementioned fixed-point number representation may be used for each LLR, as detailed below. The inner datapath 1601 provides outputs for $n_i$ bits on its left-hand edge 2403, which are provided to the partial sum datapath 1603 of Section II-B4, via the corresponding bit memory block 1605. Furthermore, in some examples, the inner datapath 1601 provides outputs for $n_i$ fixed-point LLRs on its left-hand edge 2404, which are provided to the column 1701, 1702 immediately to the left, via the corresponding LLR memory block 1604. However, only a subset of these outputs carry valid LLRs, as identified by the $n_i$ write enable signals that are output on the left-edge of the inner datapath 1601. Note that these write enable signals are not shown in FIG. 24, for the sake of simplicity.

As shown in FIG. 24, the inner datapath 1601 includes a graph 2405 of XORs 204. Here, each input to the left-hand edge of the XOR graph 2405 is taken from the corresponding bit input 2401 on the left-hand edge of the inner datapath 1601, while the corresponding output from the right-hand edge of the XOR graph 2405 is provided to the corresponding bit output 2403, which is also on the left-hand edge of the datapath. Note that the XOR graph 2405 resembles the right-most $s_i$ stages 207 in a graph representation of the generator matrix $F^{\otimes \log_2(n_i)}$. However the lowest $n_i/2^{s_i}$ XORs 204 in each stage are omitted in the XOR graph 2405 of the inner datapath 1601, since these would connect to the lowest $n_i/2^{s_i}$ input bits, which never carry valid bits, as described above. This leads to the omission of some XORs 204 in the rearranged graph 2100 of FIG. 21. Note that when the number of stages $s_c$ in the current column is lower than $s_i$, the number of stages in the XOR graph 2405 is reduced to match $s_c$ by disabling the XOR gates 204 in the left-most stages of the graph 2405. This may be achieved by using AND gates 2406 to mask the corresponding vertical connections in the datapath, as shown in FIG. 24.

Furthermore, in some examples, the inner datapath 1601 may include a network 2407 of processing units 2201, each of which may be configured at run time to perform either an f function of (2) or a g function of (3). Each input to the right-hand edge of the processing unit network 2407 is taken from the corresponding LLR input 2402 on the right-hand edge of the inner datapath 1601, while each output from the left-hand edge of the network is provided to the LLR output 2404 on the left-hand edge of the datapath. The network 2407 comprises $s_i$ stages, where the right-most stage comprises $n_i/2$ processing units 2201 and each successive stage to the left contains half as many processing units 2201 as the stage to its right.

In some examples, the processing units may be configured to operate on the basis of the fixed point number representation as described herein, where an incremental bit width is used in each successive stage from right to left. However, a clipping circuit (not shown) may be used to reduce the bit width of the soft bits or LLRs output on the left-hand edge of the network of processing units, so that it matches the bit widths of the soft bits or LLRs input on the right-hand edge. In an alternative arrangement, clipping may be additionally performed between some particular stages of the processing unit network, which reduces the inner datapath's hardware resource requirement, at the cost of degrading the polar decoder's error correction capability. The critical path through the processing unit network comprises $s_i$ processing units 2201 in series and the total number of processing units 2201 is given by $n_i(1-2^{-s_i})$, as quantified in FIG. 20 for the case of L=8 list decoding, which implies that L=8 replicas of the inner datapath 1601 are required. The processing units 2201 in the network 2407 are connected together in order to form a binary tree. These connections are arranged in accordance with the top-most XORs 204 in the right-most $s_i$ stages 207 from a graph representation 201, 202, 203 of the generator matrix $F^{\otimes \log_2(n_i)}$. Note that this tree structure is similar to those proposed in [26], [30] and [32], albeit those previous implementations do not flexibly support different kernal block lengths N at run-time. Note that when the number of stages $s_c$ in the current column is lower than $s_i$, the number of stages in the processing unit network 2407 is reduced to match $s_c$ by using multiplexers 2408 to bypass the processing units 2201 in the left-most stages of the network 2407, as shown in FIG. 24.

Depending on which visit v is being made to the current sub-row 1704, the processing units 2201 perform either the f function of (2) or the g function of (3). More specifically, the visit index v is converted to a binary number having $s_c$ digits, but in reverse order with the LSB mapped to the left-most stage of processing units in the inner datapath and a most significant bit (MSB) mapped to the right-most stage of processing units in the inner datapath. If the bit in a particular position within the reversed binary representation of the visit index has a value '0', then the processing units 2201 in the corresponding stage of the network perform the f function of (2). By contrast, if the corresponding bit is a '1', then these processing units 2201 perform the g function of (3). Here, multiplexers 2409 are used to deliver the correct bit from the XOR graph 2405 to each processing unit 2201 that computes a g function.

As shown in FIG. 24, an arrangement of multiplexers 2408 is used to position the $n_i/2^{s_c}$ LLRs generated by the processing unit network among the $n_i$ LLR outputs on the left-hand edge 2404 of the inner datapath 1601. Circuitry is also provided to assert the write enable outputs that have the corresponding positions to these LLRs. More specifically, the arrangement of multiplexers 2408 maps the LLR having each index $m \in [0, n_i/2^{s_c}-1]$ provided by the processing unit network 2407 to a different one of the $n_i$ outputs on the left-hand edge 2404 of the inner datapath 1601 having the index $n(m) \in [0, n_i-1]$, according to $$n(m) = \left\lfloor \frac{\mathrm{mod}(j_c, r_{c-1})n_i}{r_{c-1}} \right\rfloor + 2^{s_c}m.$$

Here, $j_c \in [0, N-1]$ is referred to as the first index, which represents the vertical index of the top-most connection of the polar code graph 201, 202, 203 that belongs to the current sub-row 1704 in the current column c, where $j_c=0$ for the top-most sub-row in the top-most row. The first index may be obtained according to:

$$j_c = y_c r_c + s$$

where $y_c \in [0, N/r_c-1]$ is the index of the row 1703 currently being visited in the column c, and $s \in [0, \max(r_c/n_i, 1)-1]$ is the index of the sub-row 1704 being visited in that row 1703. Among the vector of $n_i$ write enable signals that are output on the left-hand edge of the inner datapath 1601, the corresponding sub-set of $n_i/2^{s_c}$ signals having the indices $n(m)$ are asserted. In some examples, this operation of the multiplexers 2408 and the write enable signals allows the LLRs output by the inner datapath 1601 to be written directly to the corresponding LLR memory block 1604. In some examples, the controller 1606 may be configured to insert pipelining registers between some or all of the stages in the XOR graph 2405 and the processing unit network 2407.

Figure 25:
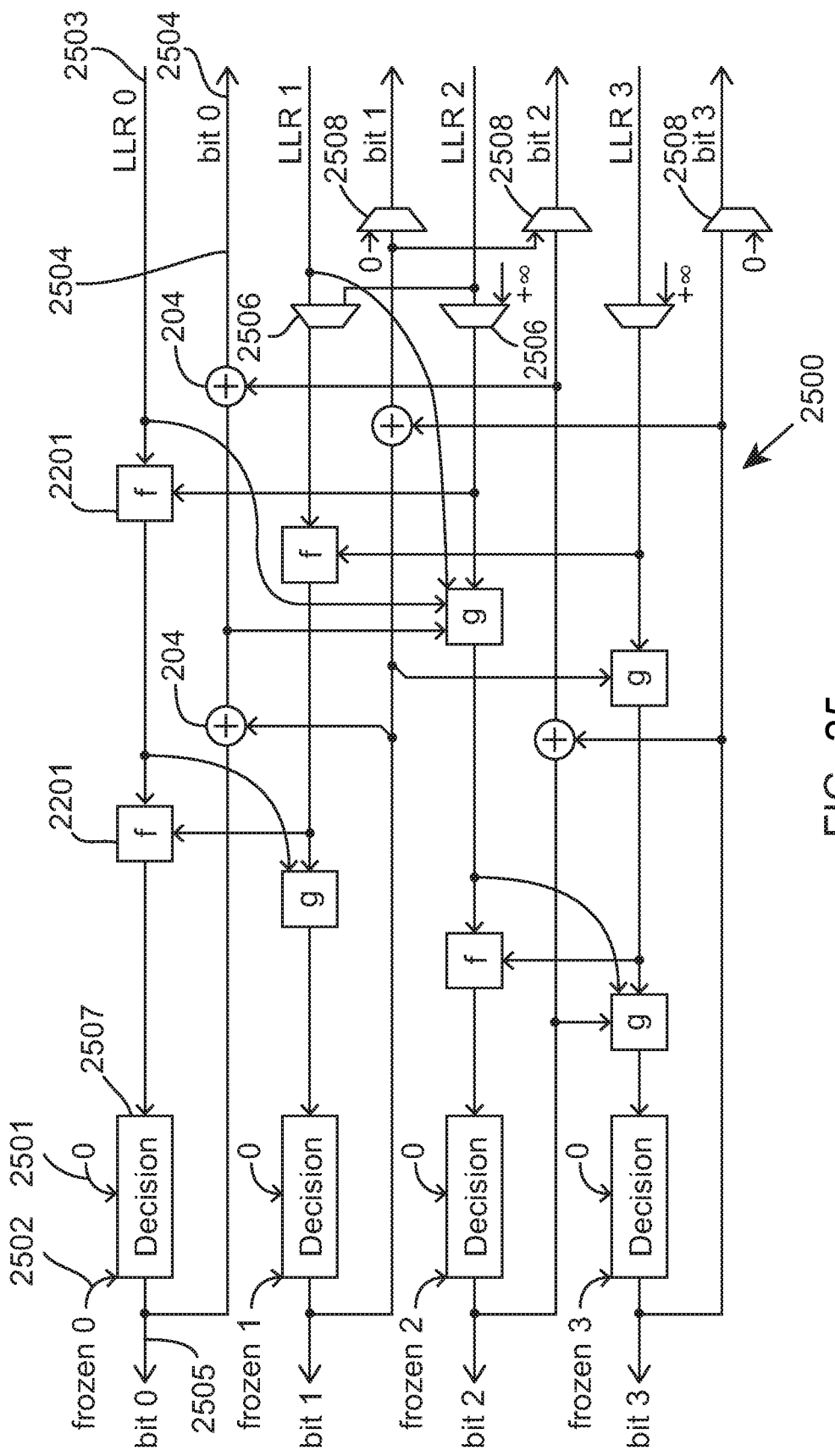
FIG. 25 illustrates an example schematic of an outer datapath for SC decoding in the proposed polar decoder kernal, for the example of $s_o=2$ and $n_i=4$, according to example embodiments of the invention.

3) Outer Datapath:

FIG. 25 illustrates an example schematic 2500 of an outer datapath for SC decoding in the proposed polar decoder kernal, for the example of $s_o=2$ and $n_i=4$, according to example embodiments of the invention.

In the case of SC decoding, the outer datapath 1602 of FIG. 25 may be used to perform all LLR and bit calculations 1804 for each row 1703 in the outer column 1701 of the polar code graph 201, 202, 203. The outer datapath 1602 is parameterised by $s_o$, which is referred to as the number of outer datapath stages. In some examples, the value of this parameter is fixed at design time and may adopt any value in the range 0 to $n_{max}=\log_2(N_{max})$. Here, it is assumed that $2^{s_o} \leq n_i$. In the case where $2^{s_o} > n_i$, the larger width of $2^{s_o}$ would be required for the interface with the corresponding LLR memory block 1604 of FIG. 16, together with modifications to the controller 1606.

The outer datapath 1602 takes inputs from $2^{s_o}$ redundant bits 2501 and $2^{s_o}$ redundant bit flags 2502 on its left-hand edge, which originate from the corresponding inputs 1608 of the proposed polar decoder kernal 111. The outer datapath 1602 also takes inputs from $n_i$ LLRs on its right-hand edge 2503, which originate from the inner datapath 1601, via the corresponding LLR memory block 1604. Furthermore, the outer datapath 1602 provides outputs for $n_i$ bits on its right-hand edge 2504, which are provided to the inner datapath 1601 and the partial sum datapath 1603, via the corresponding bit memory block 1605. Additionally, the outer datapath 1602 provides outputs for $2^{s_o}$ bits on its left-hand edge 2505, which contribute to the recovered kernal information block $\hat{u}$ 114. In the case of SC decoding, these bits may be written directly to the bit output 1609 of the proposed polar decoder kernal 111, which therefore adopts a width of $n_b=2^{s_o}$.

The outer datapath 1602 operates on the basis of a graph representation 201, 202, 203 of the generator matrix $F^{\otimes s_o}$, which it uses to perform all XOR, f and g operations, according to the previously described data dependencies. Accordingly, the outer datapath 1602 includes an XOR graph, comprising $s_o$ stages, each comprising $2^{s_o-1}$ XORs 204. Furthermore, the outer datapath 1602 includes an f/g graph, which also comprises $s_o$ stages, each having $2^{s_o-1}$ processing units 2201 that perform only the f function and $2^{s_o-1}$ processing units 2201 that perform only the g function, as described herein.

The processing units 2201 operate on the basis of the fixed point number representation, where an incremental bit width is used in each successive processing unit 2201 along the critical path shown in FIG. 25.

The input on the right-hand edge 2503 of the f/g graph comprises $2^{s_o}$ fixed-point LLRs, as shown in FIG. 25. An arrangement of multiplexers 2506 is used to select these $2^{s_o}$ LLRs from among the $n_i$ LLR provided by the input on the right-hand edge 2503 of the outer datapath 1602. More specifically, the arrangement of multiplexers 2506 selects the LLR having each index $m \in [0, \min(2^{s_o}, N)-1]$ on the input of the f/g graph from a different one of the $n_i$ inputs on the right-hand edge 2503 of the inner datapath 1601 having the index $n(m) \in [0, n_i-1]$, according to $n(m)=mn_i/r_1$.

Note that if $N<2^{s_o}$, then the LLRs having each index $m \in [N, 2^{s_o}-1]$ on the input of the f/g graph are set to the greatest positive value supported by the fixed-point number representation. These additional LLRs have no influence upon the decoding process, since they correspond to the asserted frozen bit flags that are appended to the frozen bit vector in the case where $N<2^{s_o}$.

The outer datapath 1602 also includes circuits 2507 for selecting the value of the bits that are output on the left-hand edge 2505 of the outer datapath. More specifically, if the corresponding redundant bit flag is set 2502, then the value of the corresponding redundant bit 2501 is adopted. If not, then the sign of the corresponding LLR is used to select a value for the bit, where a positive LLR gives a bit value of 0, while a negative LLR gives a bit value of 1. These decisions inform the XOR and g operations performed within the graph and also drive the bit output on the left-hand edge 2505 of the outer datapath 1602.

Following the completion of all XOR operations 204 within the outer datapath 1602, a vector of $2^{s_o}$ bits are produced on the right-hand edge of the XOR graph, as shown in FIG. 25. An arrangement of multiplexers 2508 is used to position these $2^{s_o}$ bits among the $n_i$ bit outputs on the right-hand edge 2504 of the outer datapath 1602. More specifically, the arrangement of multiplexers 2508 maps the bit having each index $m \in [0, \min(2^{s_o}, N)-1]$ on the output of the XOR graph to a different one of the $n_i$ output on the right-hand edge 2504 of the inner datapath 1601 having the index $n(m) \in [0, n_i-1]$ according to $n(m)=mn_i/r_1$; while zero-valued bits are provided to all other outputs on the right-hand edge 2504 of the outer datapath 1602. In some examples, the controller 1606 may be configured to insert pipelining registers between some or all of the stages in the XOR graph and the f/g graph.

In the case of SCL decoding, the outer datapath 1602 must be additionally capable of performing all partial sum, f and g computations for all candidates in the list. To elaborate further, rather than operating on individual bits and LLRs, the outer datapath can be adapted, so that it can operate in parallel on vectors comprising L bits, where each of the L bits in the vectors corresponds to a different one of the L candidate kernal information blocks. Furthermore, the outer datapath 1602 must compute the metrics of (7), which accumulate over successive kernal information bits. Here, registers may be used to pass metrics between successive visits to successive rows 1703 in the outer column 1701. Additionally, in some examples, the outer datapath 1602 requires a sorting circuit, in order to identify and select the L candidates having the lowest metrics. Finally, a bit memory block having a capacity of $LN_{max}$ bits is required to store the L candidate kernal information blocks. Here, additional pointer memories [18] may be used to assist the addressing of this bit memory block. FIG. 20 quantifies the total number of adders required to implement the f, g, metric and sort computations for the case of L=8 SCL decoding.

4) Partial Sum Datapath:

The partial sum datapath 1603 is used to perform the XOR operations 2101 for each sub-row that were omitted from the XOR graph in the inner datapath 1601 and to propagate 1805 bits from left to right in the polar code graph 201, 202, 203. The partial sum datapath 1603 is parameterised by $s_i$ and $n_i$, which are referred to as the number of inner datapath stages and the inner datapath block size, respectively. Note that using a larger value for $n_i$ is similar to processing more than one sub-row having a smaller $n_i$ at the same time. As described, in some examples, the values of these parameters are fixed at design time, where the number of inner datapath stages $s_i$ can adopt any value in the range 1 to $n_{max}-s_o$, while the inner datapath block size can adopt the value of any power of two in the range $2^{s_i}$ to $N_{max}$.

In this example, the operation of the partial sum datapath 1603 schematic shown in FIG. 24, is used for SC decoding. In the case of SCL decoding, L number of parallel replicas of this schematic may be used, where L is the list size. To elaborate further, rather than operating on individual bits, the resources of the partial sum datapaths can be replicated L times, so that they can operate in parallel on vectors comprising L bits, where each of the L bits in the vectors corresponds to a different one of the L candidate kernal information blocks. In the case of SC decoding, the partial sum datapath 1603 takes inputs from $n_i$ bits on its left-hand edge 2601, which originate from the right-hand edge 2504 of the outer datapath 1602 and the left-hand edge 2403 of the inner datapath 1601, via successive hops through other replicas of the partial sum datapath 1603 and via the bit memory blocks 1605. The partial sum datapath 1603 outputs $n_i$ bits on its right-hand edge 2602, which are provided to the left-hand edge 2401 of the inner datapath 1601, via successive hops through other replicas of the partial sum datapath 1603 and via the bit memory blocks 1605.

Figure 26:
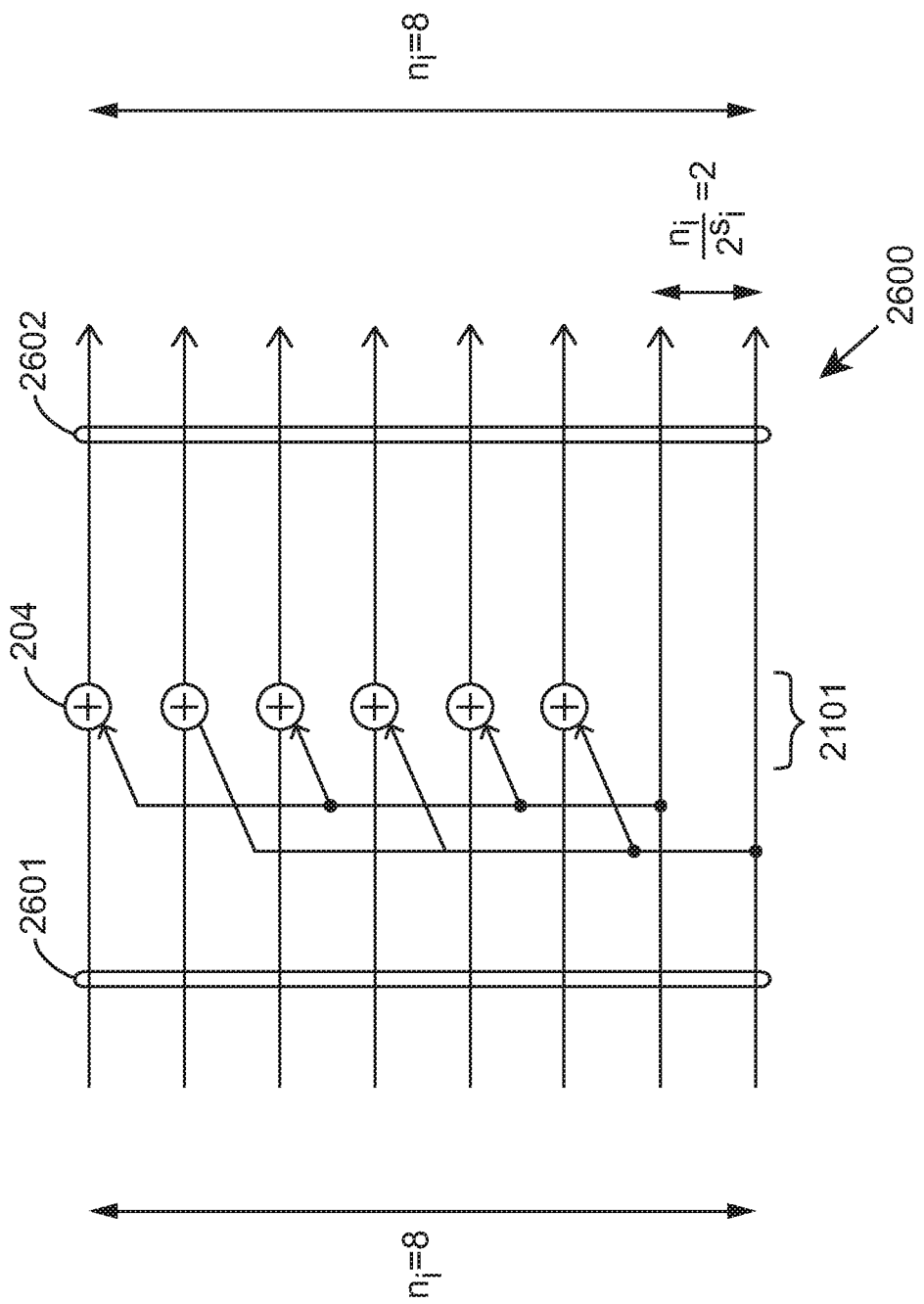
FIG. 26 illustrates an example schematic of a partial sum datapath in the proposed polar decoder kernal, for the example of $s_i=2$ and $n_i=8$, according to example embodiments of the invention.

FIG. 26 illustrates an example schematic 2600 of a partial sum datapath in the proposed polar decoder kernal, for the example of $s_i=2$ and $n_i=8$, according to example embodiments of the invention.

As shown in FIG. 26, the bottom-most $n_i/2^{s_i}$ output bits are set equal to the corresponding input bits. However, the top-most $n_i-n_i/2^{s_i}$ output bits are obtained as an XOR 204 of the corresponding input bit and one of the bottom-most $n_i/2^{s_i}$ input bits. Here, the particular bit is identified such that both bits in each XORed pair have the same index modulo $n_i/2^{s_i}$, where each bit index will be in the range '0' to $n_i-1$ before the modulo operation and '0' to $n_i/2^{s_i}-1$ after the modulo operation. Since the partial sum datapath 1603 is invoked at the interface between each consecutive pair of inner columns 1702, the XORs 204 of the partial sum datapath 1603 correspond to the additional XORs 2101 that were introduced in the rearranged graph 2100 of FIG. 21.

Note that in an alternative arrangement, the results of the XORs 204 performed by the inner datapath 1601 may be discarded after they are used as inputs to the g functions, rather than output on the left-edge 2403 of the inner datapath 1601 and stored in the bit memories 1605. In this case, the partial sum datapath 1603 must be relied upon to perform all XOR operations 204 for the corresponding sub-row during the propagation 1805 of the partial sums. This may be achieved by replacing the $n_i-n_i/2^{s_i}$ XORs 2101 of FIG. 26 with a complete XOR graph, which resembles the right-most $s_i$ stages 207 in a graph representation 201, 202, 203 of the generator matrix $F^{\otimes \log_2(n_i)}$. However, this approach would require $s_i n_i/2$ XORs 204, which is typically a higher number than the $n_i-n_i/2^{s_i}$ XORs 204 employed by the proposed approach. Furthermore, the critical path would comprise $s_i$ XORs 204, as compared with the single XOR 204 of the proposed approach Memory The proposed polar decoder kernal 111 employs two types of memory, namely the LLR memory blocks 1604 and the bit memory blocks 1605.

Figure 27:
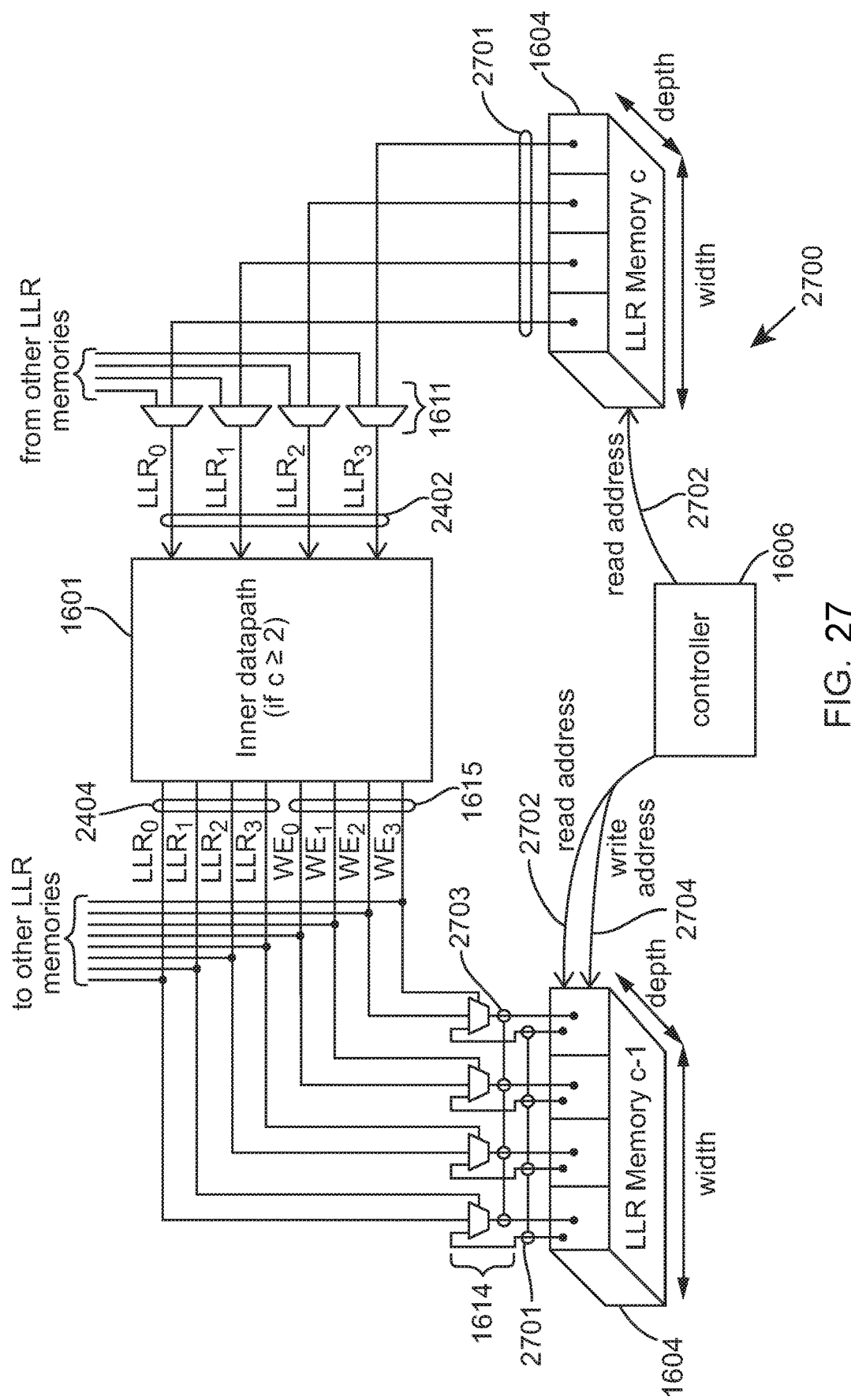
FIG. 27 illustrates an example schematic of the interaction between the inner datapath, LLR memory blocks and controller of the proposed polar decoder kernal, according to example embodiments of the invention.

1) LLR Memory:

As shown in FIG. 27, the proposed polar decoder kernal 111 employs $C_{max}$ two-dimensional blocks of LLR memory 1604, namely LLR Memory 1 to LLR Memory $C_{max}$. Conceptually, LLR Memory $c \in [1, C_{max}-1]$ may be considered to be situated at the interface on the left-hand edge of the inner column 1702 with the index $c \in [1, C_{max}-1]$, while LLR Memory $C_{max}$ may be considered to reside at the interface between the right-most column 1702 and the LLR input 1607 of the proposed polar decoder kernal 111. The memory block with the index c comprises a single Random Access Memory (RAM), having a width of $n_t$ fixed-point LLRs and a depth of $\max(r_{c-1, max}/n_t, 1)$ addresses, where the width and depth represent the two dimensions of the memory block. The total LLR memory requirement of the proposed polar decoder kernal 111 is given by $\Sigma_{c=1}^{C_{max}} \max(r_{c-1, max}, n_t)$ LLRs. Note that rather than accommodating the $C_{max}$ memory blocks in a third RAM dimension using $C_{max}$ distinct RAMs, alternative arrangements may accommodate the $C_{max}$ blocks of memory within a single RAM, by extending its depth to accommodate all of the memory blocks in the depth dimension instead. However, this alternative arrangements would imply different datapath interfaces and controller 1606 designs to those described below and elsewhere in the description. In some examples, it is assumed that $n_i \geq 2^{s_o}$. In the case where $n_i < 2^{s_o}$, the larger width of $2^{s_o}$ would be required for LLR Memory 1 and LLR Memory $C_{max}$, together with modifications to the controller 1606, in order to support the interface with the outer datapath 1602.

Note that in the case of SCL decoding, the LLR memory blocks 1604 having the indices '1' to $C_{max}-1$ must be replicated L times, which may be accommodated in the RAM dimension or in the width dimension. To elaborate further, rather than operating on individual LLRs, the resources of the LLR memory blocks can be replicated L times, so that they can operate in parallel on vectors comprising L LLRs, where each of the L LLRs in the vectors corresponds to a different one of the L candidate kernal information blocks. Here, an additional pointer memory [18] may be used to assist the addressing between these replicas of the memory. However, only a single replica of the LLR memory block 1604 having the index $C_{max}$ is required, since the LLRs provided by LLR input 1607 of the polar decoder kernal 111 are common to all L decoding attempts. The total capacity of the LLRs memory blocks is quantified for the case of L=8 SCL decoding in FIG. 20, excluding the pointer memory. As a result of these considerations, the LLRs provided to the LLR input 1607 of the proposed polar decoder kernal 111 are always stored in the LLR memory block 1604 having the index $C_{max}$, irrespective of how many columns C are used to decode the current kernal block length N. As an additional benefit, the LLR memory block 1604 having the index $C_{max}$ may be interfaced with the LLR input 1607 of the proposed polar decoder kernal 111 using a width $n_I$ that is decoupled from that of the inner datapath $n_i$. In this way, LLRs may be loaded into the proposed polar decoder quickly, using a large value for $n_I$, irrespective of how the inner datapath 1601 is parameterised.

For the sake of simplicity however, in this example let us assume that $n_I = n_i$. In the case where the number N of input LLRs is less than the width $n_t$ of LLR Memory $C_{max}$, an equal number of zero-valued LLRs are inserted after each input LLR, before they are provided to the input to the memory, in order to occupy its full width. Note that in the case where the LLR input 1607 of the proposed polar decoder kernal 111 adopts the two's complement fixed-point number representation, the LLR memory block 1604 having the index $C_{max}$ can store the supplied two's complement LLRs directly, without the additional sign bit introduced by the proposed fixed-point number representation of some examples.

FIG. 27 illustrates an example schematic 2700 of the interaction between the inner datapath, LLR memory blocks and controller of the proposed polar decoder kernal, according to example embodiments of the invention.

A single LLR memory block 1604 is exemplified in FIG. 27, for the case of $s_i=1$ and $n_i=4$. As shown in FIG. 27, the RAM of each LLR memory block 1604 has an $n_t$-LLR read data port 2701 which outputs the $n_t$ LLRs across the width of a particular one of the $\max(r_{c-1, max}/n_t, 1)$ addresses across the depth of the RAM, where the particular address is selected by an input provided on an address port 2702, as shown in FIG. 27. Likewise, the RAM has a $n_t$-LLR write port 2703, as shown in FIG. 27. This write port 2703 accepts inputs that can update the $n_t$ LLRs across the width of a particular address, which is selected by the input provided on the address port 2704. However, these $n_t$ LLRs are only updated if corresponding write enable signals 1615 are asserted. It is assumed that $n_t$ individual write enable signals 1615 can be used to control whether each of the $n_t$ LLRs is written individually. If this is not supported natively by a particular hardware RAM implementation, then the write port can be driven by $n_t$ multiplexers 1614, which can be used to multiplex the input LLRs with feedback from the read port 2701, as shown in FIG. 27. In this way, the $n_t$ write enable signals 1615 can individually control the LLRs selected by these $n_t$ multiplexers, either writing the new LLR value to the RAM, or maintaining the current LLR value by writing the corresponding LLR obtained from the read port 2701.

As shown in FIG. 27, each operation of the inner datapath 1601 within the column c reads from the LLR memory block 1604 having the index c+1 and writes into the LLR memory block 1604 having the index c, using corresponding write enable signals 1615. Likewise, each operation of the outer datapath 1602 reads from the LLR memory block 1604 having the index c=1 if C >1 or from the LLR memory block 1604 having the index $C_{max}$ otherwise. These interfaces between the LLR memory blocks 1604 and the various datapaths 1601, 1602 are designed specifically to avoid the requirement for complicated routing networks, which would be required to allow any LLR in the memory blocks to be read or written by any of the inputs or outputs of the datapaths 1601, 1602. Instead, the arrangement of the LLRs in the memory block is designed such that only simple routing networks are required between the LLR memory blocks 1604 and the datapaths 1601, 1602. Likewise, in some examples, it is designed so that only a limited number of control signals are required from the controller 1606. More specifically, during each step of the decoding process, the $n_t$ LLRs across the width of a particular address within the appropriate memory block are read and delivered seamlessly to the inner datapath 1601 or outer datapath 1602, as appropriate. Likewise, a subset of the $n_t$ LLRs across the width of a particular address within the appropriate memory block are written using LLRs and write enable signals 1615 that are delivered seamlessly by the inner datapath 1601, whenever it is operated. The controller 1606 only has to provide appropriate read and write addresses 2702, 2704 to the two memory blocks 1604.

2) Bit Memory:

As shown in FIG. 16, the proposed polar decoder kernal 111 employs $C_{max}-1$ three-dimensional blocks of bit memory 1605, namely Bit Memory 1 to Bit Memory $C_{max}-1$. Conceptually, Bit Memory c may be considered to be situated on the left-hand edge of the column 1702 having the corresponding index c, at the interface with the column 1701, 1702 having the index c−1. Here, the bit memory block 1605 with the index c comprises $2^{s_i}$ RAMs, having widths of $n_t$ bits and depths of $\max(2^{s_o+(c-1)s_i}/n_t, 1)$ addresses, where the RAMs, width and depth represent the three dimensions of the memory block 1605. The total bit memory requirement of the proposed polar decoder kernal 111 is given by $\Sigma_{c=1}^{C_{max}-1} \max(2^{s_o+cs_i}, 2^{s_i}n_i)$ bits. To elaborate further, the memory blocks are three-dimensional in the sense that they have RAM, width and depth dimensions. In this example, this logical three-dimensional memory structure may be compatible with, but not dependent on, a physical three-dimensional memory structure, where the RAMs may be physically stacked in a third physical dimension within an ASIC, for example. Conversely, the logical three-dimensional memory structure may also be implemented in fewer physical dimensions, where the RAMs may be positioned side-by-side within an ASIC, rather than stacked in a third dimension, for example.

Note that in the case of SCL decoding, the bit memory blocks 1605 must be replicated L times, which may be accommodated in the RAM dimension or in the width dimension. To elaborate further, rather than operating on individual bits, the resources of the bit memory blocks can be replicated L times, so that they can operate in parallel on vectors comprising L bits, where each of the L bits in the vectors corresponds to a different one of the L candidate kernal information blocks. Here, additional pointer memories [18] may be used to assist the addressing between these replicas of the memory. The total capacity of the bit memory blocks 1605 is quantified for the case of L=8 SCL decoding in FIG. 20, including the output bit memories described in some examples, but excluding the pointer memories. Note that an alternative arrangement may swap the roles of the RAM and width dimensions, instead employing $n_i$ RAMs, having widths of $2^{s_i}$ bits, although this would imply different datapath interfaces and controller 1606 designs to those described below and in other examples. As mentioned, in some examples, it is assumed that $n_i \geq 2^{s_o}$. In the case where $n_i < 2^{s_o}$, the larger width of $2^{s_o}$ would be required for bit Memory 1, together with modifications to the controller 1606, in order to support the interface with the outer datapath 1602.

Figure 28:
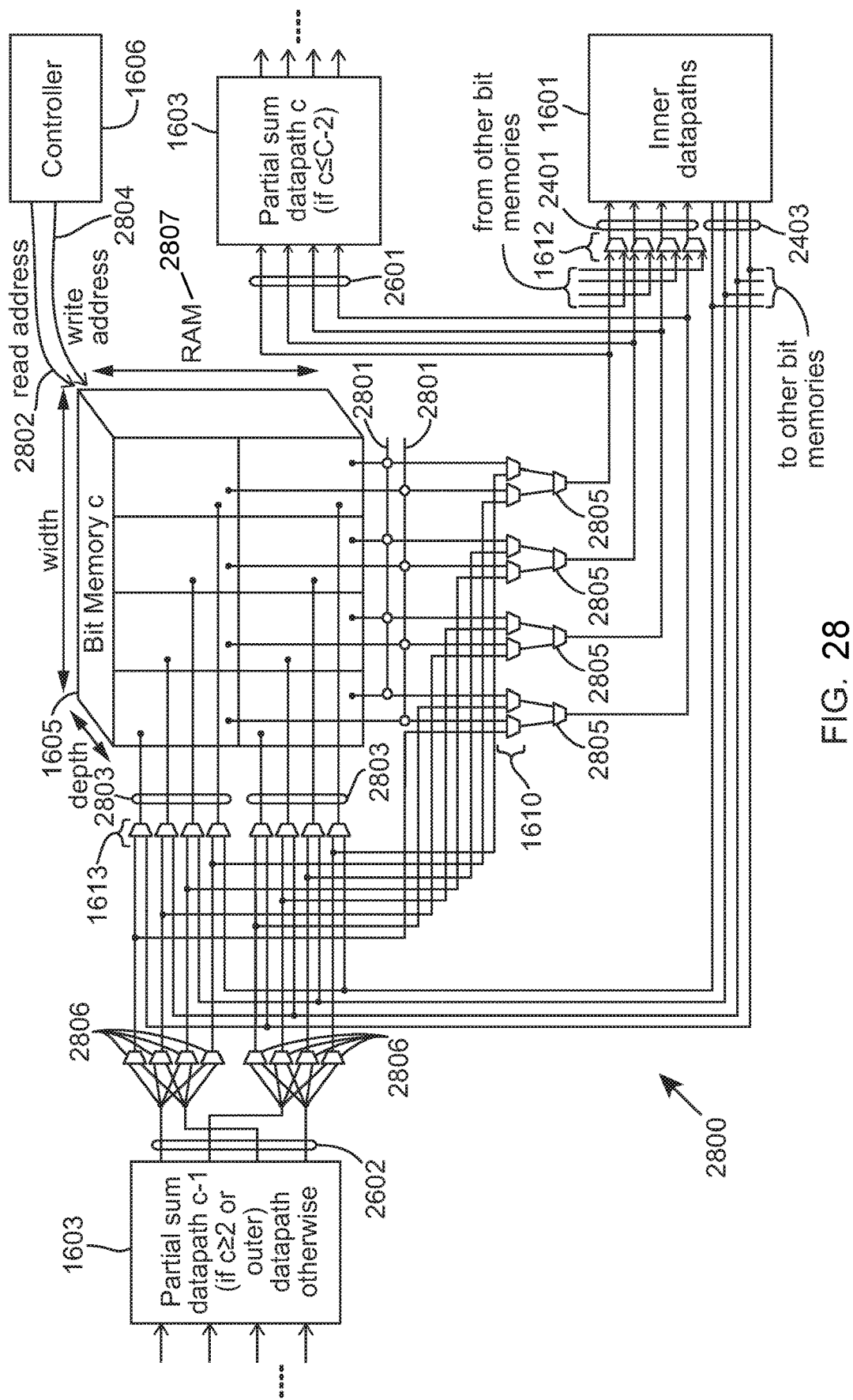
FIG. 28 illustrates an example schematic of the interaction between the inner datapath, bit memory blocks and controller of the proposed polar decoder kernal, for the case where $s_i=1$ and $n_i=4$, according to example embodiments of the invention.

FIG. 28 illustrates an example schematic 2800 of the interaction between the inner datapath, bit memory blocks and controller of the proposed polar decoder kernal, for the case where $s_i=1$ and $n_i=4$, according to example embodiments of the invention.

A single bit memory block 1605 is exemplified in FIG. 28, for the case of $s_i=1$ and $n_i=4$. As shown in FIG. 28, each RAM in each block of bit memory 1605 has an $n_i$-bit read port 2801. This read port 2801 outputs the $n_i$ bits across the width of a particular one of the $\max(2^{s_o+(c-1)s_i}/n_i, 1)$ addresses across the depth of the RAM. Here, the particular address is selected by an input provided on an address port 2802, as shown in FIG. 28. Likewise, each RAM has an $n_i$-bit write port 2803, as shown in FIG. 28. This write port 2803 accepts inputs that can update the $n_i$ bits across the width of the particular address, which is selected by the input provided on the address port 2804. However, these $n_i$ bits are only updated if corresponding write enable signals 1616 are asserted. It is assumed that $n_i$ individual write enable signals 1616 can be used to control whether each of the $n_i$ bits is written individually. If this is not supported natively by a particular hardware RAM implementation, then the write port 2404 can be driven by $n_i$ multiplexers 1617, which can be used to multiplex the input bits with feedback from the read port 2801. For the sake of simplicity, this mechanism is not shown in FIG. 28, although it is shown in FIG. 16. In this way, the $n_i$ write enable signals 1616 can individually control the bits selected by these $n_i$ multiplexers 1617, either writing the new bit value to the RAM, or maintaining the current bit value by writing the corresponding bit obtained from the read port 2801.

As shown in FIG. 16, the outer datapath 1602, the C−2 instances of the partial sum datapath 1603 and the C−1 instances of the bit memory block 1605 form a chain. More specifically, Bit Memory 1 resides between the outer datapath 1602 and Partial Sum Datapath 1, while Bit Memory $c \in [2, c-2]$ resides between Partial Sum Datapath c−1 and Partial Sum Datapath c, while Bit Memory C−1 terminates the chain and resides to the right of Partial Sum Datapath C−2. In a step of the decoding process where a sub-row 1704 in the inner column c is being visited, the multiplexers 1612 connected to the bit inputs and outputs on the left-hand edge of the inner datapath 1601 are controlled such that it is interfaced with Bit Memory c. Here, FIG. 28 details the interface between Bit Memory c and its neighbouring datapaths 1601, 1602, 1603.

These interfaces between the bit memory blocks 1605 and the various datapaths 1601, 1602, 1603 are designed specifically to avoid the requirement for complicated routing networks, which would be required to allow any bit in the memory blocks 1605 to be read or written by any of the inputs or outputs of the datapaths 1601, 1602, 1603. Instead, the arrangement of the bits in the memory block 1605 is designed such that only simple routing networks are required between the bit memory blocks 1605 and the datapaths 1601, 1602, 1603. Likewise, in this example, it is designed so that only a limited number of control signals are required from the controller 1606. More specifically, the address ports of the $2^{s_i}$ RAMs within a particular bit memory block 1605 are all tied together, only requiring the controller 1606 to generate a single address 2802, 2804 for each of the bit memory blocks 1605. Furthermore, the bit input 2601 on the left-hand edge of Partial Sum Datapath c and the bit input 2401 on the left-hand edge of the inner datapath 1601 both read from Bit Memory c on a simple width-wise basis, as detailed below. Similarly, the bit output 2403 on the left-hand edge of the inner datapath 1601 writes to Bit Memory c on a width-wise basis. By contrast, the bit output 2602 on the right-hand edge of Partial Sum Datapath c −1 writes to Bit Memory c on a simple RAM-wise basis, as detailed below. Likewise, the bit output 2504 on the right-hand edge of the outer datapath 1602 writes to Bit Memory 1 on a RAM-wise basis. In some alternative examples, the width-wise bit memory accesses may be replaced with RAM-wise accesses and vice-versa, although this would imply different datapath interfaces and controller 1606 designs to those described below and elsewhere.

For both width-wise and RAM-wise interfaces between a bit memory block 1605 and a datapath, the bit having the position $l \in [0, n_i-1]$ in the input or output of the datapath is read from or written to a particular position within the width of a particular address within the depth of a particular one of the RAMs in the memory block 1605. This location in the memory block 1605 may be identified by the width coordinate $w_l \in [0, n_i-1]$, the depth coordinate $d_l \in [0, \max(2^{s_o+(c-1)s_i}/n_i, 1)-1]$ and the RAM coordinate $r_l \in [0, 2^{s_i}-1]$. As mentioned above, the arrangement of the bits in each memory block 1605 and the operation of the proposed polar decoder kernal 111 is such that the address ports 2802, 2804 of the $2^{s_i}$ RAMs within a particular bit memory block 1605 can all be tied together. This implies that for both width-wise and RAM-wise interfaces, all $n_i$ of the bits that are accessed together will all have the same depth coordinate, which is to say that $d_l$ has the same value for all $l \in [0, n_i-1]$.

Furthermore, the bit in a width-wise datapath interface having the position l∈[0, $n_i$−1] only ever accesses locations in the bit memory block 1605 having the corresponding width coordinate $w_l$=l. However, this bit in the datapath interface may need to access any of the possible RAM coordinates $r_l$∈[0, $2^{s_i}$−1] at different times during the polar decoding process. Owing to this, a $2^{s_i}$:1 multiplexer 2805 is the only circuitry required to provide the $l^{th}$ bit to a width-wise datapath input More specifically, this multiplexer 2805 selects between the bits provided by the $l^{th}$ position in the read ports 2801 of each of the $2^{s_i}$ RAMs, as shown in FIG. 28. Here, the controller 1606 in some examples is required to provide $n_i$ RAM read coordinates to the bit memory block 1605, which may be decoded in order to provide separate control signals to each of these $n_i$ multiplexers 2805. By contrast, no additional circuitry is required for the $l^{th}$ bit of a width-wise datapath output, since this bit can be provided to the $l^{th}$ position in the write ports of each of the $2^{s_i}$ RAMs and the write enable signals 1616 can be used to control which of these RAMs is updated. Here, the controller 1606 in some examples is required to provide $n_i$ RAM write coordinates to the bit memory block 1605, which may be decoded in order to assert $n_i$ of the write enable signals 1616

Furthermore, the bit having the position l∈[0, $n_i$−1] in a RAM-wise output of a datapath is only ever written to locations in the memory block 1605 having the corresponding RAM coordinate $r_l$=mod(l, $2^{s_i}$). However, this bit may need to be written to any of the possible width coordinates $w_l$∈[0, $n_i$−1] at different times during the polar decoding process. Owing to this, a $n_i/2^{s_i}$:1 multiplexer 2806 is the only circuitry required to provide each of the $n_i$ inputs to each of the RAMs' $2^{s_i}$ write ports 2803, as shown in FIG. 28. This is because each input of the RAM having the RAM coordinate n is only selected from the sub-set of datapath outputs having positions l∈[0, $n_i$−1] that satisfy mod(l, $2^{s_i}$)=$r_l$. Here, the controller 1606 may be required to provide $n_i$ width write coordinates to the memory block 1605, which may be decoded to assert $n_i$ of the write enable signals 1616, as well as to provide control signals for the corresponding sub-set of $n_i$ multiplexers 2806.

As described above, in a step of the decoding process where a sub-row 1704 in the inner column c is being visited, a particular selection of bits are read width-wise from each bit memory block 1605 having an index c'∈[1, c−1], passed though the partial sum datapath 1603 having the index c' and written RAM-wise into the bit memory block 1605 having the index c'+1. Note that a sub-set of the locations in the Bit Memory c' that are written RAM-wise by Partial Sum Datapath c'−1 will also be read width-wise by Partial Sum Datapath c'. Motivated by this, the bit memories with indices in the range 2 to c'−1 are operated in transparent mode, so that these bit values provided by the write operation become available to the read operation in the same step of the decoding process. More specifically, as a complement to the feedback from the read port of each RAM in Bit Memory c' to its write port 1617, a bypass 1610 is provided so that the bits provided to the write port 2803 by Partial Sum Datapath c'−1 can be fed directly to the read port 2801. As shown in FIG. 28, multiplexers 1610 are provided to select between the outputs provided by the read ports 2801 of Bit Memory c' and the inputs provided by Partial Sum Datapath c'−1. These multiplexers may be driven by the same write enable signals 1616 that control the operation of the corresponding write ports. This allows bits to propagate 1805 from Bit Memory 1, through the chain of partial sum datapaths 1603 and bit memory blocks 1605 described herein, and be delivered to the bit input 2401 on the left edge of the inner datapath 1601. Here, the controller 1606 provides control signals to the bit memory blocks 1605 to ensure that the correct bits are XORed 2101 together in the partial sum datapaths 1603. Following the completion of the inner datapath 1601 operation, the bits provided by the bit output 2403 on its left-hand edge are written to the bit memory block 1605 having the index c. Here, multiplexers 1613 are provided at the input to the write ports 2803, to select between the outputs provided by Partial Sum Datapath c'−1 and the inner datapath 1601. Note that these multiplexers 1613 are located after the point where the transparent bypass 1610 is taken from, in order to prevent the creation of an endless feedback loop.

Controller

As described previously, the proposed polar decoding process comprises a total of $N/r_0 + \sum_{c=1}^{C-1} 2^{s_c} N/\min(r_c, n_i)$ steps. During each step where a sub-row 1704 in an inner column 1702 having the index c is processed 1806, the controller 1606 is required to provide read control signals to the bit memory blocks 1605 having indices 1 to c. Additionally, the controller 1606 is required to provide read control signals to LLR Memory c+1 when processing 1806 a sub-row 1704 in an inner column 1702 having the index c∈[1, C−2] or to LLR Memory $C_{max}$ when processing 1806 a sub-row 1704 in inner column C−1. Furthermore, the controller 1606 is required to provide write control signals to the bit memory blocks 1605 having indices 2 to c, as well as to the LLR memory block 1604 having the index c, when processing 1806 a sub-row 1704 in an inner column 1702 having the index c. During each step where a row 1703 in the outer column 1701 having the index c=0 is processed 1804, the controller 1606 is required to provide write control signals to Bit Memory 1, as well as to provide read control signals to LLR Memory 1 if C >1 or to LLR Memory $C_{max}$ if C=1. The controller 1606 is designed such that each memory write operation seamlessly arranges the corresponding bits or LLRs in the memory, so that they can be seamlessly read subsequently, without requiring complex interconnection networks.

In addition to the various signals used in the flowchart of FIG. 18, the controller 1606 operation depends on a signal referred to as the first index $j_c$∈[0, N−1]. This represents the vertical index of the top-most connection of the polar code graph 201, 202, 203 that belongs to the sub-row 1704 currently being visited in the column c, where $j_c$=0 for the top-most sub-row 1704 in the top-most row 1703. The first index may be obtained according to $j_c = y_c r_c + s_c$;

where $y_c$∈[0, $N/r_c$−1] is the index of the row 1703 currently being visited in the column c, and s∈[0, max($r_c/n_i$, 1)−1] is the index of the sub-row 1704 being visited in that row 1703. During the process of propagating 1805 partial sum bits through successive bit memory blocks 1605 and replicas of the partial sum datapath 1603, the first index associated with each of the columns c'∈[1, c−1] obtained according to:

$$j_{c'} = \left\lfloor \frac{j_c}{r_c} \right\rfloor r_c + vr_{c-1} - r_{c'} + \mod\left(j_c, \max\left(\frac{r_{c'}}{n_i}, 1\right)\right);$$

where v∈[0, $2^{s_c}$−1] is the index of the visit to the current row 1703 in the current column c.

As described previously in some examples, read and write accesses to the LLR memory blocks 1604 may both be performed width-wise. The position l∈[0, $n_i$−1] in the input or output of LLR Memory c accesses the LLR stored at particular depth $d_l$ and width $w_l$ coordinates,
where
$w_l=1$ in all cases.

As described herein in some examples, it is assumed that a circuit is provided to load 1802 LLRs from the corresponding input 1607 of the proposed polar decoder kernal 111, into LLR Memory $C_{max}$. The controller 1606 is required to operate this loading circuit such that when the inner datapath 1601 performs processing 1806 for a particular sub-row 1704 in column C−1, it can read the corresponding LLRs from LLR Memory $C_{max}$ using the depth coordinate:

$$d_l = \mod\left(j_{C-1}, \max\left(\frac{r_{C-1}}{n_i}, 1\right)\right):$$

Furthermore, when the inner datapath 1601 or outer datapath 1602 performs processing 1804, 1806 for a particular sub-row 1704 in column $c \in [0, C-2]$, it reads from LLR Memory c+1 using the depth coordinate:

$$d_l = \mod\left(j_c, \max\left(\frac{r_c}{n_i}, 1\right)\right)$$

By contrast, when the inner datapath 1601 performs processing 1806 for a particular sub-row 1704 in column c, it writes to LLR Memory c using the depth coordinate:

$$d_l = \mod\left(j_c, \max\left(\frac{r_{c-1}}{n_i}, 1\right)\right):$$

Here, it may be observed that the width coordinates $w_l=1$ are independent of the first index $j_c$ and may therefore be hardwired according to the width-wide operation described in some examples. By contrast, the depth $d_l$ coordinate must be controlled by the controller 1606, as a function of the first index $j_c$. Note however that the depth coordinates $d_l$ are independent of the bit index l, only requiring the controller 1606 to provide a single address 2702, 2704 to the memory block 1604. Note that the LLR provided in position $l \in [0, n_i-1]$ of the write port is only written to the LLR memory block 1604 if the write enable signal 1615 in the corresponding position $l \in [0, n_i-1]$ is asserted, as described in some examples.

As described in some examples, read and write accesses to the bit memory blocks 1605 made by the inner datapath 1601 are both performed width-wise. For these width-wise memory accesses, the position $l \in [0, n_i-1]$ in the input or output of Bit Memory c accesses the bit stored at particular depth $d_l$, RAM $r_l$ and width $w_l$ coordinates, according to:

$$d_l = \mod\left(j_c, \max\left(\frac{2^{s_o+(c-1)s_i}}{n_i}, 1\right)\right),$$

$$r_l = \mod\left(\left\lfloor \frac{\left(j_c + \left\lfloor \frac{l r_c}{n_i} \right\rfloor\right)n_i}{r_{c-1}} \right\rfloor, 2^{s_i}\right)$$

$$\omega_l = l.$$

Here, it may be observed that the width coordinates $w_l=1$ are independent of the first index $j_c$ and may therefore be hardwired according to the width-wide operation described in some examples. By contrast, the depth $d_l$ and RAM $r_l$ coordinates must be controlled by the controller 1606, as a function of the first index $j_c$. Note however that the depth coordinates $d_l$ are independent of the bit index l, only requiring the controller 1606 to provide a single address 2802, 2804 to the memory block. Note that in some cases where $n_i > r_c$, the approach described above may result in two or more of the input bits attempting to write to the same location in the bit memory block 1605. In this case, the bit having the lowest index l should be written to the memory and the other contending bits may be safely discarded.

As described in some examples, write accesses to the bit memory blocks 1605 made by the outer datapath 1602 and the partial sum datapath 1603 are performed RAM-wise. For these RAM-wise memory accesses, the position $l \in [0, n_i-1]$ in the input of Bit Memory c+1 accesses the bit stored at particular depth $d_l$, RAM $r_l$ and width $w_l$ coordinates, according to:

$$d_l = \mod\left(j_c, \max\left(\frac{2^{s_o+cs_i}}{n_i}, 1\right)\right),$$

$$r_l = \mod(l, 2^{s_i})$$

$$\omega_l = \mod\left(\left\lfloor \frac{\left(j_c + \left\lfloor \frac{l r_c}{n_i} \right\rfloor\right)n_i}{r_{c+1}} \right\rfloor, n_i\right)$$

Here, it may be observed that the RAM coordinates $r_l = \mod(l, 2^{s_i})$ are independent of the first index $j_c$ and may therefore be hardwired according to the RAM-wide operation described in some examples. By contrast, the depth $d_l$ and width $w_l$ coordinates must be controlled by the controller 1606, as a function of the first index $j_c$. Note however that the depth coordinates $d_l$ are independent of the bit index l, only requiring the controller 1606 to provide a single address 2802, 2804 to the memory block. The above-described method of controlling memory read and write operations results in a characteristic arrangement of the LLRs and bits within the memory blocks 1604, 1605.

FIGS. 29 to 33 provide various examples of this characteristic arrangement, following the completion of the decoding process. Each FIG. illustrates the index $j \in [0, N-1]$ of the connection between two adjacent columns 1701, 1702 in the polar graph 201, 202, 203 that provides the LLR or bit stored at each RAM, depth and width coordinate in the corresponding memory block 1604, 1605.

Figure 29:
FIG. 29 illustrates an example of the contents of the LLR following a completion of the decoding process, for the case where N=128, $N_{max}=128$, $s_o=1$, $s_i=2$ and $n_i=8$, according to example embodiments of the proposed polar decoder kernal.
Figure 29:

FIG. 29 illustrates an example 2900 of the contents of the LLR following a completion of the decoding process, for the case where N=128, $N_{max}$=128, $s_o$=1, $s_i$=2 and $n_i$=8, according to example embodiments of the invention.

Figure 30:
FIG. 30 illustrates an example of the contents of the LLR and bit memories following a completion of the decoding process, for the case where N=64, $N_{max}=128$, $s_o=1$, $s_i=2$ and $n_i=8$, according to example embodiments of the proposed polar decoder kernal.
Figure 30:

FIG. 30 illustrates an example 3000 of the contents of the LLR and bit memories following a completion of the decoding process, for the case where N=64, $N_{max}$=128, $s_o$=1, $s_i$=2 and $n_i$=8, according to example embodiments of the invention.

Figure 31:
FIG. 31 illustrates an example of the contents of the LLR and bit memories following a completion of the decoding process, for the case where N=32, $N_{max}=128$, $s_o=1$, $s_i=2$ and $n_i=8$, according to example embodiments of the proposed polar decoder kernal.
Figure 31:

FIG. 31 illustrates an example 3100 of the contents of the LLR and bit memories following a completion of the decoding process, for the case where N=32, $N_{max}$=128, $s_o$=1, $s_i$=2 and $n_i$=8, according to example embodiments of the invention.

Figure 32:
FIG. 32 illustrates an example of the contents of the LLR and bit memories following the completion of the decoding process, for the case where N=16, $N_{max}=128$, $s_o=1$, $s_i=2$ and $n_i=8$, according to example embodiments of the proposed polar decoder kernal.
Figure 32:

FIG. 32 illustrates an example 3200 of the contents of the LLR and bit memories following the completion of the decoding process, for the case where N=16, $N_{max}$=128, $s_o$=1, $s_i$=2 and $n_i$=8, according to example embodiments of the invention.

Figure 33:
FIG. 33 illustrates an example of the contents of the LLR and bit memories following a completion of the decoding process, for the case where N=8, $N_{max}=128$, $s_o=1$, $s_i=2$ and $n_i=8$, according to example embodiments of the proposed polar decoder kernal.

FIG. 33 illustrates an example 3300 of the contents of the LLR and bit memories following a completion of the decoding process, for the case where N=8, $N_{max}$=128, $s_o$=1, $s_i$=2 and $n_i$=8, according to example embodiments of the invention.

Figure 34:
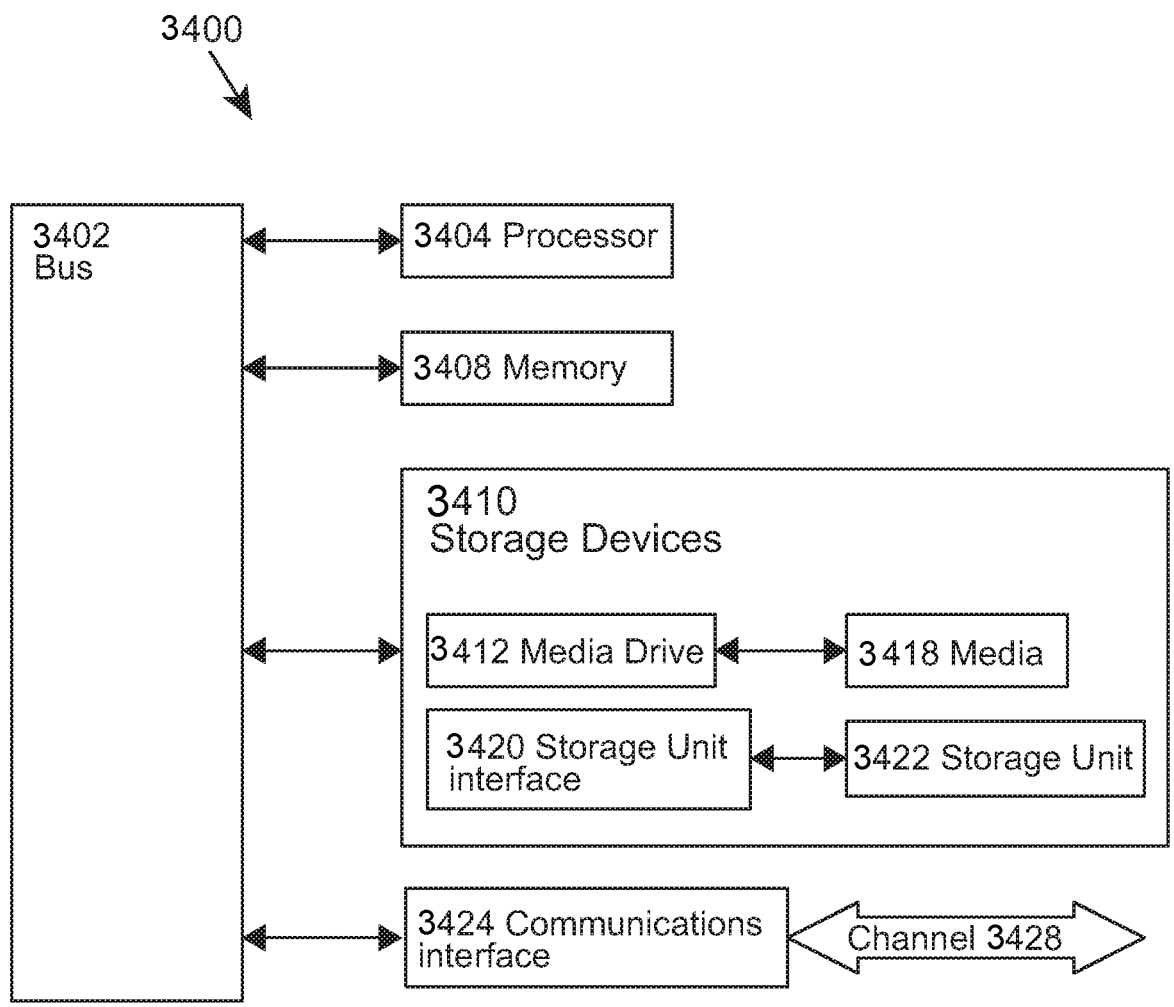
FIG. 34 illustrates a typical computing system that may be employed in an electronic device or a wireless communication unit to perform polar coding operations in accordance with some example embodiments of the invention.

Computing System Example:

Referring now to FIG. 34, there is illustrated a typical computing system 3400 that may be employed to implement polar coding according to some example embodiments of the invention. Computing systems of this type may be used in wireless communication units. Those skilled in the relevant art will also recognize how to implement the invention using other computer systems or architectures. Computing system 3400 may represent, for example, a desktop, laptop or notebook computer, hand-held computing device (PDA, cell phone, palmtop, etc.), mainframe, server, client, or any other type of special or general purpose computing device as may be desirable or appropriate for a given application or environment. Computing system 3400 can include one or more processors, such as a processor 3404. Processor 3404 can be implemented using a general or special-purpose processing engine such as, for example, a microprocessor, microcontroller or other control logic. In this example, processor 3404 is connected to a bus 3402 or other communications medium. In some examples, computing system 3400 may be a non-transitory tangible computer program product comprising executable code stored therein for implementing polar coding.

Computing system 3400 can also include a main memory 3408, such as random access memory (RAM) or other dynamic memory, for storing information and instructions to be executed by processor 3404. Main memory 3408 also may be used for storing temporary variables or other intermediate information during execution of instructions to be executed by processor 3404. Computing system 3400 may likewise include a read only memory (ROM) or other static storage device coupled to bus 3402 for storing static information and instructions for processor 3404.

The computing system 3400 may also include information storage system 3410, which may include, for example, a media drive 3412 and a removable storage interface 3420. The media drive 3412 may include a drive or other mechanism to support fixed or removable storage media, such as a hard disk drive, a floppy disk drive, a magnetic tape drive, an optical disk drive, a compact disc (CD) or digital video drive (DVD) read or write drive (R or RW), or other removable or fixed media drive. Storage media 3418 may include, for example, a hard disk, floppy disk, magnetic tape, optical disk, CD or DVD, or other fixed or removable medium that is read by and written to by media drive 3412. As these examples illustrate, the storage media 3418 may include a computer-readable storage medium having particular computer software or data stored therein.

In alternative embodiments, information storage system 3410 may include other similar components for allowing computer programs or other instructions or data to be loaded into computing system 3400. Such components may include, for example, a removable storage unit 3422 and an interface 3420, such as a program cartridge and cartridge interface, a removable memory (for example, a flash memory or other removable memory module) and memory slot, and other removable storage units 3422 and interfaces 3420 that allow software and data to be transferred from the removable storage unit 3418 to computing system 3400.

Computing system 3400 can also include a communications interface 3424. Communications interface 3424 can be used to allow software and data to be transferred between computing system 3400 and external devices. Examples of communications interface 3424 can include a modem, a network interface (such as an Ethernet or other NIC card), a communications port (such as for example, a universal serial bus (USB) port), a PCMCIA slot and card, etc. Software and data transferred via communications interface 3424 are in the form of signals which can be electronic, electromagnetic, and optical or other signals capable of being received by communications interface 3424. These signals are provided to communications interface 3424 via a channel 3428. This channel 3428 may carry signals and may be implemented using a wireless medium, wire or cable, fibre optics, or other communications medium. Some examples of a channel include a phone line, a cellular phone link, an RF link, a network interface, a local or wide area network, and other communications channels.

In this document, the terms 'computer program product', 'computer-readable medium' and the like may be used generally to refer to media such as, for example, memory 3408, storage device 3418, or storage unit 3422. These and other forms of computer-readable media may store one or more instructions for use by processor 3404, to cause the processor to perform specified operations. Such instructions, generally referred to as 'computer program code' (which may be grouped in the form of computer programs or other groupings), when executed, enable the computing system 3400 to perform functions of embodiments of the present invention. Note that the code may directly cause the processor to perform specified operations, be compiled to do so, and/or be combined with other software, hardware, and/or firmware elements (e.g., libraries for performing standard functions) to do so.

In an embodiment where the elements are implemented using software, the software may be stored in a computer-readable medium and loaded into computing system 3400 using, for example, removable storage drive 3422, drive 3412 or communications interface 3424. The control logic (in this example, software instructions or computer program code), when executed by the processor 3404, causes the processor 3404 to perform the functions of the invention as described herein.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

The present invention is herein described with reference to an integrated circuit device comprising, say, a microprocessor configured to perform the functionality of a polar coder. However, it will be appreciated that the present invention is not limited to such integrated circuit devices, and may equally be applied to integrated circuit devices comprising any alternative type of operational functionality. Examples of such integrated circuit device comprising alternative types of operational functionality may include, by way of example only, application-specific integrated circuit (ASIC) devices, field-programmable gate array (FPGA) devices, or integrated with other components, etc. Furthermore, because the illustrated embodiments of the present invention may for the most part, be implemented using electronic components and circuits known to those skilled in the art, details have not been explained in any greater extent than that considered necessary, for the understanding and appreciation of the underlying concepts of the present invention and in order not to obfuscate or distract from the teachings of the present invention. Alternatively, the circuit and/or component examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired polar coding by operating in accordance with suitable program code, such as minicomputers, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

REFERENCES

[1] E. Arikan, "Channel polarization: A method for constructing capacity-achieving codes for symmetric binary-input memoryless channels," IEEE Transactions on Information Theory, vol. 55, no. 7, pp. 3051-3073, July 2009.

[2] K. Niu and K. Chen, "CRC-aided decoding of polar codes," IEEE Communications Letters, vol. 16, no. 10, pp. 1668-1671, October 2012.

[3] Huawei, HiSilicon, "Polar code construction for NR," in 3GPP TSG RAN WG1 Meeting #86bis, Lisbon, Portugal, October 2016, R1-1608862.

[4] Huawei, HiSilicon, "Evaluation of channel coding schemes for control channel," in 3GPP TSG RAN WG1 Meeting #86bis, Lisbon, Portugal, October 2016, R1-1608863.

[5] CATT, "Polar codes design for eMBB control channel," in 3GPP TSG RAN WG1 AH NR Meeting, Spokane, USA, January 2017, R1-1700242.

[6] ZTE, ZTE Microelectronics, "Rate matching of polar codes for eMBB," in 3GPP TSG RAN WG1 Meeting #88, Athens, Greece, February 2017, R1-1701602.

[7] I. Tal and A. Vardy, "List decoding of polar codes," in 2011 IEEE International Symposium on Information Theory Proceedings, July 2011, pp. 1-5.

[8] A. Balatsoukas-Stimming, M. B. Parizi, and A. Burg, "Llr-based successive cancellation list decoding of polar codes," IEEE Transactions on Signal Processing, vol. 63, no. 19, pp. 5165-5179, October 2015.

[9] K. Niu and K. Chen, "Crc-aided decoding of polar codes," IEEE Communications Letters, vol. 16, no. 10, pp. 1668-1671, October 2012.

[10] G. Sarkis, P. Giard, A. Vardy, C. Thibeault, and W. J. Gross, "Fast polar decoders: Algorithm and implementation," IEEE Journal on Selected Areas in Communications, vol. 32, no. 5, pp. 946-957, May 2014.

[11] P. Giard, A. Balatsoukas-Stimming, G. Sarkis, C. Thibeault, and W. J. Gross, "Fast low-complexity decoders for low-rate polar codes," Journal of Signal Processing Systems, pp. 1-11, 2016. [Online]. Available: http://dx.doi.org/10.1007/s11265-016-1173-y

[12] P. Giard, G. Sarkis, C. Thibeault, and W. J. Gross, "237 gbit/s unrolled hardware polar decoder," Electronics Letters, vol. 51, no. 10, pp. 762-763, 2015.

[13] P. Giard, G. Sarkis, C. Thibeault, and W. J. Gross, "Multi-mode unrolled architectures for polar decoders," IEEE Transactions on Circuits and Systems I: Regular Papers, vol. 63, no. 9, pp. 1443-1453, September 2016.

[14] C. Leroux, I. Tal, A. Vardy, and W. J. Gross, "Hardware architectures for successive cancellation decoding of polar codes," in 2011 IEEE International Conference on Acoustics, Speech and Signal Processing (ICASSP), May 2011, pp. 1665-1668.

[15] C. Leroux, A. J. Raymond, G. Sarkis, and W. J. Gross, "A semi-parallel successive-cancellation decoder for polar codes," IEEE Transactions on Signal Processing, vol. 61, no. 2, pp. 289-299, January 2013.

[16] A. Mishra, A. J. Raymond, L. G. Amaru, G. Sarkis, C. Leroux, P. Meinerzhagen, A. Burg, and W. J. Gross, "A successive cancellation decoder asic for a 1024-bit polar code in 180 nm cmos," in 2012 IEEE Asian Solid State Circuits Conference (A-SSCC), November 2012, pp. 205-208.

[17] Y. Fan and C. y. Tsui, "An efficient partial-sum network architecture for semi-parallel polar codes decoder implementation," IEEE Transactions on Signal Processing, vol. 62, no. 12, pp. 3165-3179, June 2014.

[18] A. Balatsoukas-Stimming, A. J. Raymond, W. J. Gross, and A. Burg, "Hardware architecture for list successive cancellation decoding of polar codes," IEEE Transactions on Circuits and Systems II: Express Briefs, vol. 61, no. 8, pp. 609-613, August 2014.

[19] J. Lin and Z. Yan, "An efficient list decoder architecture for polar codes," IEEE Transactions on Very Large Scale Integration (VLSI) Systems, vol. 23, no. 11, pp. 2508-2518, November 2015.

[20] Y. Fan, J. Chen, C. Xia, C. y. Tsui, J. Jin, H. Shen, and B. Li, "Low-latency list decoding of polar codes with double thresholding," in 2015 IEEE International Conference on Acoustics, Speech and Signal Processing (ICASSP), April 2015, pp. 1042-1046.

[21] J. Lin, C. Xiong, and Z. Yan, "A high throughput list decoder architecture for polar codes," IEEE Transactions on Very Large Scale Integration (VLSI) Systems, vol. 24, no. 6, pp. 2378-2391, June 2016.

[22] Y. Fan, C. Xia, J. Chen, C. Y. Tsui, J. Jin, H. Shen, and B. Li, "A low-latency list successive-cancellation decoding implementation for polar codes," IEEE Journal on Selected Areas in Communications, vol. 34, no. 2, pp. 303-317, February 2016.

[23] G. Berhault, C. Leroux, C. Jego, and D. Dallet, "Hardware implementation of a soft cancellation decoder for polar codes," in 2015 Conference on Design and Architectures for Signal and Image Processing (DASIP), September 2015, pp. 1-8.

[24] G. Sarkis, I. Tal, P. Giard, A. Vardy, C. Thibeault, and W. J. Gross, "Flexible and low-complexity encoding and decoding of systematic polar codes," IEEE Transactions on Communications, vol. 64, no. 7, pp. 2732-2745, July 2016.

[25] C. Zhang, B. Yuan, and K. K. Parhi, "Reduced-latency sc polar decoder architectures," in 2012 IEEE International Conference on Communications (ICC), June 2012, pp. 3471-3475.

[26] B. Yuan and K. K. Parhi, "Low-latency successive-cancellation polar decoder architectures using 2-bit decoding," IEEE Transactions on Circuits and Systems I: Regular Papers, vol. 61, no. 4, pp. 1241-1254, April 2014.

[27] O. Dizdar and E. Arkan, "A high-throughput energy-efficient implementation of successive cancellation decoder for polar codes using combinational logic," IEEE Transactions on Circuits and Systems I: Regular Papers, vol. 63, no. 3, pp. 436-447, March 2016.

[28] C. Xiong, J. Lin, and Z. Yan, "A multimode area-efficient scl polar decoder," IEEE Transactions on Very Large Scale Integration (VLSI) Systems, vol. 24, no. 12, pp. 3499-3512, December 2016.

[29] C. Kim, H. Yun, S. Ajaz, and H. Lee, "High-throughput low-complexity successive-cancellation polar decoder architecture using ones complement scheme," Journal of Semiconductor Technology and Science, vol. 15, no. 3, pp. 427-435, 2015.

[30] A. Pamuk and E. Arkan, "A two phase successive cancellation decoder architecture for polar codes," in 2013 IEEE International Symposium on Information Theory, July 2013, pp. 957-961.

[31] X. Liang, J. Yang, C. Zhang, W. Song, and X. You, "Hardware efficient and low-latency ca-scl decoder based on distributed sorting," in 2016 IEEE Global Communications Conference (GLOBECOM), December 2016, pp. 1-6.

[32] C. Xiong, J. Lin, and Z. Yan, "Symbol-decision successive cancellation list decoder for polar codes," IEEE Transactions on Signal Processing, vol. 64, no. 3, pp. 675-687, February 2016.

[33] B. Yuan and K. K. Parhi, "Low-latency successive-cancellation list decoders for polar codes with multibit decision," IEEE Transactions on Very Large Scale Integration (VLSI) Systems, vol. 23, no. 10, pp. 2268-2280, October 2015.

[34] C. Zhang and K. K. Parhi, "Low-latency sequential and overlapped architectures for successive cancellation polar decoder," IEEE Transactions on Signal Processing, vol. 61, no. 10, pp. 2429-2441, May 2013.

[35] T. Che and G. S. Choi, "An efficient partial sums generator for constituent code based successive cancellation decoding of polar codes," CoRR, vol. abs/1611.09452, 2016. [Online]. Available: http://arxiv.org/abs/1611.09452

[36] J. Sha, X. Liu, Z. Wang, and X. Zeng, "A memory efficient belief propagation decoder for polar codes," China Communications, vol. 12, no. 5, pp. 34-41, May 2015.

[37] H. Yoo and I. C. Park, "Partially parallel encoder architecture for long polar codes," IEEE Transactions on Circuits and Systems II: Express Briefs, vol. 62, no. 3, pp. 306-310, March 2015.

The invention claimed is:
1. A polar coder circuit comprising:
one or more datapaths;
at least one logical three-dimensional, 3D, memory block coupled to the one or more datapaths and comprising two or more random access memories, RAMs, of the at least one logical 3D memory block as a first dimension, wherein the two or more RAMs comprise(s) a width of one or more element(s) as a second dimension and a depth of one or more address(es) as a third dimension and wherein the first dimension or the second dimension has a size of two to the power of a number of stages in a datapath of the one or more datapaths; and
a controller coupled to the at least one logical 3D memory block and configured to direct the one or more datapaths to process bits that are read from the at least one logical 3D memory block across at least one of the first dimension and the second dimension, and configured to direct the one or more datapaths to write processed bits to the at least one logical 3D memory block across at least one of the first dimension and the second dimension; and at least one of:

wherein each of a group comprising a number of processed bits provided at an output of the one or more datapaths is written in a single write operation to the at least one logical 3D memory block;

wherein each of a group comprising a number of processed bits required at an input of the datapath of the one or more datapaths is seamlessly obtained in a single read operation from the at least one logical 3D memory block.

2. The polar coder circuit of claim 1, wherein the other of the first dimension and second dimension has a size equal to a number of elements in an input or an output of the one or more datapaths.

3. The polar coder circuit of claim 2, wherein the at least one logical 3D memory block stores the elements in a plurality of coordinates according to the first dimension, second dimension and third dimension and the controller is configured to:

direct a first datapath to read the number of datapath input elements from the same number of different coordinates in a first logical 3D memory block; and direct a second datapath to write the number of datapath output elements to the same number of different coordinates in a second logical 3D memory block.

4. The polar coder circuit of claim 3, wherein at least one of the following applies:

the operations of read the number of datapath input elements and write the number of datapath output elements occur at different time instances;

a single datapath comprises the first datapath and second datapath;

a single logical 3D memory block comprises the first logical 3D memory block and second logical 3D memory block.

5. The polar coder circuit of claim 3, wherein:

all datapath input elements are read from element positions having a same coordinate value along the third dimension of the first logical 3D memory block, and all datapath output elements are written to element positions having a same co-ordinate value along the third dimension of the second logical 3D memory block.

6. The polar coder circuit of claim 2 further comprising at least one multiplexer coupled to the controller, wherein the controller is configured to direct the at least one multiplexer to read a datapath input element having an index $l \in [0, n_d-1]$ from one element position in a first logical 3D memory block that has a co-ordinate that is a function of the index $l$ along a first one of the first dimension or second dimension.

7. The polar coder circuit of claim 2, further comprising at least one multiplexer coupled to the controller, wherein the controller is configured to direct the at least one multiplexer to write a datapath output element having an index $l \in [0, n_d-1]$ to one element position in a second logical 3D memory block that has a co-ordinate $\mod(l, d_2)$ along a second one of the first dimension or second dimension, where $d_2$ is the size of the dimension of the second logical 3D memory block.

8. The polar coder circuit of claim 1, wherein the number of stages in the one or more datapaths are configured to compute XOR operations of a polar code sub-graph.

9. The polar coder circuit of claim 1, when configured to perform a polar encoding operation using one datapath of the one or more datapaths and a first logical 3D memory block and a second logical 3D memory block and wherein the polar encoding operation comprises a decomposition of a polar code graph into multiple columns and where each column is further decomposed into one or more polar code sub-graphs, where datapath input elements are read from the first logical 3D memory block and datapath output elements are written to the second logical 3D memory block during the processing of polar code sub-graphs from any columns having even indices ($c \in \{0, 2, 4, \ldots\}$), and datapath input elements are read from the second logical 3D memory block and datapath output elements are written to the first logical 3D memory block during the processing of polar code sub-graphs from columns having odd indices ($c \in \{1, 3, 5, \ldots\}$).

10. The polar coder circuit of claim 9, wherein the other of the first dimension and second dimension has a size equal to a number of elements in an input or an output of the one or more datapaths and the third dimension of each logical 3D memory block has a size of $\max(1, N_{max}/n_e \cdot 2^{s_e})$, where $N_{max}$ is a longest supported kernal block size of the polar coder circuit, $s_e$ is a number of stages in an encoder datapath of the one or more datapaths and where $n_e$ is a number of elements in an input or an output of the encoder datapath.

11. The polar coder circuit of claim 1, when configured to perform a polar decoding operation using a $C_{max}-1$ number of datapaths of the one or more datapaths and $C_{max}-1$ number of logical 3D memory blocks, and wherein the polar decoding operation comprises a decomposition of a polar code graph into $C \in [1, C_{max}]$ number of columns, wherein C varies from block to block and $C_{max}$ is a maximum number of supported columns and into $C \in [1, C_{max}]$ number of columns wherein C can vary from block to block and $C_{max}$ is a maximum number of supported columns, and wherein each column comprises a number of rows and each row comprises a number of sub-rows, wherein the datapath having an index c that reads datapath input elements from a logical 3D memory block having the index c and writes datapath output elements to the at least one logical 3D memory block having the index c+1 during the processing of a sub-row from the column having the index $c \in [0, C-1]$.

12. The polar coder circuit of claim 11, wherein the other of the first dimension and second dimension has a size equal to a number of elements in an input or an output of the one or more datapaths and the third dimension of the at least one logical 3D memory block having the index c has a size of $\max(1, 2^{s_o+(c-1)s_i}/n_i)$, where $s_o$ is a number of stages in an outer datapath of the one or more datapaths, $s_i$ is a number of stages in an inner datapath of the one or more datapaths and where $n_i$ is a number of elements in an input or an output of the inner datapath.

13. The polar coder circuit of claim 11, wherein a subset of the $C_{max}-1$ datapaths of the one or more datapaths is operated concurrently and a subset of the $C_{max}-1$ logical 3D memory block are operated transparently in order to propagate elements through successive columns.

14. The polar coder circuit of claim 1, wherein each of the one or more element(s) is one bit when the polar coder circuit is configured to perform one of: a polar encoding operation, a polar Successive Cancellation, SC, decoding operation, or each of the one or more element(s) comprises vectors of L bits when the polar coder circuit is configured to perform a Successive Cancellation List, SCL, decoding operation with a list size of L.

15. A communication unit comprising a polar coder circuit comprising:

one or more datapaths;

at least one logical three-dimensional, 3D, memory block coupled to the one or more datapaths and comprising two or more random access memories, RAMs, of the at least one logical 3D memory block as a first dimension, wherein the two or more RAMs comprise(s) a width of one or more element(s) as a second dimension and a depth of one or more address(es) as a third dimension and wherein the first dimension or the second dimension has a size of two to the power of a number of stages in a datapath of the one or more datapaths; and a controller coupled to the at least one logical 3D memory block and configured to direct the one or more datapaths to process bits that are read from the at least one logical 3D memory block across at least one of the first dimension and the second dimension, and configured to direct the one or more datapaths to write processed bits to the at least one logical 3D memory block across at least one of the first dimension and the second dimension; and at least one of:

wherein each of a group of processed number of bits provided at an output of the one or more datapaths is written in a single write operation to the at least one logical 3D memory block;

wherein each of a group of processed number of bits required at an input of the datapath of the one or more datapaths is seamlessly obtained in a single read operation from the at least one logical 3D memory block.

16. The communication unit of claim 15, wherein the other of the first dimension and second dimension has a size of a number of elements in an input or an output of the one or more datapaths.

17. An integrated circuit for a wireless communication unit, the integrated circuit comprising a polar coder circuit comprising:

one or more datapaths;

at least one logical three-dimensional, 3D, memory block coupled to the one or more datapaths and comprising two or more random access memories, RAMs, of the at least one logical 3D memory block as a first dimension, wherein the two or more RAMs comprise(s) a width of one or more element(s) as a second dimension and a depth of one or more address(es) as a third dimension and wherein the first dimension or the second dimension has a size of two to the power of a number of stages in a datapath of the one or more datapaths; and a controller coupled to the at least one logical 3D memory block and configured to direct the one or more datapaths to process bits that are read from the at least one logical 3D memory block across at least one of the first dimension and the second dimension, and configured to direct the one or more datapaths to write processed bits to the at least one logical 3D memory block across at least one of the first dimension and the second dimension; and at least one of:

wherein each of a group comprising a number of processed bits provided at an output of the one or more datapaths is written in a single write operation to the at least one logical 3D memory block;

wherein each of a group comprising a number of processed bits required at an input of the datapath of the one or more datapaths is seamlessly obtained in a single read operation from the at least one logical 3D memory block.

18. The integrated circuit for a wireless communication unit of claim 17, wherein the other of the first dimension and second dimension has a size equal to a number of elements in an input or an output of the one or more datapaths.

19. A method of polar coding in a polar coder circuit that comprises one or more datapaths and at least one logical three-dimensional, 3D, memory block coupled to the one or more datapaths, the method comprising:

apportioning the at least one logical 3D memory block as a first dimension that is two or more random access memories, RAMs, of the at least one logical 3D memory block; a second dimension that is a width of one or more element(s) of each of the two or more RAMs; and a third dimension that is a depth of one or more address(es) of each of the one or more RAMs; wherein the first dimension or the second dimension has a size of two to the power of a number of stages in a datapath of the one or more datapaths;

directing the one or more datapaths to process bits that are read from the at least one logical 3D memory block across at least one of the first dimension and the second dimension; and directing the one or more datapaths to write processed bits to the at least one logical 3D memory block across at least one of the first dimension and the second dimension; and at least one of:

wherein each of a group comprising a number of processed bits provided at an output of the one or more datapaths is written in a single write operation to the at least one logical 3D memory block;

wherein each of a group comprising a number of processed bits required at an input of the datapath of the one or more datapaths is seamlessly obtained in a single read operation from the at least one logical 3D memory block.

20. A non-transitory tangible computer program product comprising executable code stored therein for polar coding, wherein the code is operable for, when executed at a polar coder that comprises one or more datapaths and at least one logical three-dimensional, 3D, memory block coupled to the one or more datapaths:

apportioning the at least one logical 3D memory block as a first dimension that is two or more random access memories, RAMs, of the at least one logical 3D memory block;

a second dimension that is a width of one or more element(s) of each of the two or more RAMs; and a third dimension that is a depth of one or more address (es) of each of the one or more RAMs;

wherein the first dimension or the second dimension has a size of two to the power of a number of stages in a datapath of the one or more datapaths; and directing the one or more datapaths to process bits that are read from the at least one logical 3D memory block across at least one of the first dimension and the second dimension; and directing the one or more datapaths to write processed bits to the at least one logical 3D memory block across at least one of the first dimension and the second dimension; and at least one of:

wherein each of a group comprising a number of processed bits provided at an output of the one or more datapaths is written in a single write operation to the at least one logical 3D memory block;

wherein each of a group comprising a number of processed bits required at an input of the datapath of the one or more datapaths is seamlessly obtained in a single read operation from the at least one logical 3D memory block.

* * * * *